US012191249B2

(12) United States Patent
Wells et al.

(10) Patent No.: US 12,191,249 B2
(45) Date of Patent: Jan. 7, 2025

(54) MICROELECTRONIC DEVICES INCLUDING STAIRCASE STRUCTURES, AND RELATED MEMORY DEVICES, ELECTRONIC SYSTEMS, AND METHODS

(71) Applicant: Micron Technology, Inc., Boise, ID (US)

(72) Inventors: David H. Wells, Boise, ID (US); Richard J. Hill, Boise, ID (US); Umberto M. Meotto, Rivoli (IT); Matthew Thorum, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 508 days.

(21) Appl. No.: 17/446,868

(22) Filed: Sep. 3, 2021

(65) Prior Publication Data
US 2023/0073372 A1 Mar. 9, 2023

(51) Int. Cl.
*H10B 43/10* (2023.01)
*H01L 23/522* (2006.01)
*H01L 23/528* (2006.01)
*H01L 23/532* (2006.01)
*H10B 41/10* (2023.01)
*H10B 41/27* (2023.01)
*H10B 41/35* (2023.01)
(Continued)

(52) U.S. Cl.
CPC ...... *H01L 23/5226* (2013.01); *H01L 23/5283* (2013.01); *H01L 23/53266* (2013.01); *H01L 23/53271* (2013.01); *H10B 41/10* (2023.02); *H10B 41/27* (2023.02); *H10B 41/35* (2023.02); *H10B 41/40* (2023.02); *H10B 43/10* (2023.02); *H10B 43/27* (2023.02); *H10B 43/35* (2023.02); *H10B 43/40* (2023.02); *G11C 16/0483* (2013.01)

(58) Field of Classification Search
CPC ........ H10B 43/10; H10B 43/30; H10B 43/35; H10B 43/50; H10B 41/10; H10B 41/27; H10B 41/35; H10B 41/40; H10B 43/27; H10B 43/40; G11C 16/048
See application file for complete search history.

(56) References Cited

U.S. PATENT DOCUMENTS 8,896,051 B2 * 11/2014 Nansei ............. H01L 21/76831
  438/668
9,373,540 B2 * 6/2016 Hyun ................... H10B 41/50
(Continued)

*Primary Examiner* — Eduardo A Rodela
(74) *Attorney, Agent, or Firm* — TraskBritt

(57) ABSTRACT

A microelectronic device comprises a stack structure overlying a source tier. The stack structure comprising a vertically alternating sequence of conductive structures and insulative structures arranged in tiers. The microelectronic device comprises a staircase structure within the stack structure and having steps comprising lateral edges of the tiers, support structures vertically extending through the stack structure and within a horizontal area of the staircase structure, and conductive contacts vertically extending through the stack structure and horizontally neighboring the support structures within the horizontal area of the staircase structure. Each of the conductive contacts has a horizontally projecting portion in contact with one of the conductive structures of the stack structure at one of the steps of the staircase structure. Related memory devices, electronic systems, and methods of forming the microelectronic devices are also described.

24 Claims, 28 Drawing Sheets

(51) Int. Cl.
  *H10B 41/40* (2023.01)
  *H10B 43/27* (2023.01)
  *H10B 43/35* (2023.01)
  *H10B 43/40* (2023.01)
  G11C 16/04 (2006.01)

(56) References Cited

U.S. PATENT DOCUMENTS

| | | | |
|---|---|---|---|
| 9,548,316 B2 * | 1/2017 | Lim | H10B 43/27 |
| 9,911,692 B2 * | 3/2018 | Smith | H01L 21/76877 |
| 9,941,209 B2 | 4/2018 | Tessariol et al. | |
| 9,960,181 B1 * | 5/2018 | Cui | H10B 41/50 |
| 10,192,928 B2 * | 1/2019 | Fukuda | H10B 41/20 |
| 10,396,035 B2 * | 8/2019 | Park | H01L 29/0649 |
| 10,580,795 B1 | 3/2020 | Luo et al. | |
| 10,790,229 B2 * | 9/2020 | Yoshinaga | H01L 29/792 |
| 11,056,503 B2 * | 7/2021 | Kim | H10B 43/50 |
| 11,296,021 B2 * | 4/2022 | Lee | H10B 41/41 |
| 11,895,838 B2 * | 2/2024 | Baek | H10B 41/10 |
| 2011/0031630 A1 * | 2/2011 | Hashimoto | H10B 43/20 |
| | | | 257/E21.585 |
| 2021/0193672 A1 * | 6/2021 | Kim | H10B 43/50 |

\* cited by examiner

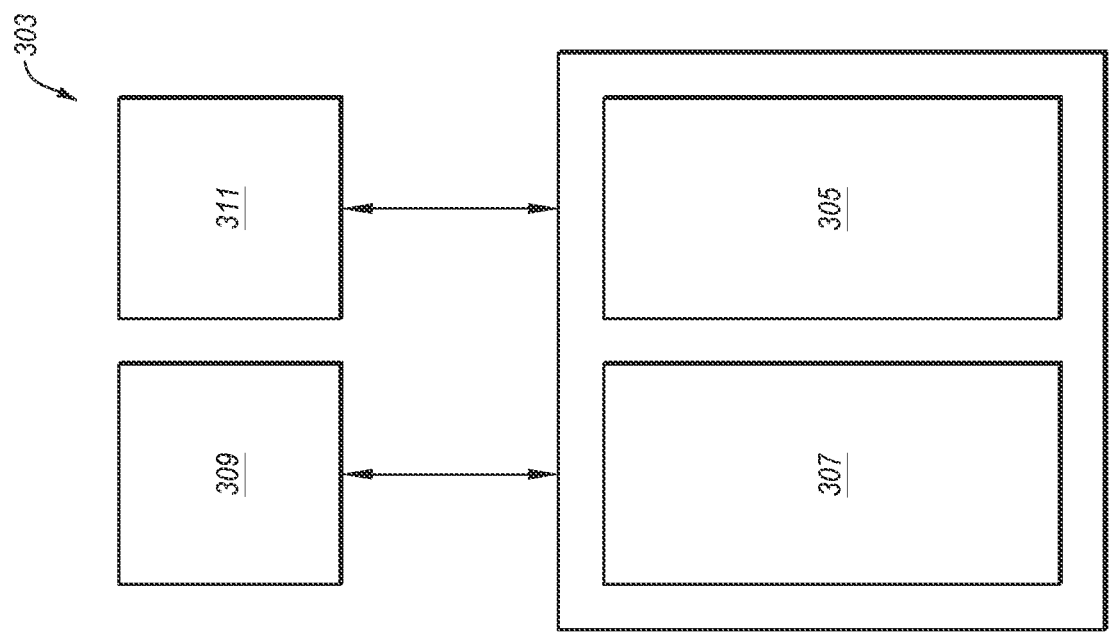

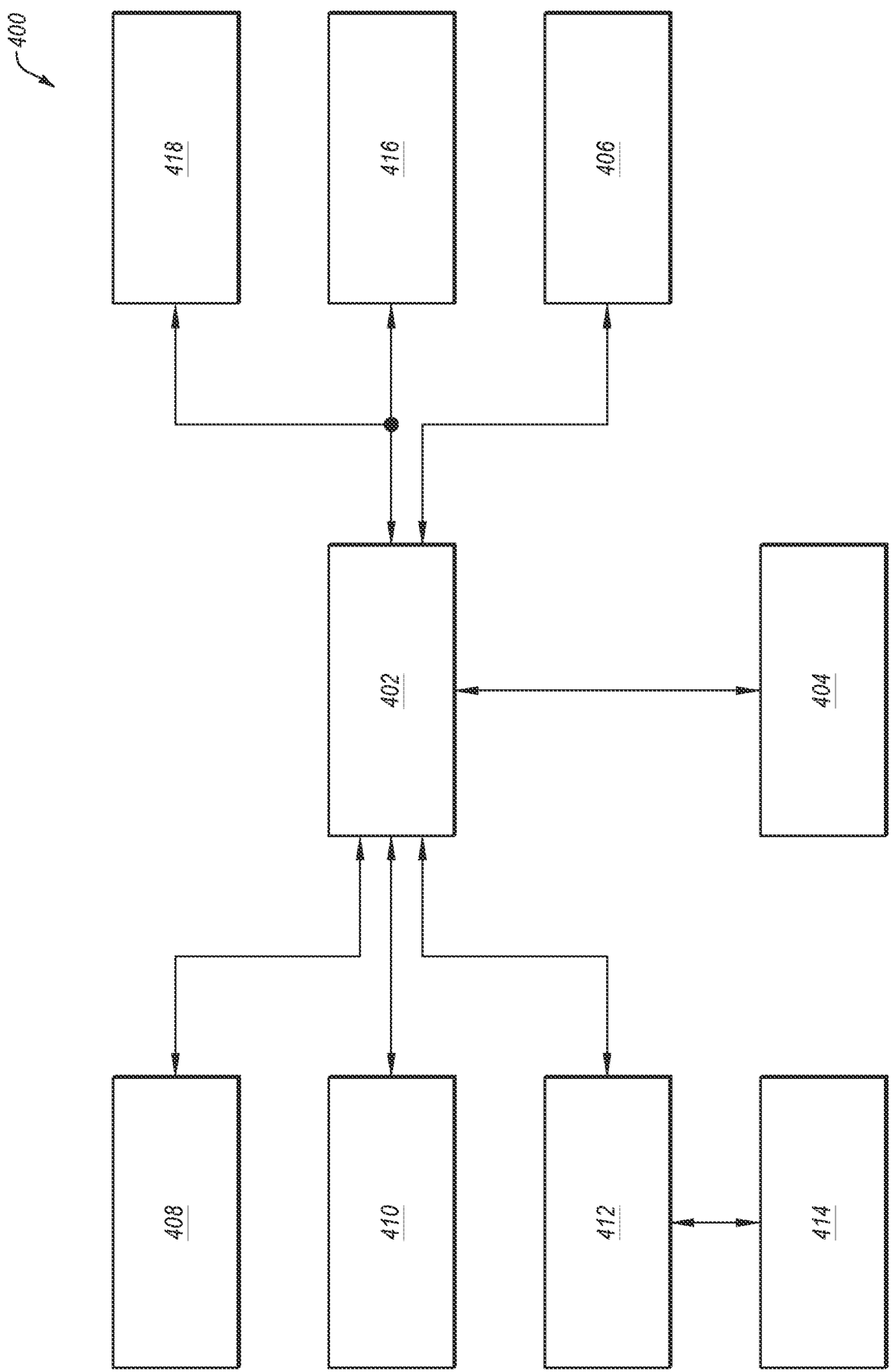

MICROELECTRONIC DEVICES INCLUDING STAIRCASE STRUCTURES, AND RELATED MEMORY DEVICES, ELECTRONIC SYSTEMS, AND METHODS

TECHNICAL FIELD

The disclosure, in various embodiments, relates generally to the field of microelectronic device design and fabrication. More specifically, the disclosure relates to microelectronic devices, and related memory devices, electronic systems, and methods of forming the microelectronic devices.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more conductive stack structures including tiers of conductive structures and insulative structures. Each vertical memory string may include at least one select device coupled in series to a serial combination of vertically stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Vertical memory array architectures generally include electrical connections between the conductive structures of the tiers of the conductive stack structure(s) of the memory device and access lines (e.g., word lines) so that the memory cells of the vertical memory array can be uniquely selected for writing, reading, or erasing operations. One method of forming such an electrical connection includes forming so-called "staircase" (or "stair step") structures at edges (e.g., horizontal ends) of the tiers of the conductive stack structure(s) of the memory device. The staircase structure includes individual "steps" defining contact regions of the conductive structures, upon which conductive contact structures can be positioned to provide electrical access to the conductive structures.

As vertical memory array technology has advanced, additional memory density has been provided by forming vertical memory arrays to include stacks comprising additional tiers of conductive structures and, hence, additional staircase structures and/or additional steps in individual staircase structures associated therewith. As the height of the stacks increases to facilitate additional memory cells in the vertical memory arrays, the stacks may be prone to toppling or collapse during various processing acts. For example, during replacement gate processing acts, the stacks may be subject to tier collapse during or after removal of portions of the tiers to be replaced with the conductive structures. Collapse of the portions of the stacks may reduce reliability of the vertical memory strings.

In addition, as the dimensions and spacing of the conductive features decrease, multilevel wiring structures have been used in memory devices to electrically connect the conductive features to one another. The memory device includes the wiring structures at different levels, with the wiring structures formed of electrically conductive materials to provide conductive pathways through the memory device. As the dimensions and spacing of the conductive features continue to decrease, parasitic (e.g., stray) capacitance between adjacent conductive features within the memory device increases. The increased parasitic capacitance causes higher power demands and delay of the memory device.

BRIEF DESCRIPTION OF THE DRAWINGS

FIG. 15 is a schematic block diagram of an electronic system, in accordance with embodiments of the disclosure; and FIG. 16 is a schematic block diagram of a processor-based system, in accordance with embodiments of the disclosure.

DETAILED DESCRIPTION

Figure 1A:
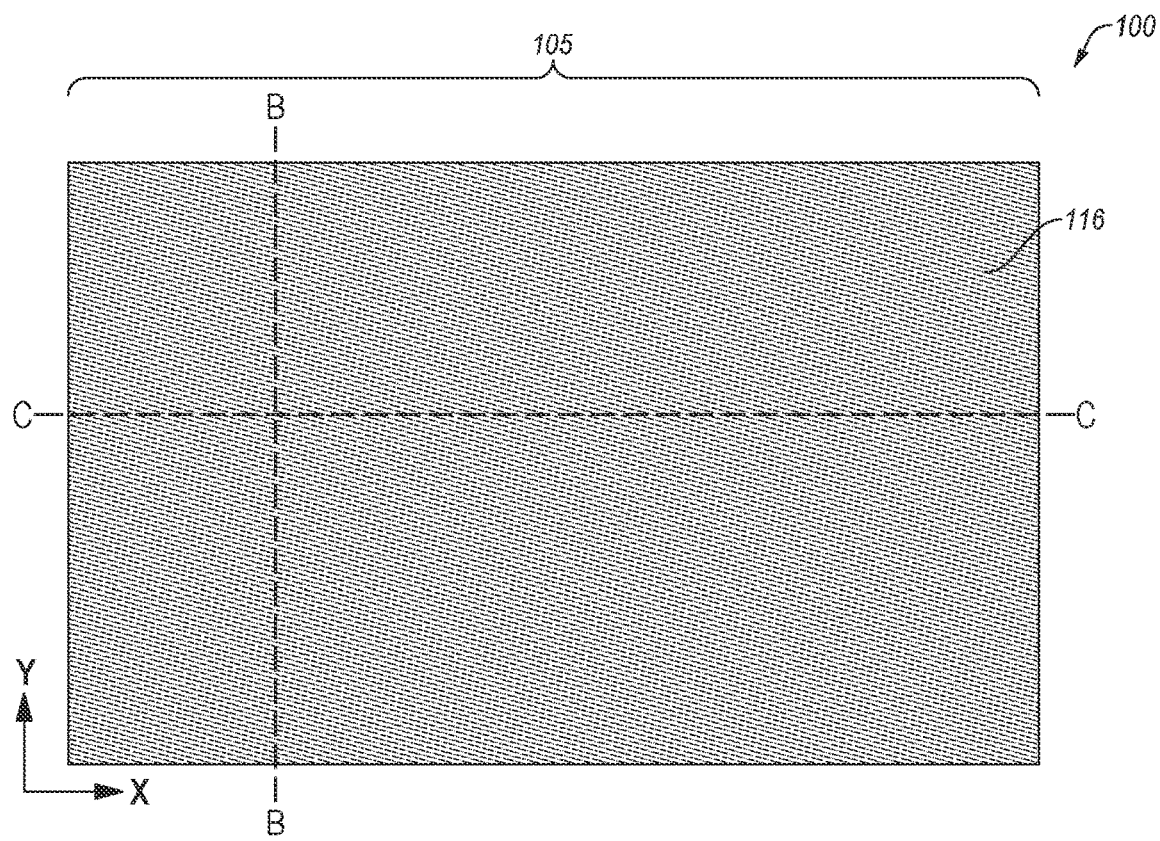
FIGS. 1A through 13B are simplified, partial top-down views (FIGS. 1A, 2A, 3A, 4A, 5A, 6A, 7A, 8A, 9A, 10A, 11A, 12A, and 13A) and simplified, partial cross-sectional views (FIGS. 1B, 1C, 2B, 2C, 3B, 3C, 4B, 4C, 5B, 5C, 5D, 6B, 6C, 6D, 7B, 7C, 7D, 8B, 8C, 8D, 9B, 9C, 9D, 10B, 10C, 10D, 11B, 11C, 11D, 12B, 12C, 12D, and 13B) illustrating different processing stages of a method of forming a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as NAND Flash memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the claims. The drawings are not necessarily to scale. Additionally, elements common between figures may retain the same numerical designation.

As used herein, a "memory device" means and includes a microelectronic device exhibiting memory functionality, but not necessarily limited to memory functionality. Stated another way, and by way of non-limiting example only, the term "memory device" includes not only conventional memory (e.g., conventional non-volatile memory, such as conventional NAND memory; conventional volatile memory, such as conventional dynamic random access memory (DRAM)), but also includes an application specific integrated circuit (ASIC) (e.g., a system on a chip (SoC)), a microelectronic device combining logic and memory, and a graphics processing unit (GPU) incorporating memory.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Stated another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one of the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, reference to an element as being "on" or "over" another element means and includes the element being directly on top of, directly adjacent to (e.g., directly laterally adjacent to, directly vertically adjacent to), directly underneath, or in direct contact with the other element. It also includes the element being indirectly on top of, indirectly adjacent to (e.g., indirectly laterally adjacent to, indirectly vertically adjacent to), indirectly underneath, or near the other element, with other elements present therebetween. In contrast, when an element is referred to as being "directly on" or "directly adjacent to" another element, there are no intervening elements present.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "configured" refers to a size, shape, material composition, orientation, and arrangement of one or more of at least one structure and at least one apparatus facilitating operation of one or more of the structure and the apparatus in a pre-determined way.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 108.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material, such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including a conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

As used herein, the term "amorphous," when referring to a material, means and refers to a material having a substantially noncrystalline structure.

As used herein, the term "sacrificial," when used in reference to a material or structure, means and includes a material, structure, or a portion of a material or structure that is formed during a fabrication process but which is at least partially removed (e.g., substantially removed) prior to completion of the fabrication process.

As used herein, the term "high-k dielectric material" means and includes a dielectric oxide material having a dielectric constant greater than the dielectric constant of silicon dioxide ($SiO_2$). The high-k dielectric material may include a high-k oxide material, a high-k metal oxide material, or a combination thereof. By way of example only, the high-k dielectric material may be aluminum oxide, gadolinium oxide, hafnium oxide, niobium oxide, tantalum oxide, titanium oxide, zirconium oxide, hafnium silicate, a combination thereof, or a combination of one or more of the listed high-k dielectric materials with silicon oxide.

As used herein, the term "selectively etchable" means and includes a material that exhibits a greater etch rate responsive to exposure to a given etch chemistry relative to another material exposed to the same etch chemistry. For example, the material may exhibit an etch rate that is at least about three times (3×) greater than the etch rate of another material, such as about five times (5×) greater than the etch rate of another material, such as an etch rate of about ten times (10×) greater, about twenty times (20×) greater, or about forty times (40×) greater than the etch rate of the another material. Etch chemistries and etch conditions for selectively etching a desired material may be selected by a person of ordinary skill in the art.

Unless otherwise specified, materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

Figure 12A:
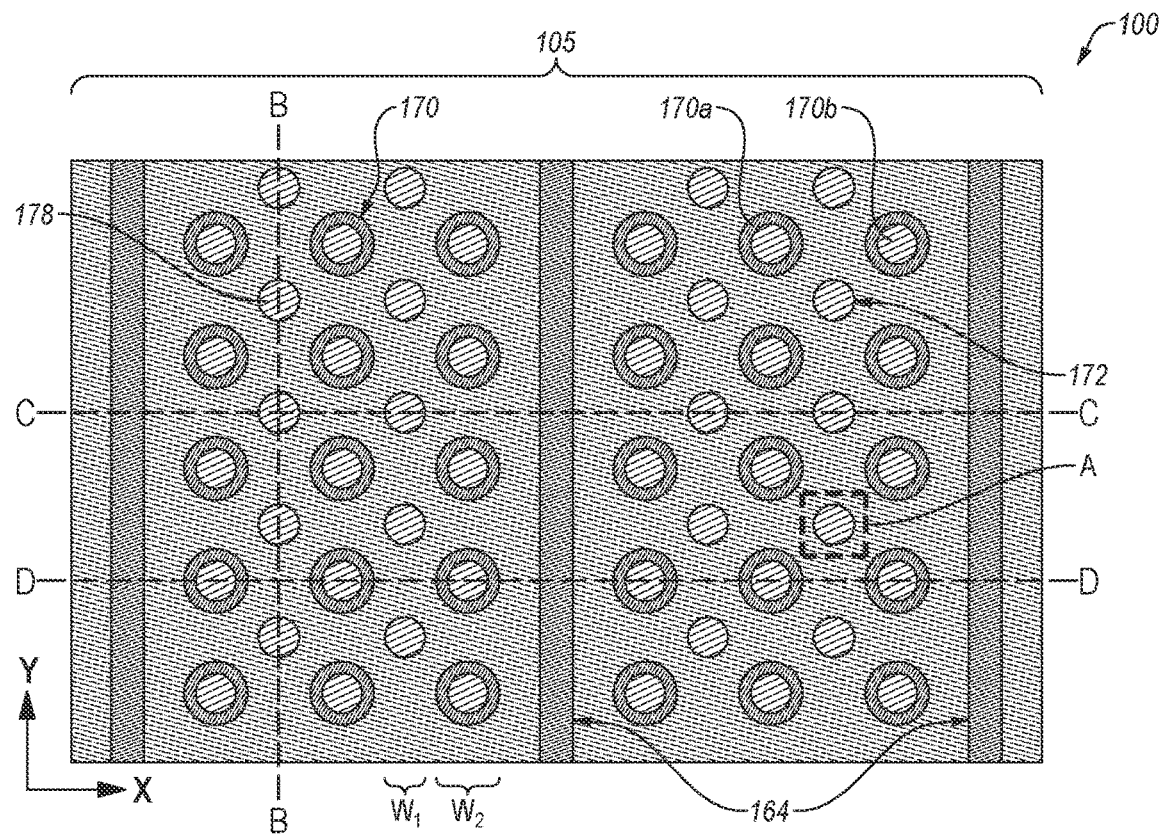
Figure 12B:
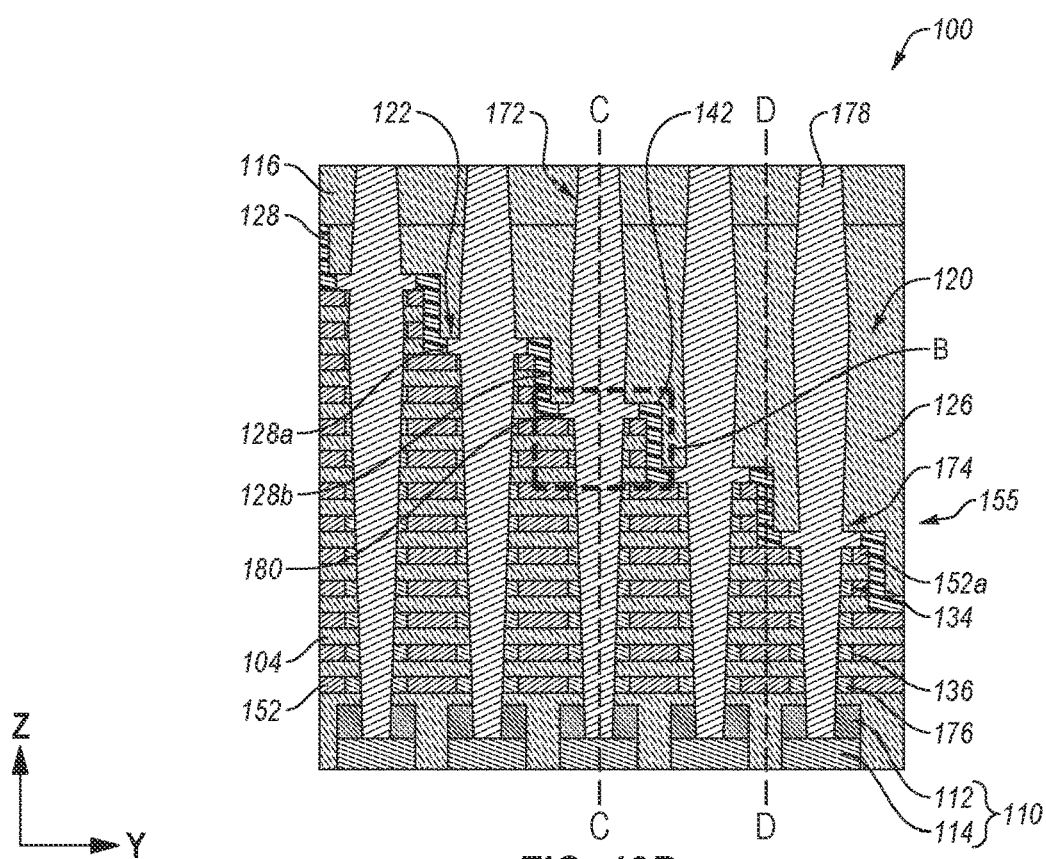
Figure 12C:
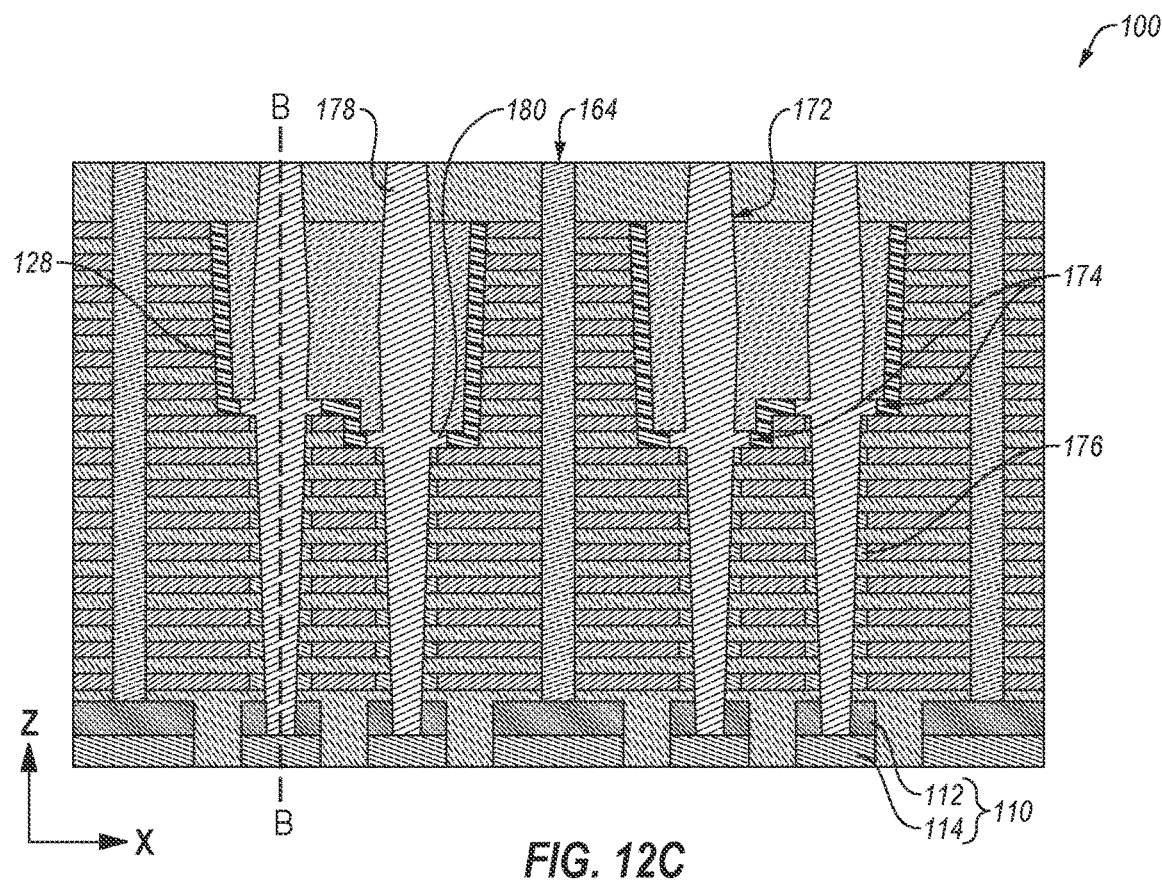
Figure 12D:
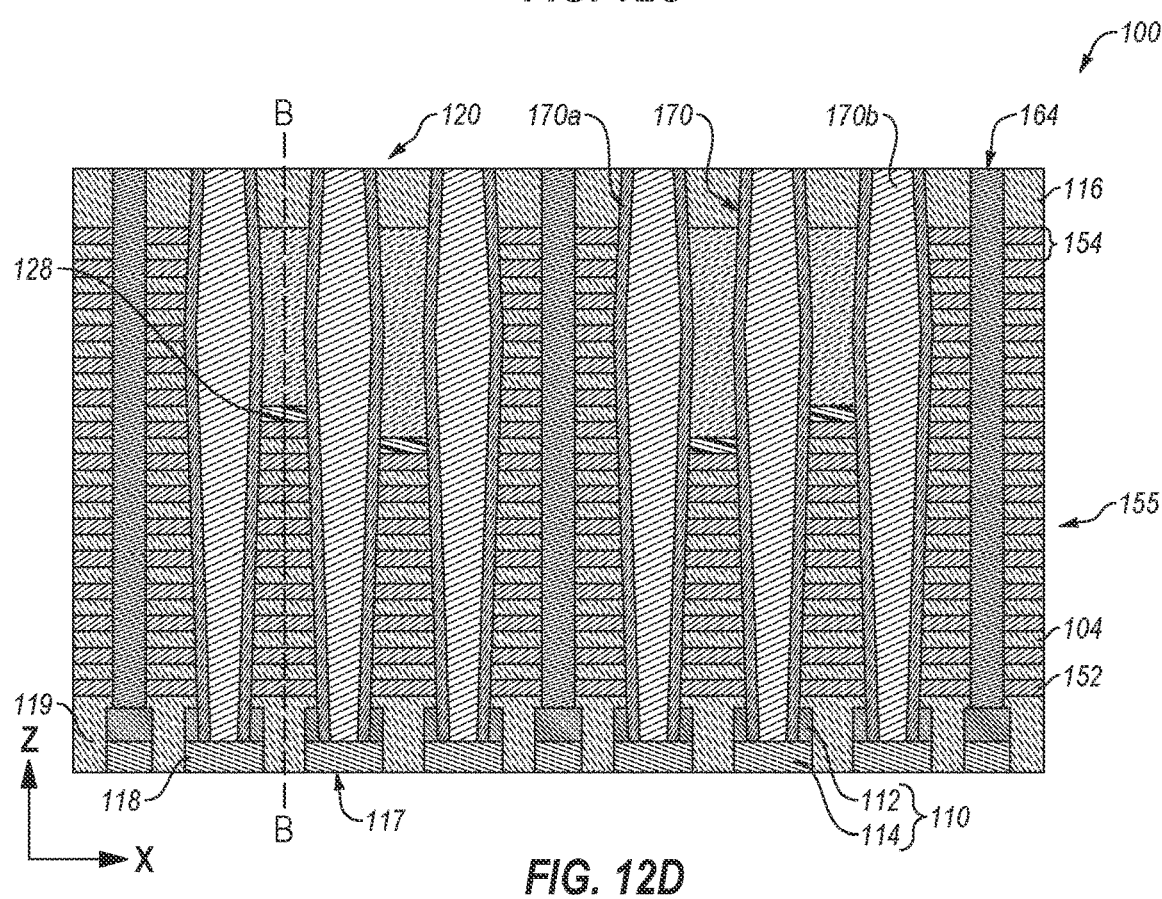
Figure 13A:
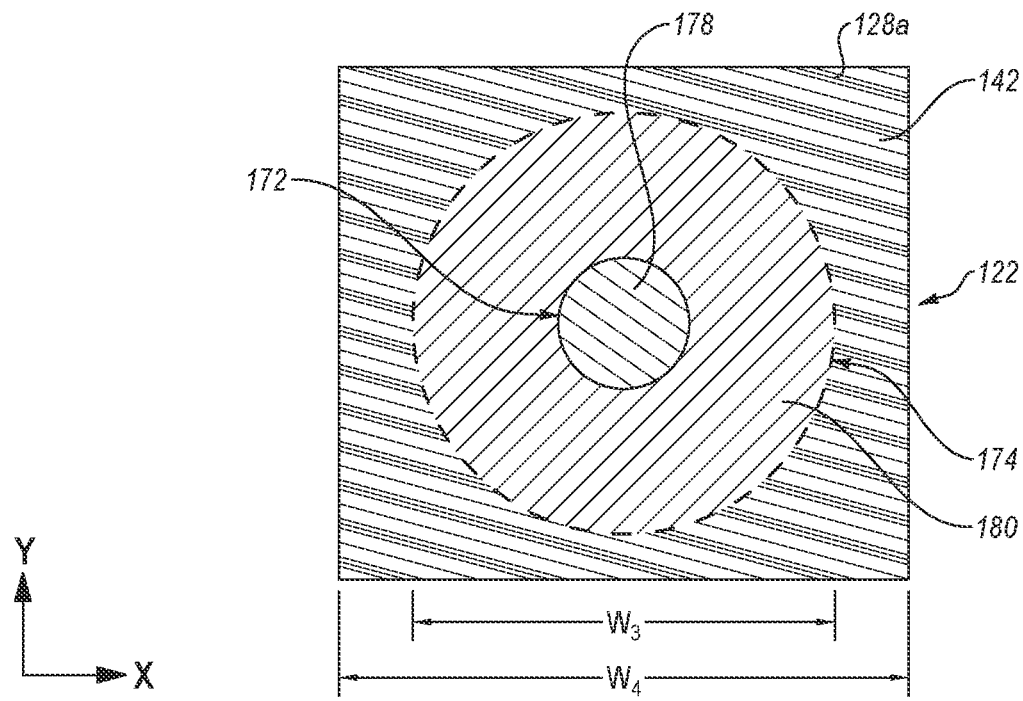
Figure 13B:
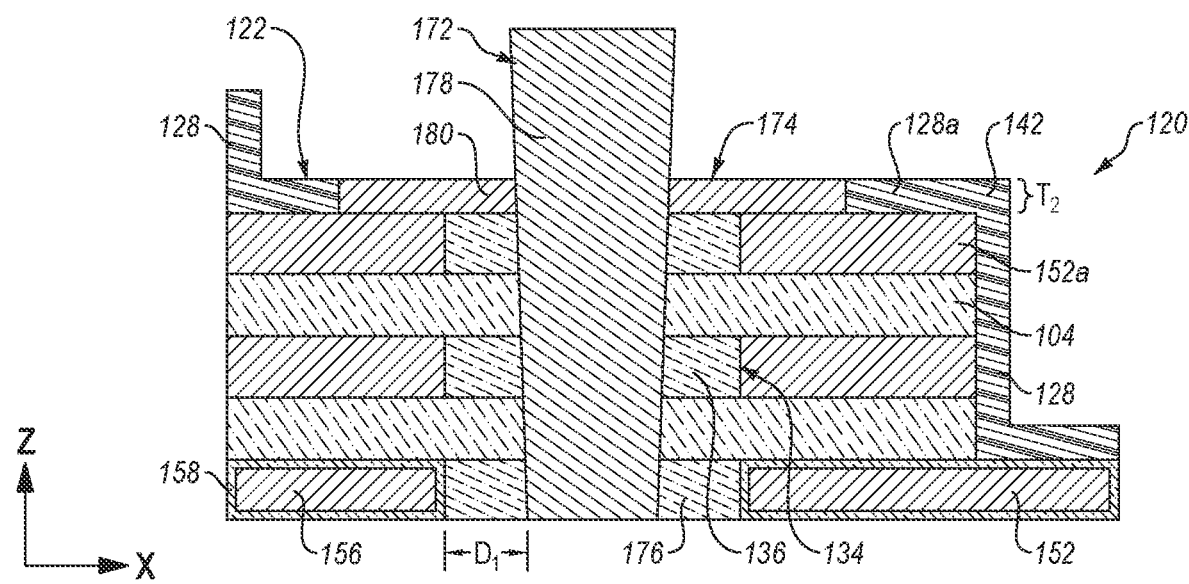

FIGS. 1A through 13B are simplified, partial top-down views (FIGS. 1A, 2A, 3A, 4A, 5A, 6A, 7A, 8A, 9A, 10A, 11A, 12A, and 13A) and simplified, partial cross-sectional views (FIGS. 1B, 1C, 2B, 2C, 3B, 3C, 4B, 4C, 5B, 5C, 5D, 6B, 6C, 6D, 7B, 7C, 7D, 8B, 8C, 8D, 9B, 9C, 9D, 10B, 10C, 10D, 11B, 11C, 11D, 12B, 12C, 12D, and 13B) illustrating different processing stages of a method of forming a microelectronic device (e.g., a memory device, such as a three-dimensional (3D) NAND Flash memory device), in accordance with embodiments of the disclosure. FIG. 13A illustrates an enlarged portion of the top-down view of box A of FIG. 12A, and FIG. 13B illustrates an enlarged portion of the cross-sectional view of box B of FIG. 12B. With the description provided below, it will be readily apparent to one of ordinary skill in the art that the methods and structures described herein with reference to FIGS. 1A through 13B may be used in the formation and configuration of various devices and electronic systems. In other words, the methods of the disclosure may be used whenever it is desired to form a microelectronic device. For convenience in describing FIGS. 1A through 13B, a first horizontal direction may be defined as the X-direction shown in some of FIGS. 1A through 13B; a second horizontal direction transverse (e.g., orthogonal, perpendicular) to the first horizontal direction may be defined as the Y-direction shown in some of FIGS. 1A through 13B; and a third direction (e.g., a vertical direction) transverse (e.g., orthogonal, perpendicular) to each of the first horizontal direction and the second horizontal direction may be defined as the Z-direction shown in some of FIGS. 1A through 13B. Similar directions are shown in 14, which is discussed in further detail below.

Figure 1B:
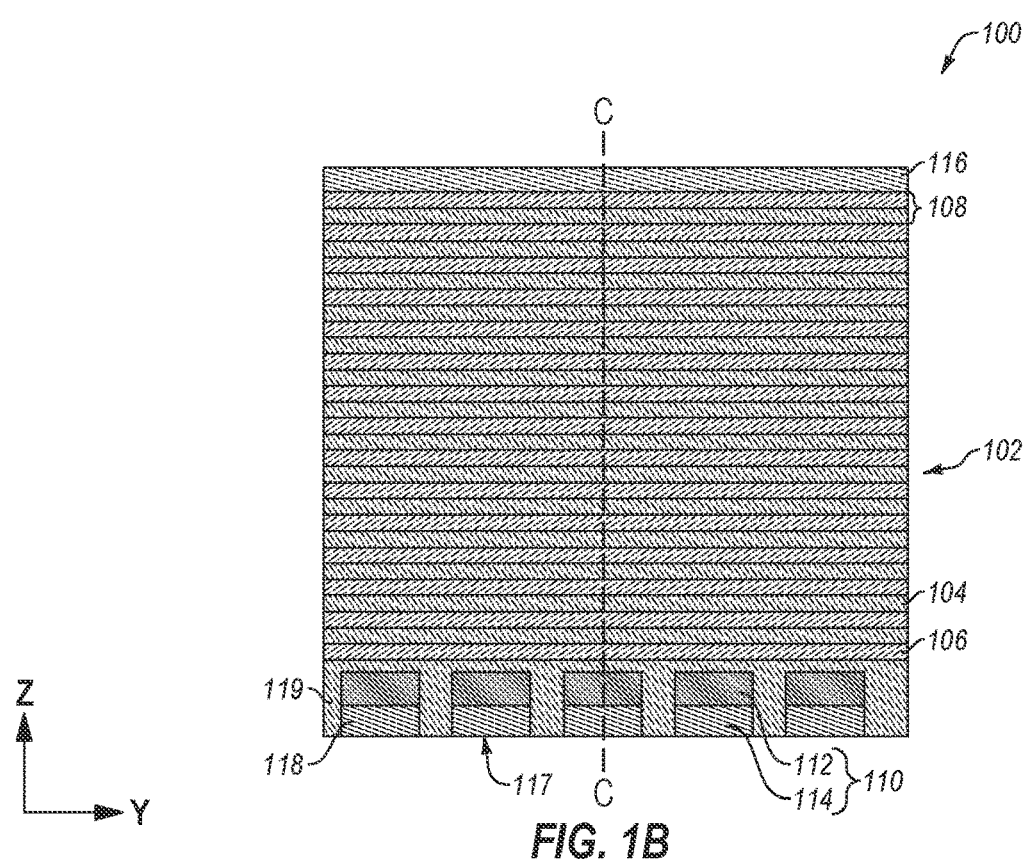
Figure 1C:
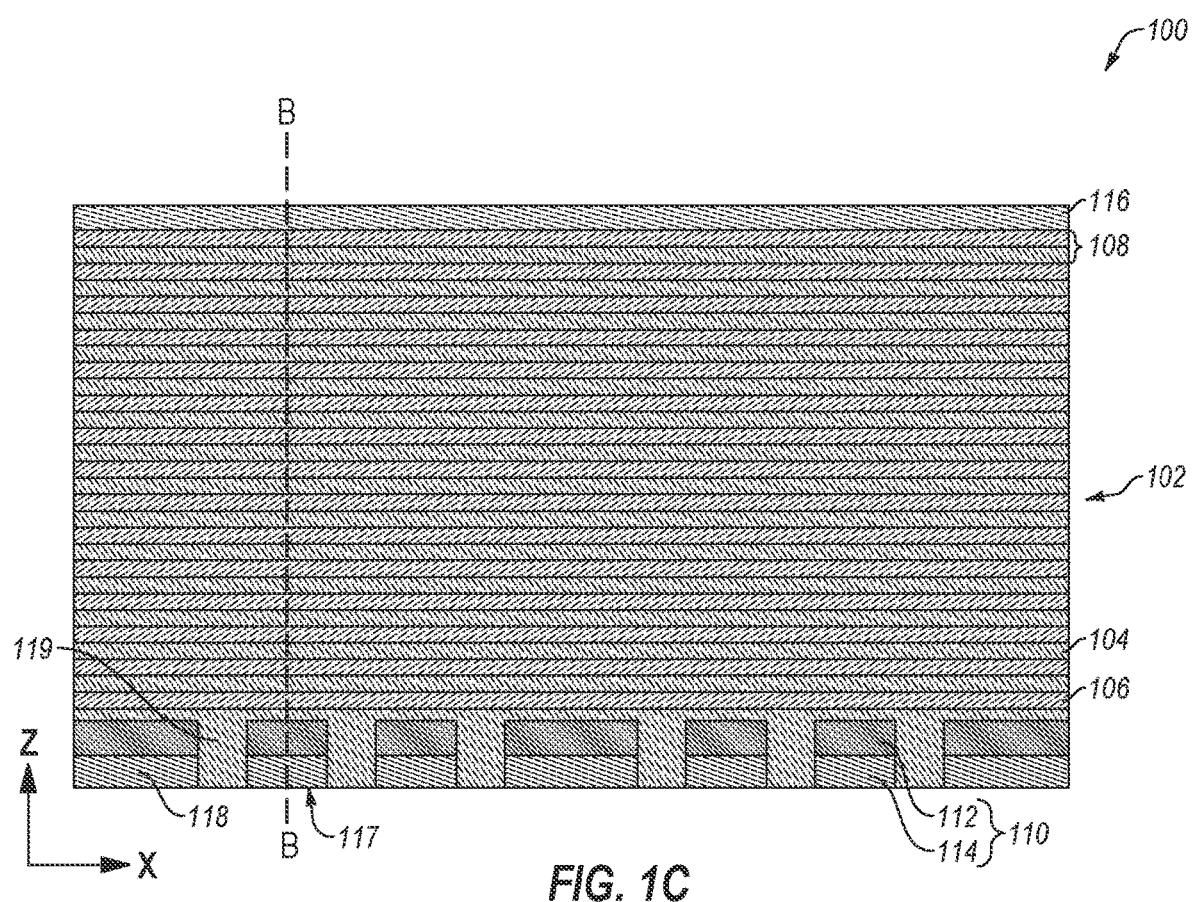

With reference to FIG. 1A, a microelectronic device structure 100 may be formed to include a preliminary stack structure 102 (FIGS. 1B and 1C) and a dielectric material 116 overlying the preliminary stack structure 102. The microelectronic device structure 100 may include a staircase region 105 including a staircase structure, as described in further detail with reference to FIGS. 2A through 2C. The microelectronic device structure 100 may also include an array region horizontally (e.g., in the X-direction) neighboring the staircase region 105. For example, the array region may include memory pillar structures (e.g., cell pillar structures) employed as memory cells (e.g., strings of NAND memory cells), as described in further detail with reference to FIG. 14. While not illustrated in FIGS. 1A through 13B, features of the array region of the microelectronic device structure 100 may be formed during (e.g., substantially simultaneous with) formation of corresponding features of the staircase region 105. The preliminary stack structure 102 of the staircase region 105 is described in further detail below, along with additional components (e.g., structures, features) of the microelectronic device structure 100 at the processing stage depicted in FIG. 1A. FIG. 1B is a simplified, partial cross-sectional view of the microelectronic device structure 100 about the line B-B shown in FIG. 1A, and FIG. 1C is a simplified, partial cross-sectional view of the microelectronic device structure 100 about the line C-C shown in FIG. 1A. For clarity and ease of understanding of the drawings and related description, not all features depicted in one of FIGS. 1A through 1C are depicted in each of the others of FIGS. 1A through 1C.

Referring to FIGS. 1B and 1C, the preliminary stack structure 102 may be formed to include a vertically alternating (e.g., in the Z-direction) sequence of insulative structures 104 (also referred to herein as "insulative levels") and additional insulative structures 106 (also referred to herein as "additional insulative levels") arranged in tiers 108. Each of the tiers 108 of the preliminary stack structure 102 may include at least one (1) of the insulative structures 104 vertically neighboring at least one (1) of the additional insulative structures 106. The insulative structures 104 may be interleaved with the additional insulative structures 106.

The insulative structures 104 of the preliminary stack structure 102 may be formed of and include at least one insulative material. In some embodiments, the insulative structures 104 are formed of and include silicon dioxide ($SiO_2$). Each of the insulative structures 104 may individually include a substantially homogeneous distribution or a substantially heterogeneous distribution of the at least one insulative material. The insulative structures 104 may each be substantially planar, and may each independently exhibit any desired thickness. In addition, each of the insulative structures 104 may be substantially the same (e.g., exhibit substantially the same material composition, material distribution, size, and shape) as one another, or at least one of the insulative structures 104 may be different (e.g., exhibit one or more of a different material composition, a different material distribution, a different size, and a different shape) than at least one other of the insulative structures 104. In some embodiments, each of the insulative structures 104 is substantially the same as each other of the insulative structures 104.

The additional insulative structures 106 may be formed of and include at least one insulative material that is different than, and that exhibits etch selectivity with respect to, the insulative structures 104. For example, the additional insulative structures 106 may individually be formed of and include at least one dielectric nitride material (e.g., $SiN_y$) or at least one oxynitride material (e.g., $SiO_xN_y$). In some embodiments, the additional insulative structures 106 are formed of and include $Si_3N_4$. Each of the additional insulative structures 106 may individually include a substantially homogeneous distribution or a substantially heterogeneous distribution of the at least one additional insulative material. The additional insulative structures 106 may serve as sacrificial structures for the subsequent formation of conductive structures, as described in further detail below.

Although FIGS. 1B and 1C illustrate a particular quantity of tiers 108 of the insulative structures 104 and the additional insulative structures 106, the disclosure is not so limited. In some embodiments, the preliminary stack structure 102 includes a desired quantity of the tiers 108, such as within a range from thirty-two (32) of the tiers 108 to two hundred fifty-six (256) of the tiers 108. In some embodiments, the preliminary stack structure 102 includes sixty-four (64) of the tiers 108. In other embodiments, the preliminary stack structure 102 includes a different quantity of the tiers 108, such as less than sixty-four (64) of the tiers 108 (e.g., less than or equal to sixty (60) of the tiers 108, less than or equal to fifty (50) of the tiers 108, less than or equal to forty (40) of the tiers 108, less than or equal to thirty (30) of the tiers 108, less than or equal to twenty (20) of the tiers 108, less than or equal to ten (10) of the tiers 108); or greater than sixty-four (64) of the tiers 108 (e.g., greater than or equal to seventy (70) of the tiers 108, greater than or equal to one hundred (100) of the tiers 108, greater than or equal to about one hundred twenty-eight (128) of the tiers 108, greater than or equal to two hundred fifty-six (256) of the tiers 108) of the insulative structures 104 and the additional insulative structures 106. In addition, in some embodiments, the preliminary stack structure 102 overlies a deck structure comprising additional tiers 108 of insulative structures 104 and the additional insulative structures, separated from the preliminary stack structure 102 by at least one dielectric material, such as an interdeck insulative material.

With continued reference to FIGS. 1B and 1C, the microelectronic device structure 100 further includes a source tier 110 vertically underlying (e.g., in the Z-direction) the preliminary stack structure 102. The source tier 110 may comprise, for example, a first conductive material 112 and a second conductive material 114. In some embodiments, the first conductive material 112 comprises conductively-doped silicon. In some such embodiments, the second conductive material 114 is formed of and include one or more of a metal silicide material (e.g., tungsten silicide ($WSi_x$)), a metal nitride material (e.g., tungsten nitride), and a metal silicon nitride material (e.g., tungsten silicon nitride ($WSi_xN_y$)). In some embodiments, the second conductive material 114 comprises tungsten silicide.

The dielectric material 116, which may serve as a mask material, may vertically (e.g., in the Z-direction) overlie a vertically uppermost tier 108 of the insulative structures 104 and the additional insulative structures 106 of the preliminary stack structure 102. The dielectric material 116 may comprise one or more of the materials described above with reference to the insulative structures 104. In some embodiments, the dielectric material 116 comprises silicon dioxide.

In some embodiments, the source tier 110 is formed to include one or more source structures 118 (e.g., a source plate) horizontally extending into a horizontal area of the staircase region 105. Source structures 118 may be operatively associated with vertically extending strings of memory cells within a memory array region of the microelectronic device structure 100, as described in further detail below. The source structures 118 may be formed of and include the first conductive material 112 and the second conductive material 114, and may be electrically isolated from other portions of the first conductive material 112 and the second conductive material 114 (e.g., other portions employed as conductive routing structures 117 and/or as conductive pad structures) by insulative material 119.

Figure 2A:
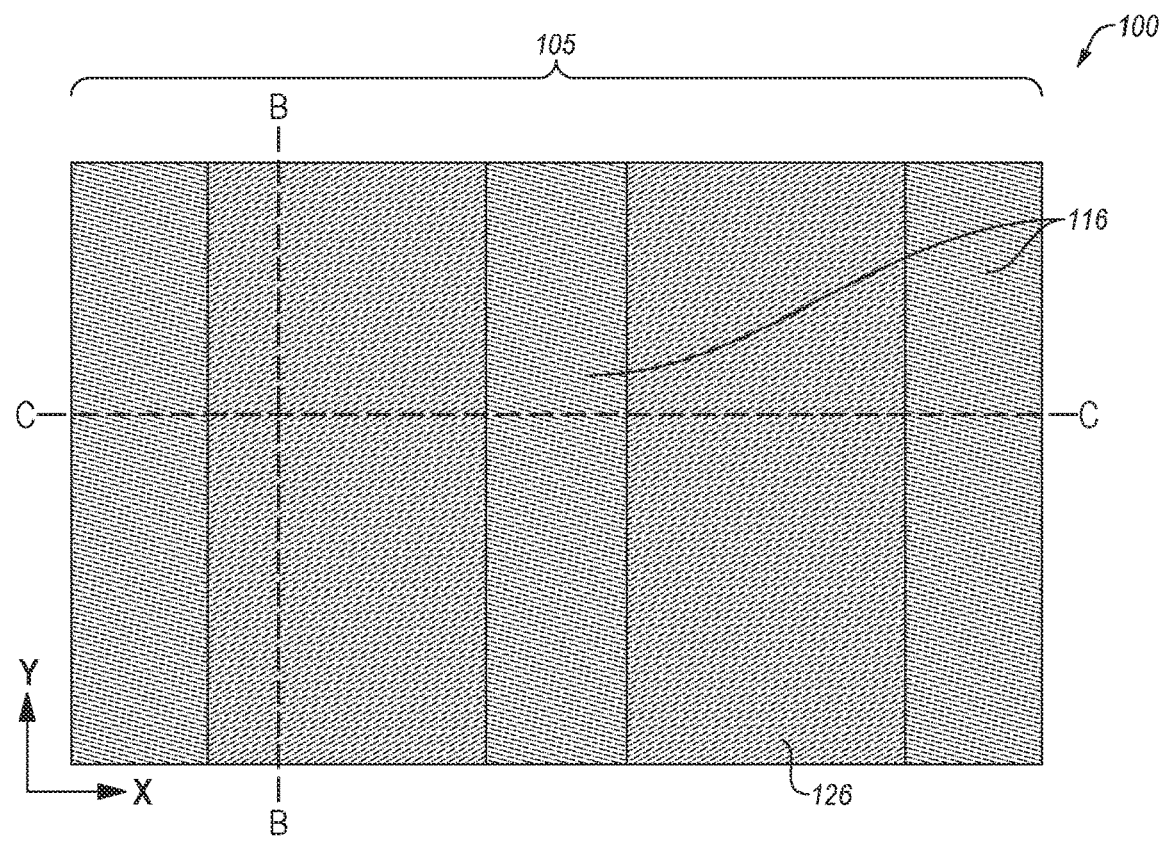
Figure 2B:
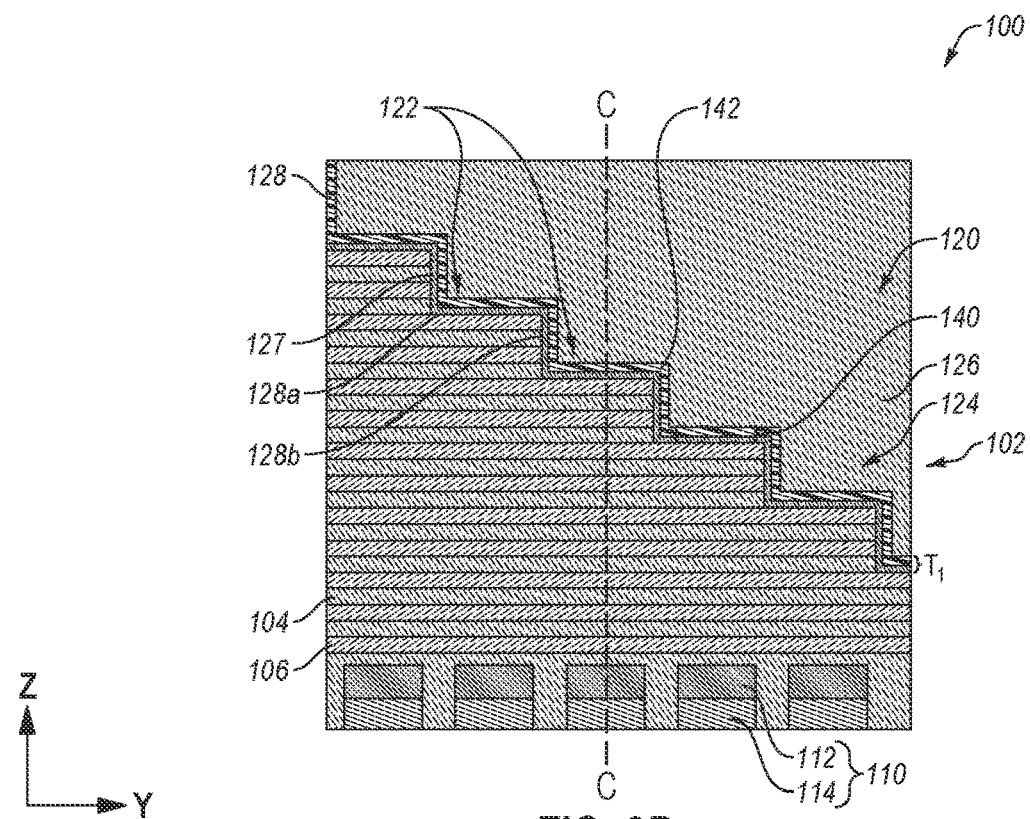
Figure 2C:
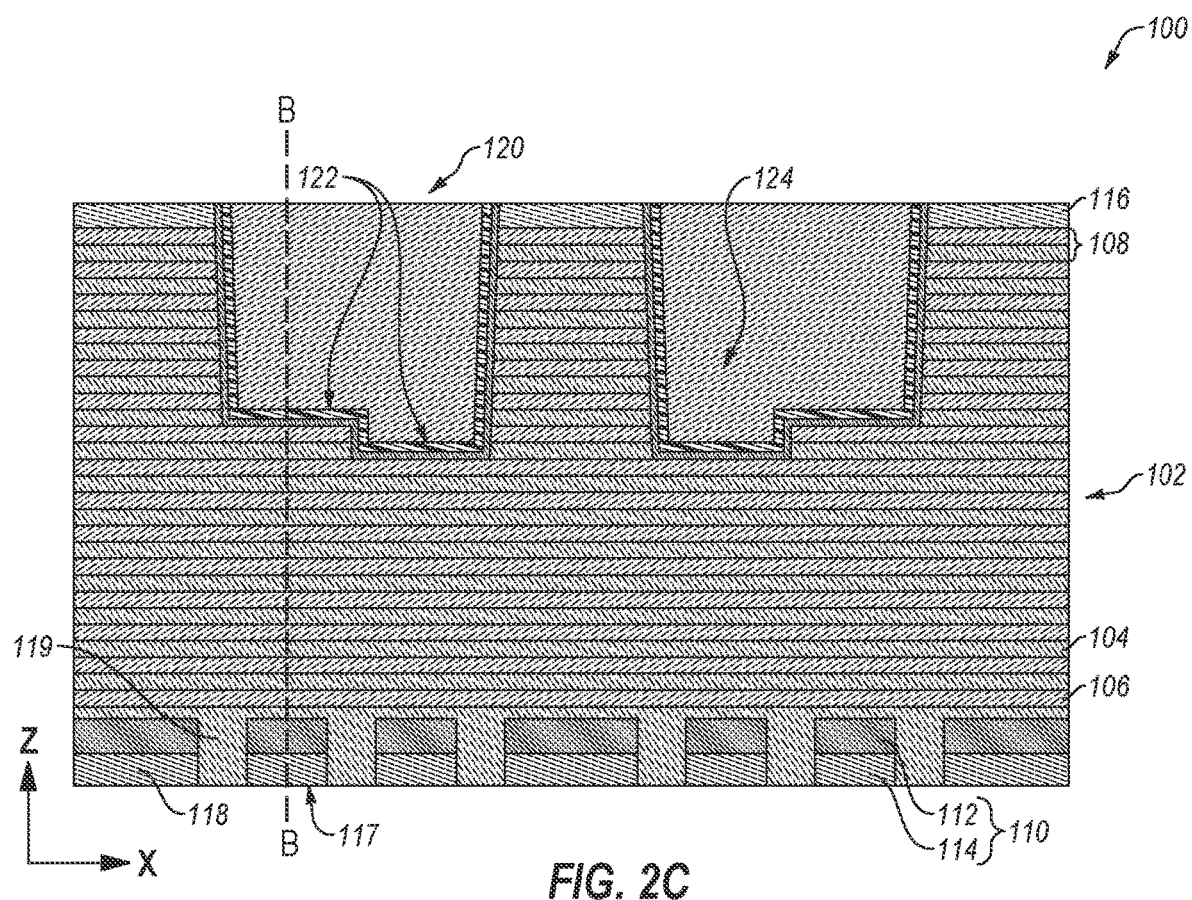

Referring collectively to FIGS. 2A through 2C, at least one staircase structure 120 (FIGS. 2B and 2C) may be formed within the staircase region 105 of the preliminary stack structure 102 (FIGS. 2B and 2C). A first insulative liner material 127 and a second insulative liner material 128 may be formed to vertically (e.g., in the Z-direction) overlie the staircase structure 120, and then a dielectric fill material 126 may be formed to fill at least one valley 124 (e.g., space, gap, trench, opening) vertically overlying the staircase structure 120. The dielectric fill material 126 may be formed to laterally intervene (e.g., in the X-direction) between portions of the dielectric material 116, as shown in FIG. 2A. FIGS. 2B and 2C are simplified, partial cross-sectional views of the microelectronic device structure 100 (about the line B-B and the line C-C, respectively) at the processing stage shown in FIG. 2A. For clarity and ease of understanding of the drawings and related description, not all features depicted in one of FIGS. 2A through 2C are depicted in each of the others of FIGS. 2A through 2C.

As shown in FIGS. 2B and 2C, the staircase structure 120 may be formed to include steps 122 comprising edges (e.g., horizontal ends) of the tiers 108 of the insulative structures 104 and additional insulative structures 106. Although FIG. 2B illustrates two (2) of the tiers 108 of the insulative structures 104 and the additional insulative structures 106 corresponding to one (1) step 122 of the staircase structure 120, the quantity of steps 122 of the staircase structure 120 may correspond to the quantity of tiers 108, such that a single (e.g., only one) step 122 corresponds to one of the tiers 108. The staircase structure 120 (and the valley 124 at least partially defined by the staircase structure 120) include a stepped cross-sectional profile in the ZY-plane, as shown in FIG. 2B. The stepped cross-sectional profile of the staircase structure 120 (and of the valley 124) may be defined by the geometric configurations of the steps 122 of the staircase structure 120.

For clarity and ease of understanding the description, FIG. 2B illustrates only a particular quantity of steps 122 in the staircase structure 120. However, it will be understood that the staircase structure 120 may include a greater quantity of steps 122 than those illustrated. For example, the staircase structure 120 may include greater or equal to eight (8) of the steps 122, greater than or equal to sixteen (16) of the steps 122, greater than or equal to thirty-two (32) of the steps 122, greater than or equal to sixty-four (64) of the steps 122, greater than or equal to one-hundred and twenty-eight (128) of the steps 122, or greater than or equal to two-hundred and fifty-six (256) of the steps 122.

In some embodiments, the staircase structure 120 forms a portion of a stadium structure including opposing staircase structures 120 each having steps 122 defined by horizontal ends of the tiers 108 of the preliminary stack structure 102. In some such embodiments, multiple (e.g., more than one) stadium structures individually including one or more initial staircase structures may be formed to be positioned at substantially the same elevations (e.g., vertical locations) as one another within the preliminary stack structure 102. During formation of the steps 122 of the staircase structure 120, an initial staircase structure (e.g., configured substantially similar to the staircase structure 120) may be formed at an upper vertical position within the preliminary stack structure 102 within horizontal boundaries of the staircase region 105 of the microelectronic device structure 100 using conventional processes (e.g., conventional photolithographic patterning processes, conventional material removal processes), and conventional processing equipment, which are not described in detail herein. The microelectronic device structure 100 may then be subjected to one or more additional material removal processes (e.g., one or more chopping processes) to increase the depth(s) (e.g., in the Z-direction) of the initial staircase structure relative to an upper surface of the preliminary stack structure 102 and form the staircase structure 120. The staircase structure 120 may be substantially similar to the initial staircase structure used to form the staircase structure 120, except located at a relatively lower vertical position within the microelectronic device structure 100 (e.g., within the preliminary stack structure 102). The additional material removal processes may permit a lower boundary of the staircase structure 120 to be positioned at or below a lower boundary of the preliminary stack structure 102.

In some embodiments, upper regions of the valley 124 (e.g., corresponding to the upper vertical position of the initial staircase structure within the preliminary stack structure 102) include substantially linear, elongated openings vertically overlying the steps 122 of the staircase structure 120, as shown in FIG. 2C. In some such embodiments, the valley 124 is vertically extended into the preliminary stack structure 102 using at least one material removal process (e.g., at least one chopping process) to terminate vertically below a location of the initial staircase structure and form the staircase structure 120. In additional embodiments, each of the tiers 108 of the preliminary stack structure 102 includes one or more steps 122 of the staircase structure 120 therein, and substantially linear, elongated openings are not formed above the staircase structure 120. In some embodiments, a lowermost boundary of the valley 124 is defined by two of the steps 122 extending in the X-direction, as shown in FIG. 2C. In additional embodiments, the lowermost boundary of the valley 124 is defined by a single (e.g., only one) step 122 extending in the X-direction.

With continued reference to FIGS. 2B and 2C, the first insulative liner material 127 may, optionally, be formed to vertically (e.g., in the Z-direction) overlie the staircase structure 120, the vertically uppermost tier 108 of the insulative structures 104 and the additional insulative structures 106. In addition, the second insulative liner material 128 may be formed to vertically overlie the first insulative liner material 127. As shown in FIG. 2B, the second insulative liner material 128 may include upper portions 128a and side portions 128b proximate to and intervening between neighboring portions of the upper portions 128a. For example, the upper portions 128a may horizontally extend across (e.g., in the Y-direction) and substantially cover upper surfaces of the steps 122, and the side portions 128b may vertically extend across (e.g., in the Z-direction) and substantially cover side surfaces of the steps 122. The second insulative liner material 128 may be formed to include a substantially continuous material (e.g., a substantially continuous liner material) on or over the steps 122 of the staircase structure 120.

The first insulative liner material 127, if present, may be formed of and include at least one insulative material, such as one or more of the materials described above with reference to the insulative structures 104. In some embodiments, the first insulative liner material 127 comprises substantially the same material composition as the insulative structures 104. In other embodiments, the first insulative liner material 127 comprises a different material composition than the insulative structures 104. In some embodiments, the first insulative liner material 127 comprises silicon dioxide. In additional embodiments, the first insulative liner material 127 is formed of and includes a high-k dielectric material. The first insulative liner material 127 may have a thickness (e.g., height) in the vertical direction (e.g., in the Z-direction) within a range from about 10 nanometers (nm) to about 80 nm, such as from about 10 nm to about 20 nm, from about 20 nm to about 40 nm, from about 40 nm to about 60 nm, or from about 60 nm to about 80 nm. For convenience, the first insulative liner material 127 is absent in subsequent views of the drawings, although it is understood that the first insulative liner material 127 may be present in additional embodiments of the disclosure.

The second insulative liner material 128 may exhibit etch selectivity relative to the dielectric material 116, the dielectric fill material 126, and the first insulative liner material 127. The second insulative liner material 128 may be formed of and include one or more of the materials described above with reference to the additional insulative structures 106. In some embodiments, the second insulative liner material 128 comprises substantially the same material composition as the additional insulative structures 106. In other embodiments, the second insulative liner material 128 comprises a different material composition than the additional insulative structures 106. The second insulative liner material 128 may, alternatively, be formed of and include one or more of silicon oxycarbide ($SiO_xC_y$), silicon oxynitride ($SiO_xN_y$), hydrogenated silicon oxycarbide ($SiC_xO_yH_z$), or silicon oxycarbonitride ($SiO_xC_yN_z$). The second insulative liner material 128 may include a low-k dielectric material, such as a dielectric nitride material or a dielectric oxide material, having a dielectric constant (k) lower than the dielectric constant of a silicon nitride ($Si_3N_4$) material, of a silicon oxide ($SiO_x$, $SiO_2$) material, or of a carbon-doped silicon oxide material that includes silicon atoms, carbon atoms, oxygen atoms, and hydrogen atoms.

In additional embodiments, the second insulative liner material 128 is formed of and includes a high-k dielectric material. The second insulative liner material 128 may, for example, be formed of and include a high-k dielectric oxide, such as one or more of aluminum oxide ($AlO_x$), hafnium oxide ($HfO_x$), niobium oxide ($NbO_x$), zirconium oxide ($ZrO_x$), titanium oxide ($TiO_x$), and tantalum oxide ($TaO_x$), or a combination of a non-high-k dielectric oxide (e.g., $SiO_x$) and one or more high-k dielectric oxides. In some embodiments, the second insulative liner material 128 is formed of and includes hafnium-doped silicon dioxide, where the ratio of hafnium to silicon is controlled to achieve a desired etch selectivity of the high-k dielectric material of the second insulative liner material 128. The second insulative liner material 128 may also exhibit etch selectivity relative to the insulative structures 104 of the tiers 108 of the preliminary stack structure 102, as well as the second conductive material 114 of the source tier 110. In some such embodiments, the second insulative liner material 128 is formed of and includes a nitride material having a material composition that differs from that of the additional insulative structures 106, although other materials of the second insulative liner material 128 may be contemplated, so long as the second insulative liner material 128 exhibits etch selectivity relative to each of the dielectric material 116, the dielectric fill material 126, the first insulative liner material 127 (FIG. 2B), the insulative structures 104, and the second conductive material 114, as well as additional materials (e.g., conductive materials, additional insulative materials formed during subsequent processing of the microelectronic device structure 100).

As shown in FIG. 2B, the upper portion 128a of the second insulative liner material 128 may be formed to include a sacrificial portion 140 (e.g., a sacrificial plug) formulated to be removed during subsequent processing acts and a remaining portion 142 designated to remain on or over the steps 122 of the staircase structure 120. The remaining portion 142 of the upper portions 128a of the second insulative liner material 128 may be located horizontally proximate to and at least partially surrounding the sacrificial portion 140 thereof. As will be described herein, the sacrificial portion 140 of the upper portions 128a of the second insulative liner material 128 may be replaced with another material (e.g., a conductive material of strapping structures 174 (FIG. 12B)).

The second insulative liner material 128 may have a thickness $T_1$ (e.g., height) in the vertical direction within a range from about 10 nm to about 100 nm, such as from about 10 nm to about 20 nm, from about 20 nm to about 40 nm, from about 40 nm to about 60 nm, from about 60 nm to about 80 nm, or from about 80 nm to about 100 nm. In some embodiments, the thickness $T_1$ is about 80 nm. In some embodiments, the thickness $T_1$ of the second insulative liner material 128 may be greater than a thickness of the first insulative liner material 127. Accordingly, the first insulative liner material 127 and the second insulative liner material 128 may have a combined thickness (e.g., height) in the vertical direction within a range from about 10 nm to about 180 nm, for example. The thickness $T_1$ of the second insulative liner material 128 may be tailored to facilitate use of the second insulative liner material 128 as the sacrificial material, and subsequently a thickness of structures (e.g., the strapping structures 174) to be formed within regions vacated by the sacrificial portion 140 of the upper portions 128a of the second insulative liner material 128.

The second insulative liner material 128 may be formed by one or more of CVD, ALD, plasma enhanced ALD, PVD, PECVD, or LPCVD. In some embodiments, the second insulative liner material 128 is formed at a temperature greater than about 600° C., such as greater than about 650° C. In some embodiments, the second insulative liner material 128 is formed at a temperature of about 680° C. In some embodiments, forming the second insulative liner material 128 at a temperature greater than about 600° C. (e.g., about 680° C.) may increase a density of the second insulative liner material 128 relative to the density of the first insulative liner material 127 formed at lower temperatures. The increased density of the second insulative liner material 128 may increase etch selectivity of the second insulative liner material 128 relative to the first insulative liner material 127. By way of comparison, liner materials formed at lower temperatures (e.g., about 570° C.) may exhibit a reduced etch selectivity relative to other insulative liner materials.

Figure 3A:
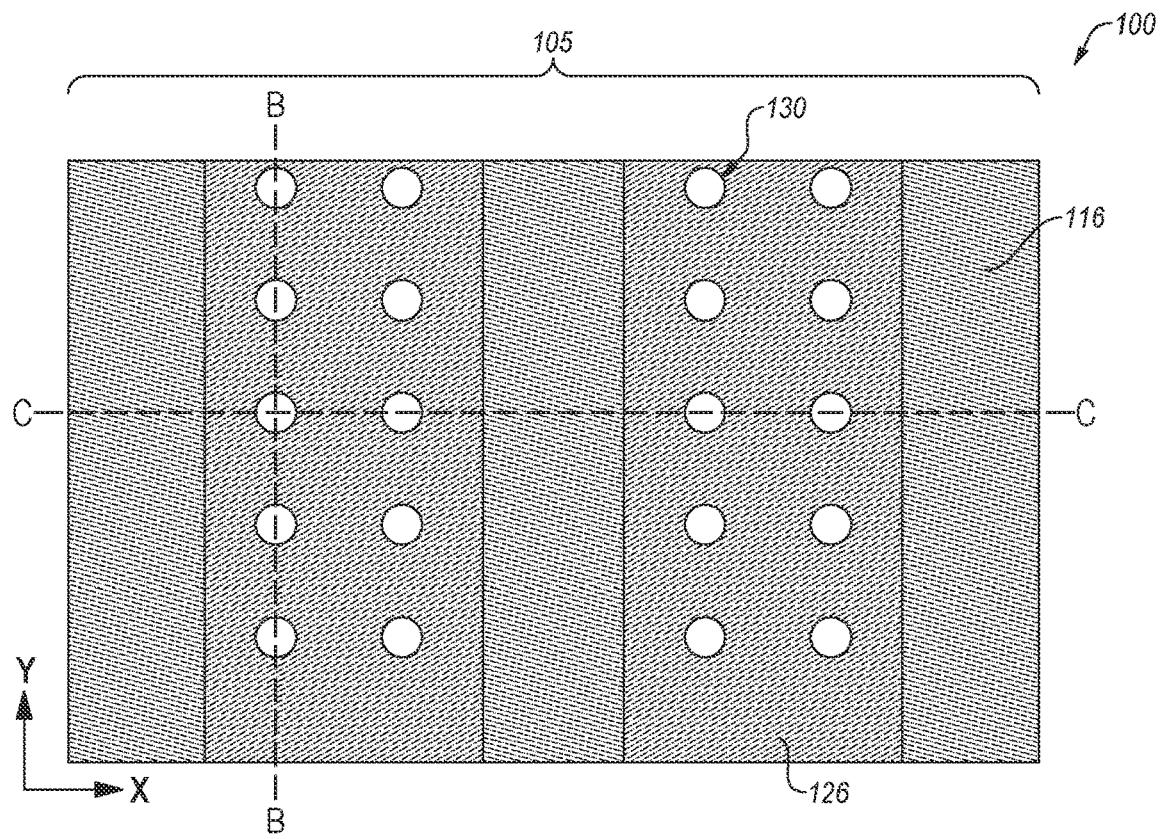
Figure 3B:
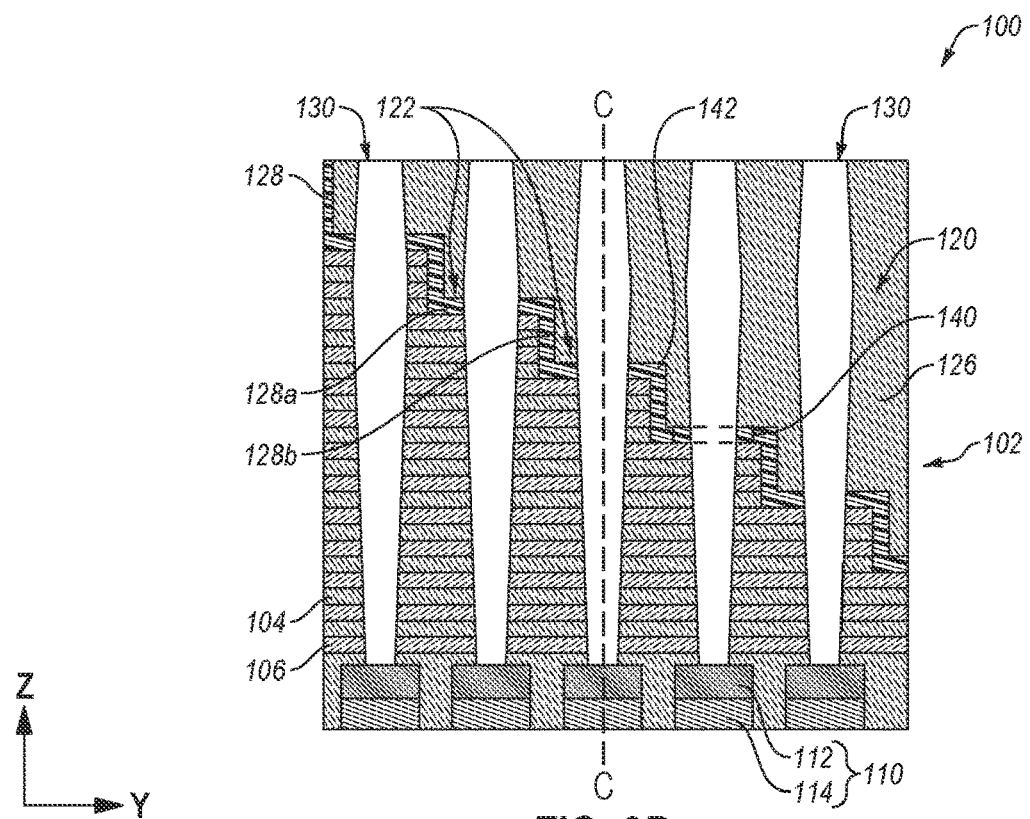
Figure 3C:
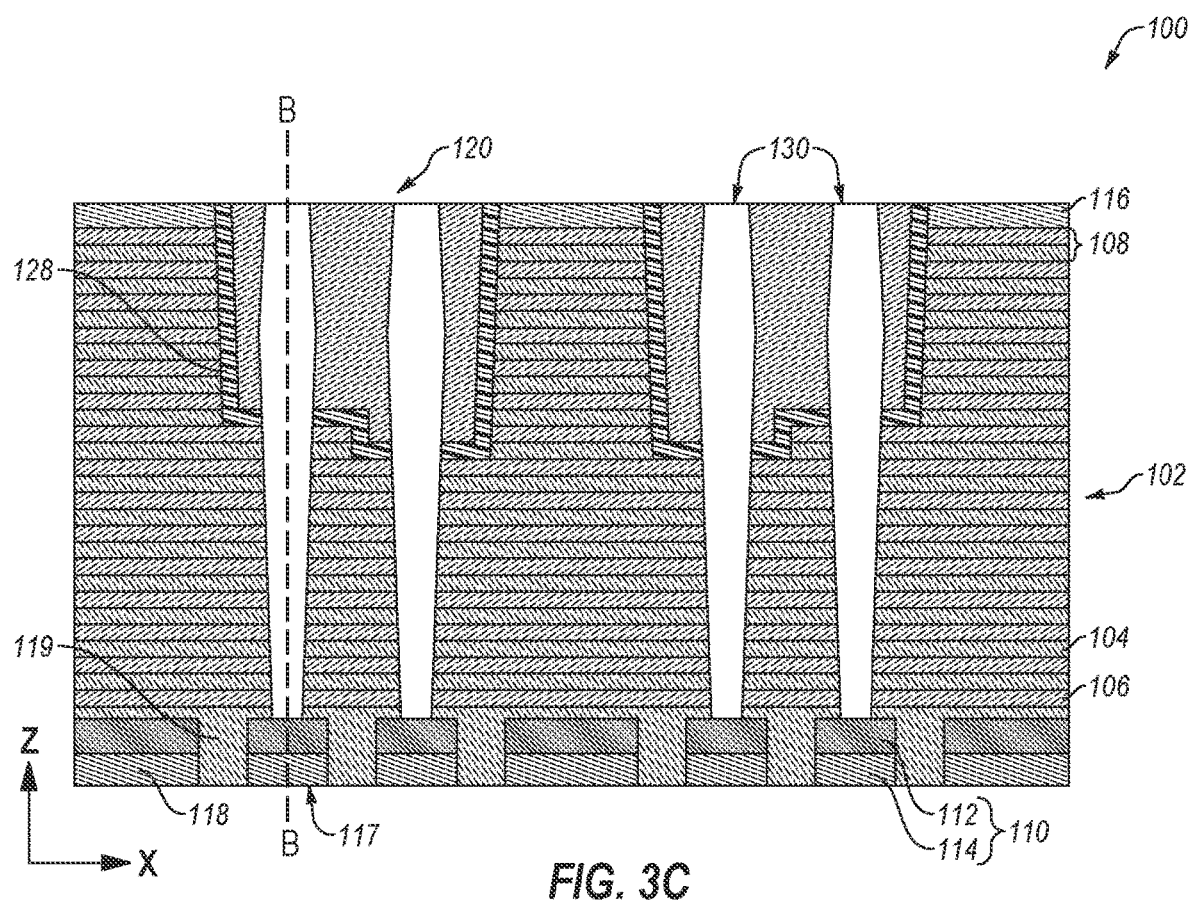

Referring now to FIG. 3A, first openings 130 (e.g., contact openings) may be formed to vertically extend (e.g., in the Z-direction) through the dielectric fill material 126 and the preliminary stack structure 102 (FIGS. 3B and 3C), such as through the dielectric fill material 126 and the tiers 108 of the insulative structures 104 and the additional insulative structures 106 within the staircase region 105. Formation of the first openings 130 is described in further detail below, along with additional components (e.g., structures, features) of the microelectronic device structure 100 at the processing stage depicted in FIG. 3A. FIG. 3B is a simplified, partial cross-sectional view of the microelectronic device structure 100 about the line B-B shown in FIG. 3A, and FIG. 3C is a simplified, partial cross-sectional view of the microelectronic device structure 100 about the line C-C shown in FIG. 3A. For clarity and ease of understanding of the drawings and related description, not all features depicted in one of FIGS. 3A through 3C are depicted in each of the others of FIGS. 3A through 3C.

Referring to FIGS. 3B and 3C, the first openings 130 (e.g., initial first openings) may be formed to extend through the preliminary stack structure 102. At least portions of each of the dielectric fill material 126, the second insulative liner material 128, the first insulative liner material 127 (FIG. 2B), if present, the insulative structures 104, and the additional insulative structures 106 are removed by exposing the respective materials to wet etch and/or dry etch chemistries, for example, in one or more material removal processes. Portions of the initial material of the second insulative liner material 128 (e.g., central portions of the sacrificial portion 140 (FIG. 2B)) may be removed (e.g., etched) in one or more material removal processes resulting in a dimension (e.g., width) of each of the first openings 130 being relatively less than that of the upper portions 128a of the second insulative liner material 128 (e.g., corresponding to upper surfaces of the steps 122 of the staircase structure 120). Additional portions of the sacrificial portion 140 and the remaining portion 142 of the upper portions 128a of the second insulative liner material 128 may remain on the upper surfaces of the steps 122 of the staircase structure 120 following formation of the first openings 130. Further, the first openings 130 extend beyond the upper surfaces of the steps 122 of the staircase structure 120 and through the materials of the preliminary stack structure 102. Accordingly, the first openings 130 may be formed to extend from an upper surface of the dielectric fill material 126 to the source tier 110 underlying the preliminary stack structure 102. In other words, the first openings 130 extend entirely through a vertical extent (e.g., a height) of the preliminary stack structure 102, as shown in FIGS. 3B and 3C. Thus, a height of each of the first openings 130 in the vertical direction (e.g., the Z-direction) may be substantially similar to (e.g., substantially the same as) one another irrespective of horizontal orientation relative to the steps 122 of the staircase structure 120. Manufacturing processes may be simplified by forming the first openings 130 to extend entirely through the vertical extent of the preliminary stack structure 102, without forming the first openings 130 to extend to varying (e.g., differing) depths corresponding to various locations of individual steps 122 of the staircase structure 120.

The first conductive material 112 of the source tier 110 may act as an etch stop material during removal of each of the dielectric fill material 126, the second insulative liner material 128, the first insulative liner material 127 (FIG. 2B), the insulative structures 104, and the additional insulative structures 106, and formation of the first openings 130. In some such embodiments, the first openings 130 terminate within the source tier 110, such as at or within the first conductive material 112 at the processing stage depicted in FIGS. 3B and 3C. In other embodiments, the first openings 130 terminate at or within an insulative material overlying the first conductive material 112. In additional embodiments, the first openings 130 extend through the first conductive material 112 and terminate at or within the second conductive material 114. By way of non-limiting example, the first openings 130 may terminate at or within the first conductive material 112 at the process stage shown in FIGS. 3A through 3C, and fourth openings 131 (FIG. 10B) may terminate at or within the second conductive material 114 through subsequent processing of the microelectronic device structure 100. As will be described herein, the fourth openings 131 may be used to form conductive contacts (e.g., conductive contacts 172 (FIG. 12B)) in contact with conductive contact structures (e.g., the strapping structures 174 (FIG. 12B)) of the staircase structure 120.

Figure 4A:
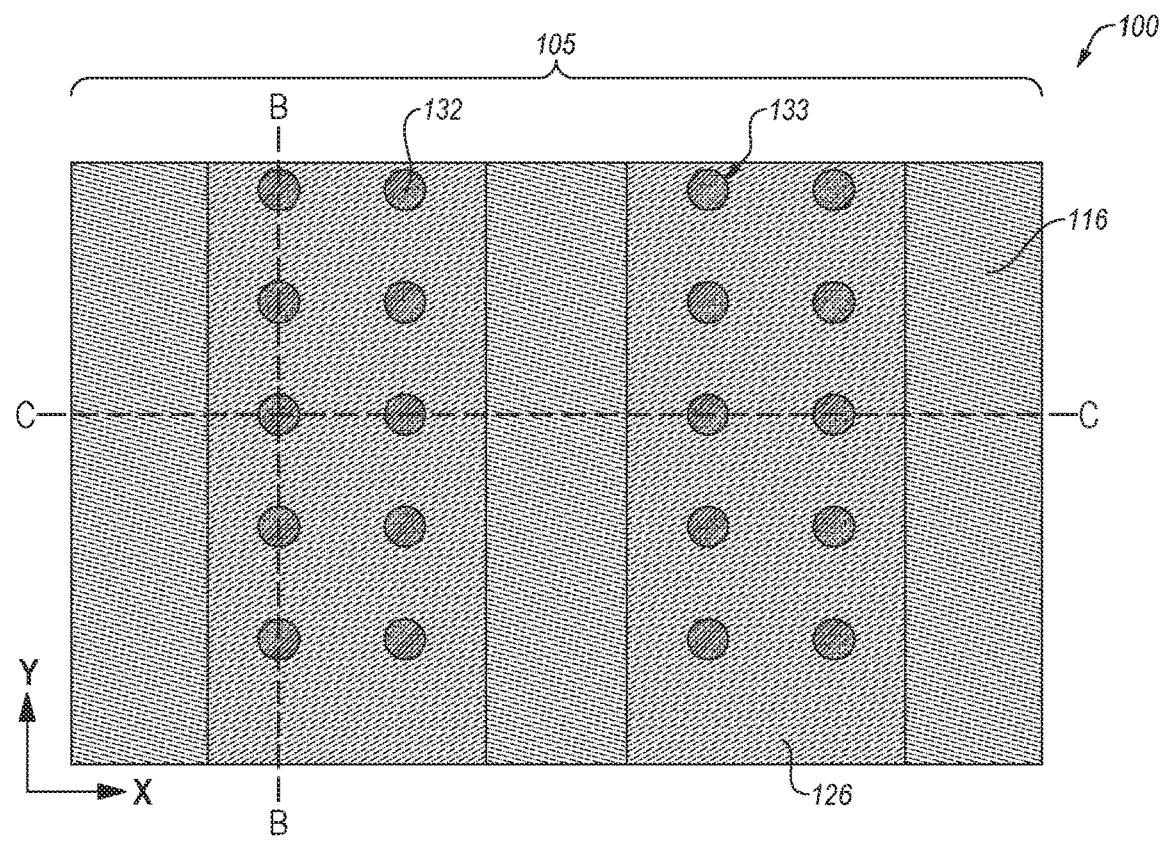
Figure 4B:
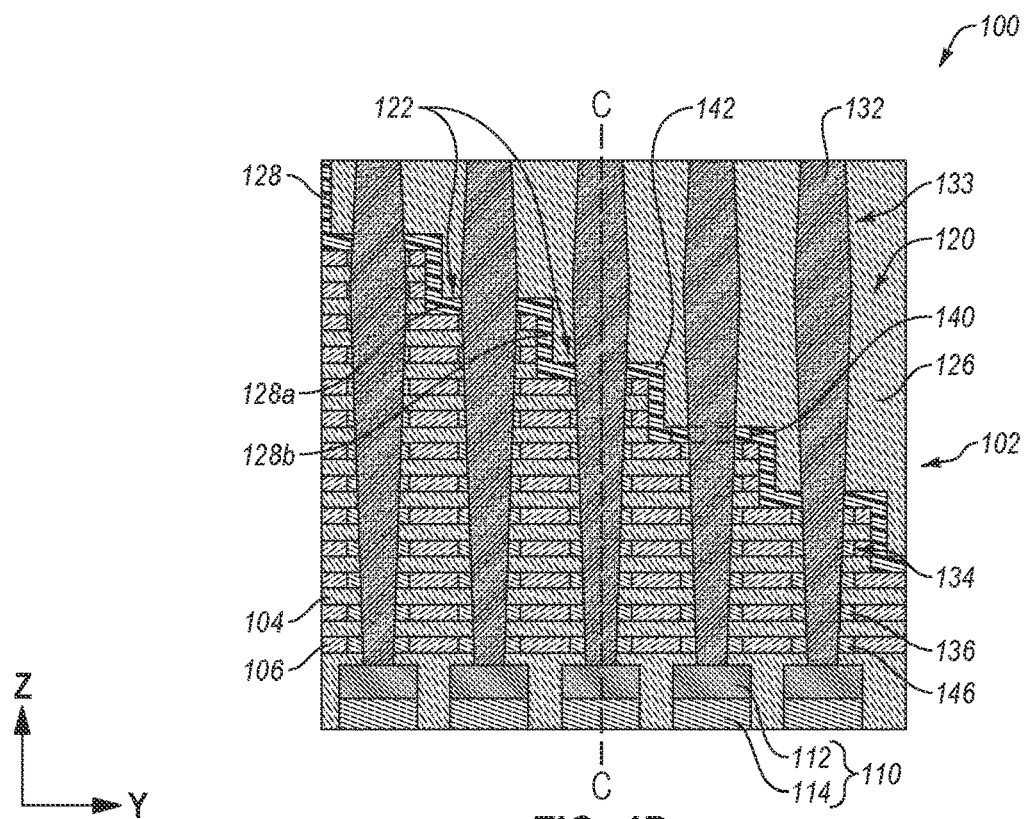
Figure 4C:
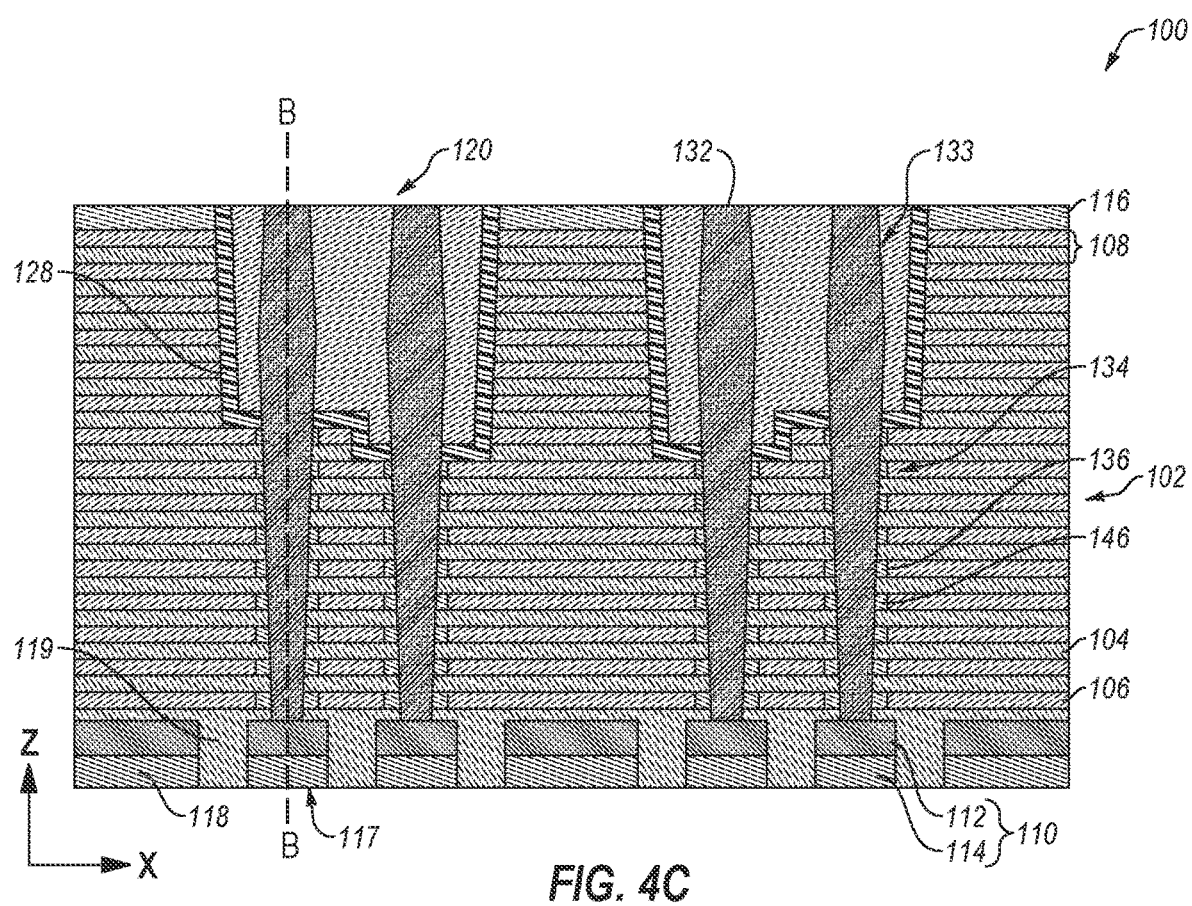

Referring next to FIG. 4A, a first sacrificial material 132 may be formed within the first openings 130 (FIG. 3A) to form first sacrificial structures 133. The first sacrificial material 132 of the first sacrificial structures 133 is described in further detail below, along with additional components (e.g., structures, features) of the microelectronic device structure 100 at the processing stage depicted in FIG. 4A. FIG. 4B is a simplified, partial cross-sectional view of the microelectronic device structure 100 about the line B-B shown in FIG. 4A, and FIG. 4C is a simplified, partial cross-sectional view of the microelectronic device structure 100 about the line C-C shown in FIG. 4A. For clarity and ease of understanding of the drawings and related description, not all features depicted in one of FIGS. 4A through 4C are depicted in each of the others of FIGS. 4A through 4C.

Referring to FIGS. 4B and 4C, prior to forming the first sacrificial structures 133 within the first openings 130 (FIG. 3B), lateral (e.g., in the X-direction, in the Y-direction) portions of the additional insulative structures 106 may be selectively removed through the first openings 130 to form recessed regions 134. By way of non-limiting example, exposed portions of the additional insulative structures 106 may be exposed to an etchant (e.g., a wet etchant) through the first openings 130 to selectively remove portions of the additional insulative structures 106 with respect to the insulative structures 104. In some embodiments, the additional insulative structures 106 are exposed to phosphoric acid ($H_3PO_4$) to selectively remove portions of the additional insulative structures 106 proximate the first openings 130.

After selectively removing portions of the additional insulative structures 106 proximate the first openings 130 (FIG. 3B), a liner material 136 may be formed within selected portions of the first openings 130 (e.g., within the recessed regions 134 proximate remaining portions of the additional insulative structures 106) without fully filling the first openings 130. For example, the liner material 136 may be formed within the recessed regions 134 to effectively "pinch off" and close (e.g., seal) the recessed regions 134 immediately adjacent to the first openings 130. The liner material 136 may be formed to extend between vertically neighboring insulative structures 104 proximate the recessed regions 134, such that the liner material 136 substantially vertically fills portions of the recessed regions 134 proximate the first openings 130 without entirely filling the first openings 130. The liner material 136 is formed by conventional techniques, such as one or more of in situ growth, CVD, ALD, and PVD using conventional processing equipment. In some embodiments, the liner material 136 may be formed (e.g., deposited) using a single, continuous ALD process or a single, continuous CVD process. In other embodiments, an initial material (e.g., a silicon nitride material of the additional insulative structures 106) may be oxidized to form the liner material 136.

The liner material 136 may comprise one or more of the materials described above with reference to the insulative structures 104. In some embodiments, the liner material 136 comprises silicon dioxide. The liner material 136 may be formed of and include at least one insulative material that is different than, and that exhibits etch selectivity with respect to, one or more of the additional insulative structures 106 and the second insulative liner material 128. In some embodiments, the liner material 136 is formed of and includes a single high quality silicon oxide material, such as an ALD $SiO_x$. For example, the liner material 136 may be a highly uniform and highly conformal silicon oxide material (e.g., a highly uniform and highly conformal silicon dioxide material) so that substantially no voids are present in the liner material 136. In particular, the liner material 136 may be formulated to be formed in high aspect ratio (HAR) openings, such as those having a HAR of at least about 20:1, at least about 50:1, at least about 100:1, or at least about 1000:1, without forming voids. The liner material 136 may, alternatively, be formed of and include one or more of silicon oxycarbide ($SiO_xC_y$), silicon oxynitride ($SiO_xN_y$), hydrogenated silicon oxycarbide ($SiC_xO_yH_z$), or silicon oxycarbonitride ($SiO_xC_yN_z$). The liner material 136 may include a low-k dielectric material, such as a dielectric nitride material or a dielectric oxide material, having a dielectric constant (k) lower than the dielectric constant of a silicon nitride ($Si_3N_4$) material, of a silicon oxide ($SiO_x$, $SiO_2$) material, or of a carbon-doped silicon oxide material that includes silicon atoms, carbon atoms, oxygen atoms, and hydrogen atoms. In other embodiments, the liner material 136 may include another metal oxide, such as zirconium oxide ($ZrO_x$), tantalum oxide ($TaO_x$), or magnesium oxide ($MgO_x$), for example.

Formation of the liner material 136 within the recessed regions 134 may result in formation of isolation regions 146 between the first openings 130 (FIG. 3B) and the additional insulative structures 106, such that the additional insulative structures 106 are remote (e.g., isolated) from the first openings 130 by the isolation regions 146. Stated another way, process acts may be selected to provide (e.g., facilitate, promote) formation of the liner material 136 within the recessed regions 134 proximate the first openings 130 for formation of the isolation regions 146 between the horizontally neighboring additional insulative structures 106 and subsequently formed materials (e.g., the first sacrificial material 132 of the first sacrificial structures 133) within the first openings 130.

After forming the liner material 136, the first sacrificial material 132 of the first sacrificial structures 133 may be formed within remaining portions of the first openings 130 (FIG. 3B). The first sacrificial material 132 may substantially fill the first openings 130 and may be in contact with each of the dielectric fill material 126, the second insulative liner material 128, the first insulative liner material 127 (FIG. 2B), as well as the liner material 136 of the recessed regions 134 and the insulative structures 104 of the preliminary stack structure 102. Accordingly, the first sacrificial structures 133 may be formed to extend from the upper surface of the dielectric fill material 126 to the source tier 110 underlying the preliminary stack structure 102. The first sacrificial structures 133 may terminate at (e.g., land on) the first conductive material 112 of the source tier 110, for example, without terminating at the second conductive material 114. Alternatively, the first sacrificial structures 133 may terminate at or within an insulative material overlying the first conductive material 112. After forming the first sacrificial material 132, the microelectronic device structure 100 may be exposed to a chemical mechanical planarization (CMP) process to remove sacrificial material outside of the first openings 130.

Once formed, each of the first sacrificial structures 133 may vertically extend completely through the preliminary stack structure 102, as shown in FIGS. 4B and 4C. For example, the first sacrificial material 132 of the first sacrificial structures 133 may vertically extend (e.g., in the Z-direction) from a vertically uppermost boundary of the dielectric fill material 126 (e.g., at an elevational level of a vertically uppermost tier 108 of the preliminary stack structure 102) to or beyond a vertically uppermost boundary of the first conductive material 112 of the source tier 110, without terminating on the steps 122 of the staircase structure 120. Accordingly, the steps 122 of the staircase structure 120 are free of additional contact structures terminating thereon.

The first sacrificial material 132 may be formed of and include at least one material exhibiting etch selectivity with respect to each of the dielectric fill material 126, the second insulative liner material 128, the first insulative liner material 127 (FIG. 2B), the insulative structures 104, the liner material 136, and one or more materials of the source tier 110 (e.g., the first conductive material 112), as well as additional materials (e.g., additional conductive materials) formed during subsequent processing of the microelectronic device structure 100. In some embodiments, the first sacrificial material 132 comprises conductive material. By way of non-limiting example, the first sacrificial material 132 may be formed of and include one or more of polysilicon, tungsten, titanium, titanium nitride, aluminum oxide, or another material. In some embodiments, the first sacrificial material 132 comprises amorphous silicon or polycrystalline silicon. In some such embodiments, the first sacrificial material 132 may be doped with one or more dopants, such as with at least one N-type dopant (e.g., one or more of arsenic, phosphorous, antimony, and bismuth) or at least one P-type dopant (e.g., one or more of boron, aluminum, and gallium). In other embodiments, the first sacrificial material 132 comprises tungsten.

Figure 5A:
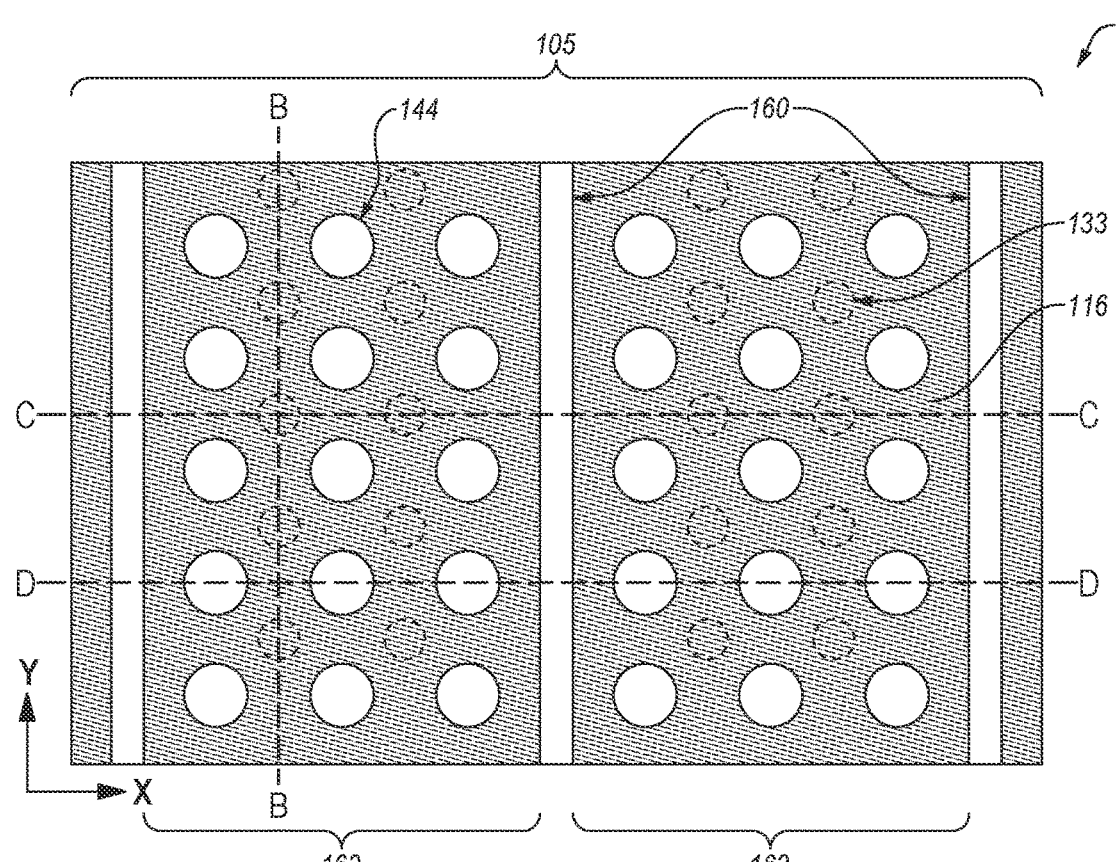
Figure 5B:
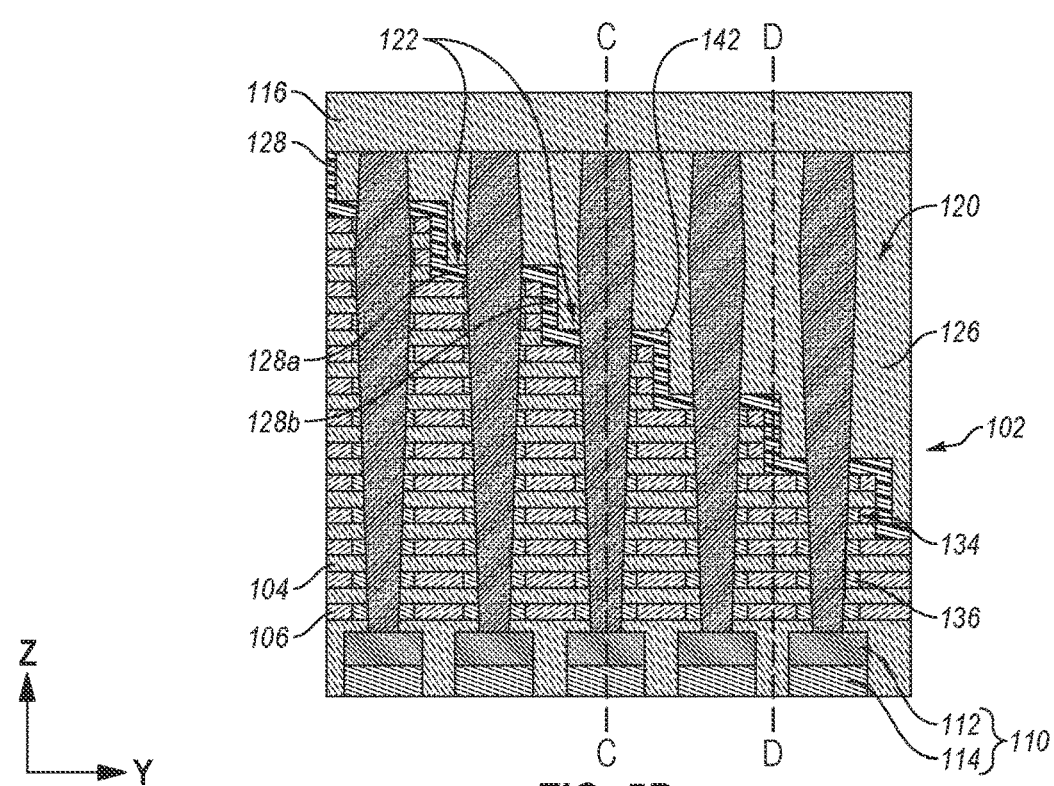
Figure 5C:
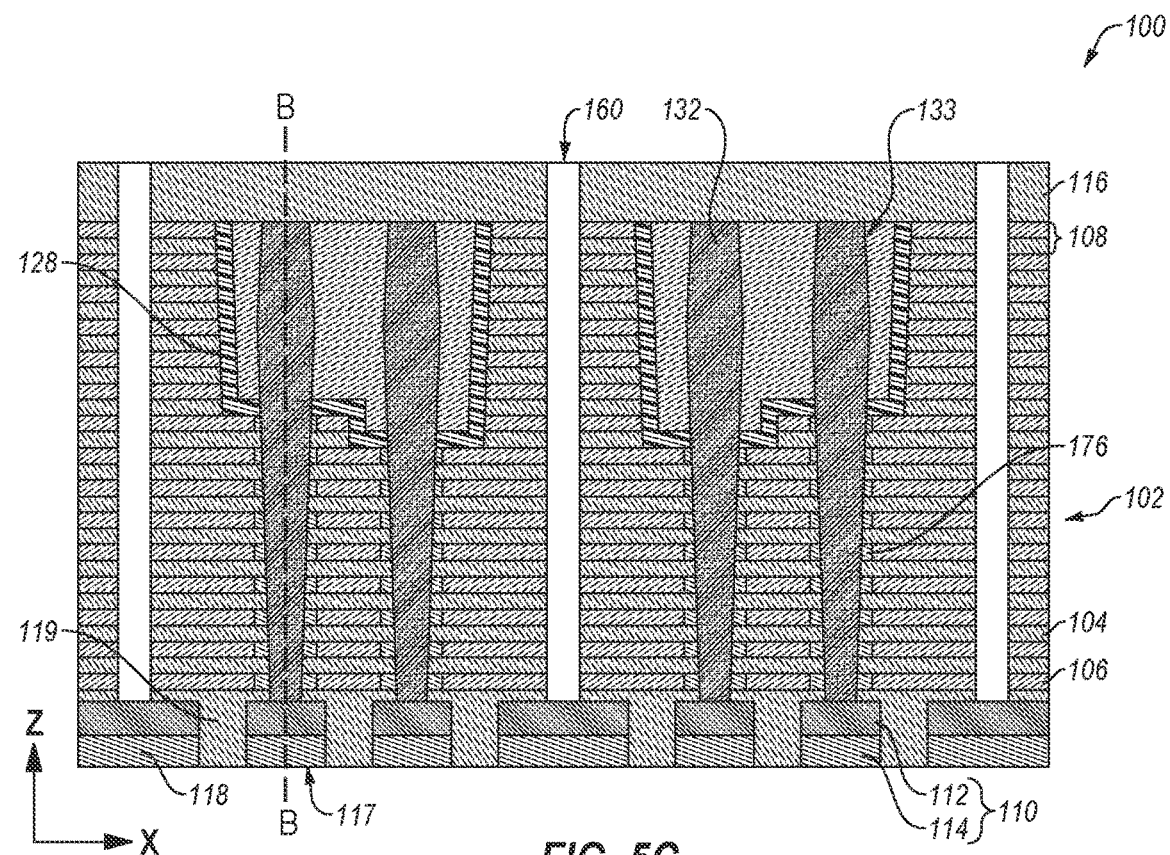
Figure 5D:
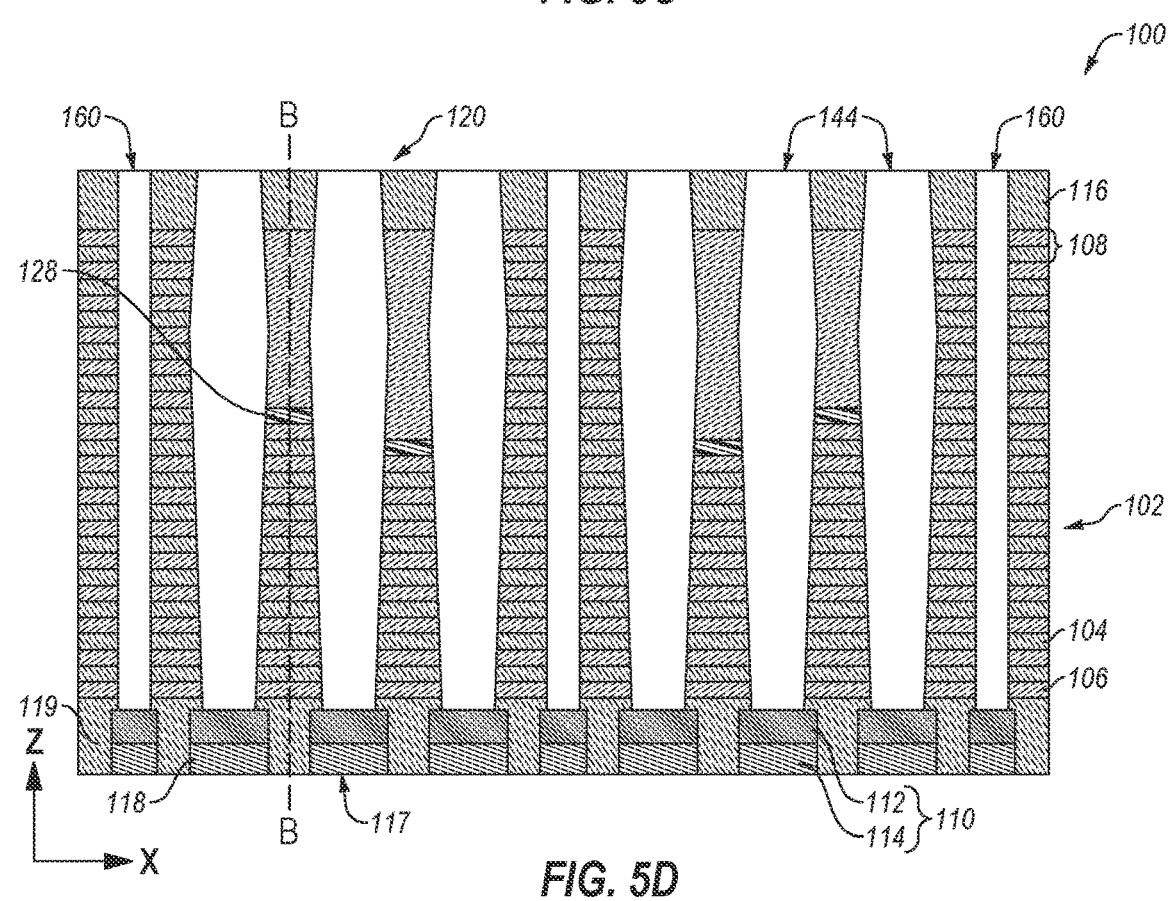

Referring next to FIG. 5A, second openings 144 (e.g., support structure openings, pillar openings) may be formed to vertically extend (e.g., in the Z-direction) through the dielectric material 116 and the preliminary stack structure 102 (FIGS. 5B through 5D), such as through the dielectric material 116, the dielectric fill material 126, and the tiers 108 of the insulative structures 104 and the additional insulative structures 106. Slots 160 (also referred to herein as "replacement gate slots") may also be formed through the preliminary stack structure 102 to facilitate the replacement of the additional insulative structures 106 with conductive structures. Formation of the second openings 144 and the slots 160 is described in further detail below, along with additional components (e.g., structures, features) of the microelectronic device structure 100 at the processing stage depicted in FIG. 5A. FIG. 5B is a simplified, partial cross-sectional view of the microelectronic device structure 100 about the line B-B shown in FIG. 5A, FIG. 5C is a simplified, partial cross-sectional view of the microelectronic device structure 100 about the line C-C shown in FIG. 5A, and FIG. 5D is a simplified, partial cross-sectional view of the microelectronic device structure 100 about the line D-D shown in FIG. 5A. For clarity and ease of understanding of the drawings and related description, not all features depicted in one of FIGS. 5A through 5D are depicted in each of the others of FIGS. 5A through 5D.

As shown in FIG. 5A, the second openings 144 may horizontally (e.g., in the X-direction, in the Y-direction) neighbor the first sacrificial structures 133 (shown in dashed lines). For example, the second openings 144 may be horizontally aligned in columns extending in the Y-direction with individual second openings 144 positioned out of horizontal alignment (e.g., staggered) with individual first sacrificial structures 133 horizontally aligned in additional columns extending in the Y-direction. At least some of the second openings 144 may be horizontally aligned with each other (e.g., in the X-direction, in the Y-direction) and horizontally offset from the first sacrificial structures 133 (e.g., in the Y-direction), although other configurations of the second openings 144 relative to the first sacrificial structures 133 may be contemplated.

Referring to FIGS. 5B through 5D, the second openings 144 (e.g., initial second openings) and the slots 160 (e.g., initial slots) may be formed to extend through each of the dielectric material 116 and the preliminary stack structure 102. At least portions of each of the dielectric material 116, the dielectric fill material 126, the second insulative liner material 128, the first insulative liner material 127 (FIG. 2B), the insulative structures 104, and the additional insulative structures 106 are removed by exposing the respective materials to wet etch and/or dry etch chemistries, for example, in one or more material removal processes. Prior to formation of the second openings 144 and the slots 160, portions of the dielectric fill material 126 and the preliminary stack structure 102 may be covered with an additional dielectric material (e.g., an additional portion of the dielectric material 116) and/or an additional mask material configured and positioned to protect the dielectric fill material 126 and the first sacrificial material 132 of the first sacrificial structures 133 from being removed (e.g., exhumed) during the material removal processes of the dielectric material 116 and the materials of the preliminary stack structure 102. For ease of understanding the disclosure, the additional dielectric material overlying the preliminary stack structure 102 is hereinafter collectively referred to as the dielectric material 116. The second openings 144 may be formed in the staircase region 105. The second openings 144 may terminate within the source tier 110, such as at or within the first conductive material 112 at the processing stage depicted in FIGS. 5B through 5D. Alternatively, the second openings 144 may terminate at or within an insulative material overlying the first conductive material 112.

The slots 160 may be formed to vertically extend (e.g., in the Z-direction) though the preliminary stack structure 102, such as through the dielectric material 116, the second insulative liner material 128, the first insulative liner material 127 (FIG. 2B), and the tiers 108 of the insulative structures 104 and the additional insulative structures 106. The slots 160 may extend to the source tier 110, such as to or within the first conductive material 112. Alternatively, the slots 160 may terminate at or within an insulative material overlying the first conductive material 112. The slots 160 may separate (e.g., divide) the microelectronic device structure 100 into block structures 162. Although FIG. 5A illustrates only three slots 160 and only two block structures 162, the disclosure is not so limited. The microelectronic device structure 100 may include a plurality of (e.g., four, five, six, eight) block structures 162, each separated from laterally neighboring (e.g., in the Y-direction) block structures 162 by a slot 160. In other words, the slots 160 may divide the microelectronic device structure 100 into any desired quantity of block structures 162. The slots 160 may or may not be formed during (e.g., substantially simultaneous with) formation of the second openings 144 in order to simplify manufacturing processes.

Figure 6A:
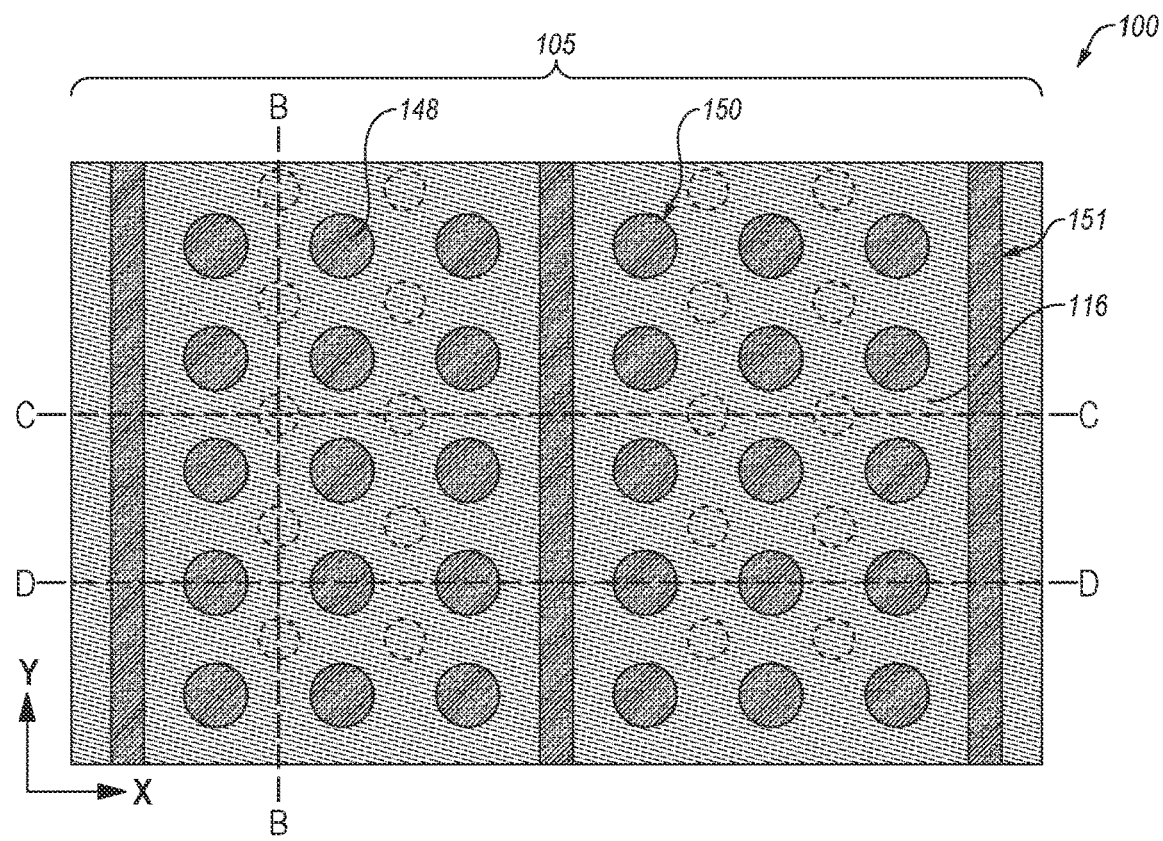
Figure 6B:
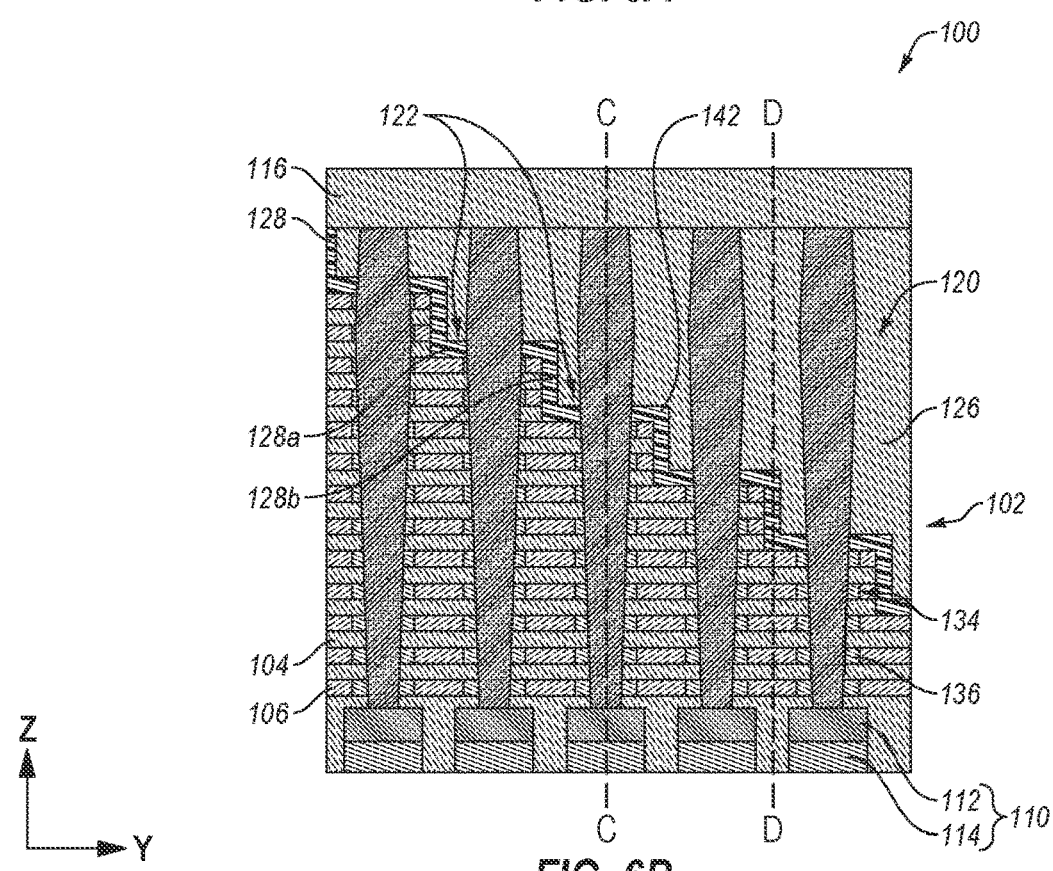
Figure 6C:
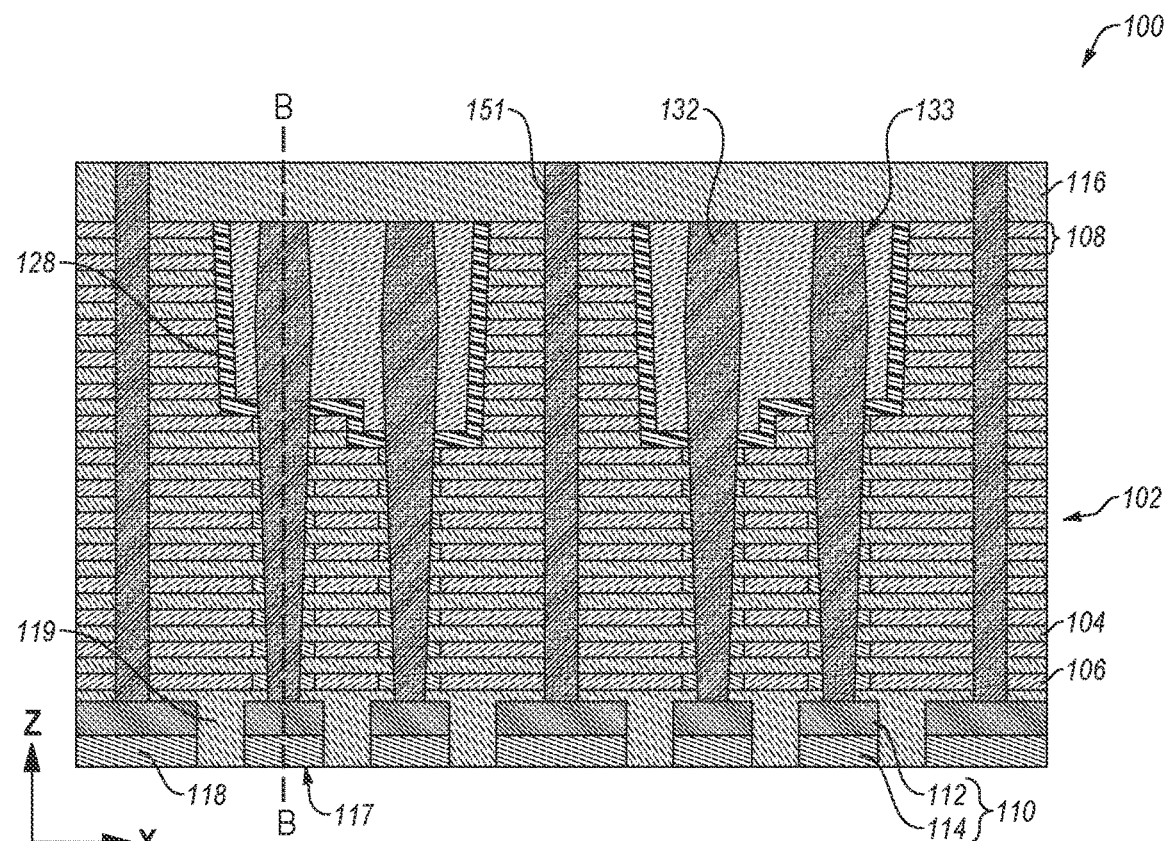
Figure 6D:
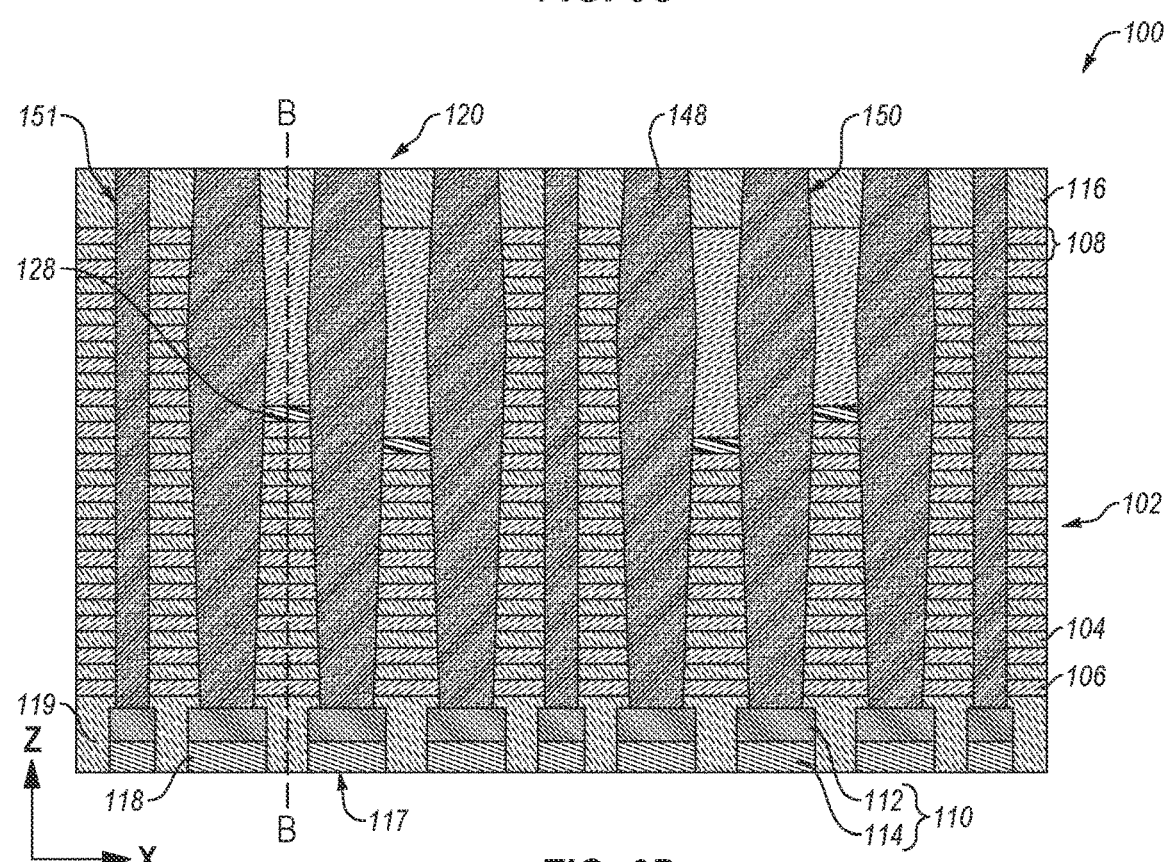

Referring next to FIG. 6A, a second sacrificial material 148 may be formed within the second openings 144 (FIG. 5A) to form second sacrificial structures 150 and an additional portion of the second sacrificial material 148 may be formed within the slots 160 (FIG. 5A) to form third sacrificial structures 151. The second sacrificial material 148 of the second sacrificial structures 150 and the third sacrificial structures 151 is described in further detail below, along with additional components (e.g., structures, features) of the microelectronic device structure 100 at the processing stage depicted in FIG. 6A. FIG. 6B is a simplified, partial cross-sectional view of the microelectronic device structure 100 about the line B-B shown in FIG. 6A, FIG. 6C is a simplified, partial cross-sectional view of the microelectronic device structure 100 about the line C-C shown in FIG. 6A, and FIG. 6D is a simplified, partial cross-sectional view of the microelectronic device structure 100 about the line D-D shown in FIG. 6A. For clarity and ease of understanding of the drawings and related description, not all features depicted in one of FIGS. 6A through 6D are depicted in each of the others of FIGS. 6A through 6D.

Referring to FIGS. 6B through 6D, the second sacrificial material 148 may substantially fill the second openings 144 (FIG. 5D) and the slots 160 (FIGS. 5C and 5D). The third sacrificial structures 151 may or may not be formed during (e.g., substantially simultaneous with) formation of the second sacrificial structures 150 in order to simplify manufacturing processes. The second sacrificial material 148 may be in contact with each of the dielectric material 116, the dielectric fill material 126, the second insulative liner material 128, the first insulative liner material 127 (FIG. 2B), and the tiers 108 of the insulative structures 104 and the additional insulative structures 106. Accordingly, the second sacrificial structures 150 and the third sacrificial structures 151 may be formed to extend from the upper surface of the dielectric material 116 to the source tier 110 underlying the preliminary stack structure 102. Each of the second sacrificial structures 150 and the third sacrificial structures 151 may terminate at (e.g., land on) the first conductive material 112 of the source tier 110, for example, without terminating at the second conductive material 114. Alternatively, each of the second sacrificial structures 150 and the third sacrificial structures 151 may terminate at or within an insulative material overlying the first conductive material 112. In additional embodiments, the second sacrificial structures 150 are formed within the second openings 144 without forming the third sacrificial structures 151 within the slots 160, such that the slots 160 remain open at the process stage of FIGS. 6A through 6D. After forming the second sacrificial material 148, the microelectronic device structure 100 may be exposed to a chemical mechanical planarization (CMP) process to remove sacrificial material outside of the second openings 144 and the slots 160.

The second sacrificial material 148 may be formed of and include at least one material exhibiting etch selectivity with respect to each of the dielectric material 116, the dielectric fill material 126, the second insulative liner material 128, the first insulative liner material 127 (FIG. 2B), the insulative structures 104, the additional insulative structures 106, and one or more materials of the source tier 110 (e.g., the first conductive material 112), as well as additional materials (e.g., additional conductive materials) formed during subsequent processing of the microelectronic device structure 100. In some embodiments, the second sacrificial material 148 of the second sacrificial structures 150 and the third sacrificial structures 151 comprises the same material composition as the first sacrificial material 132 of the first sacrificial structures 133 (e.g., amorphous silicon or polycrystalline silicon).

Figure 7A:
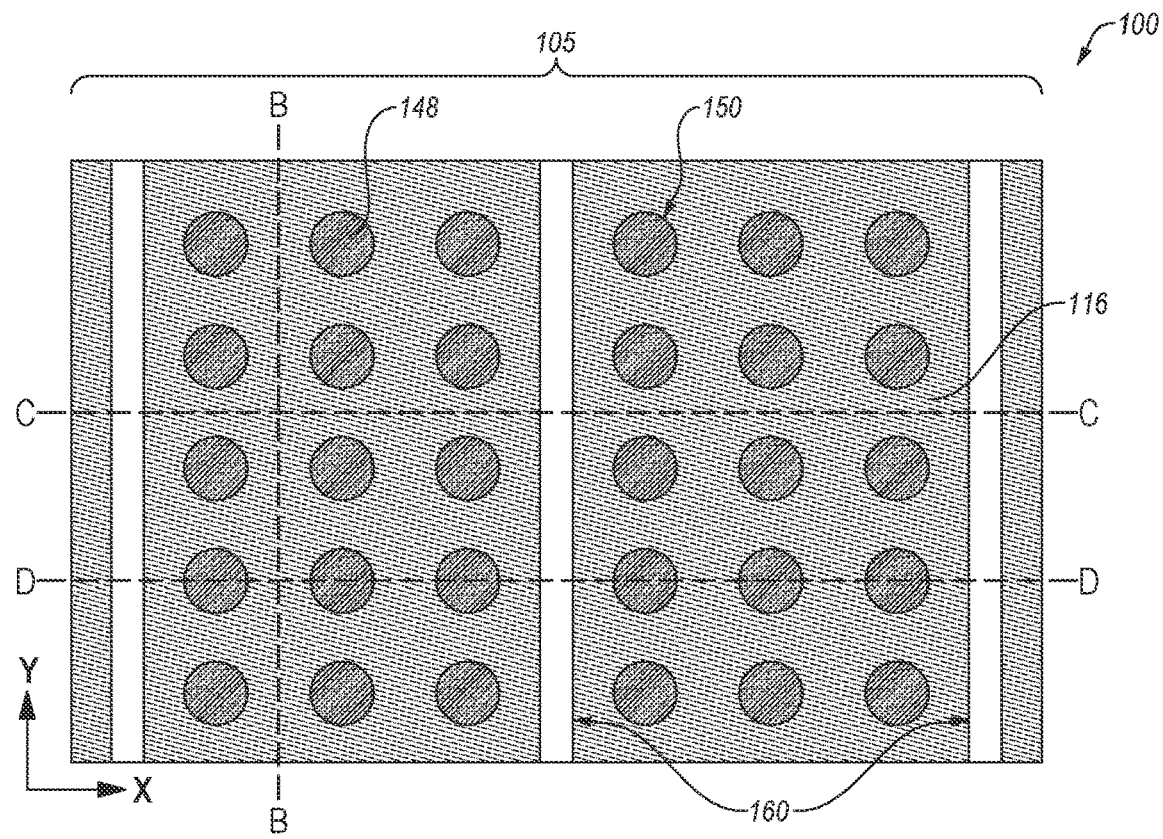
Figure 7B:
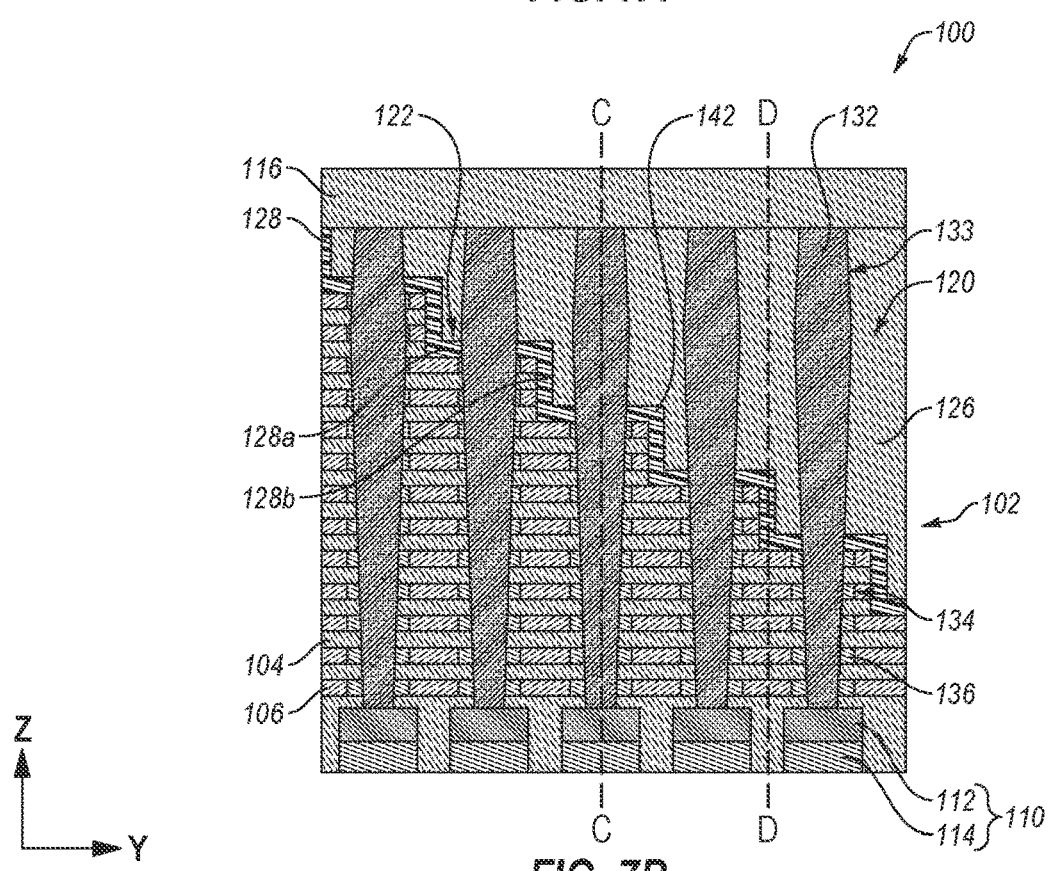
Figure 7C:
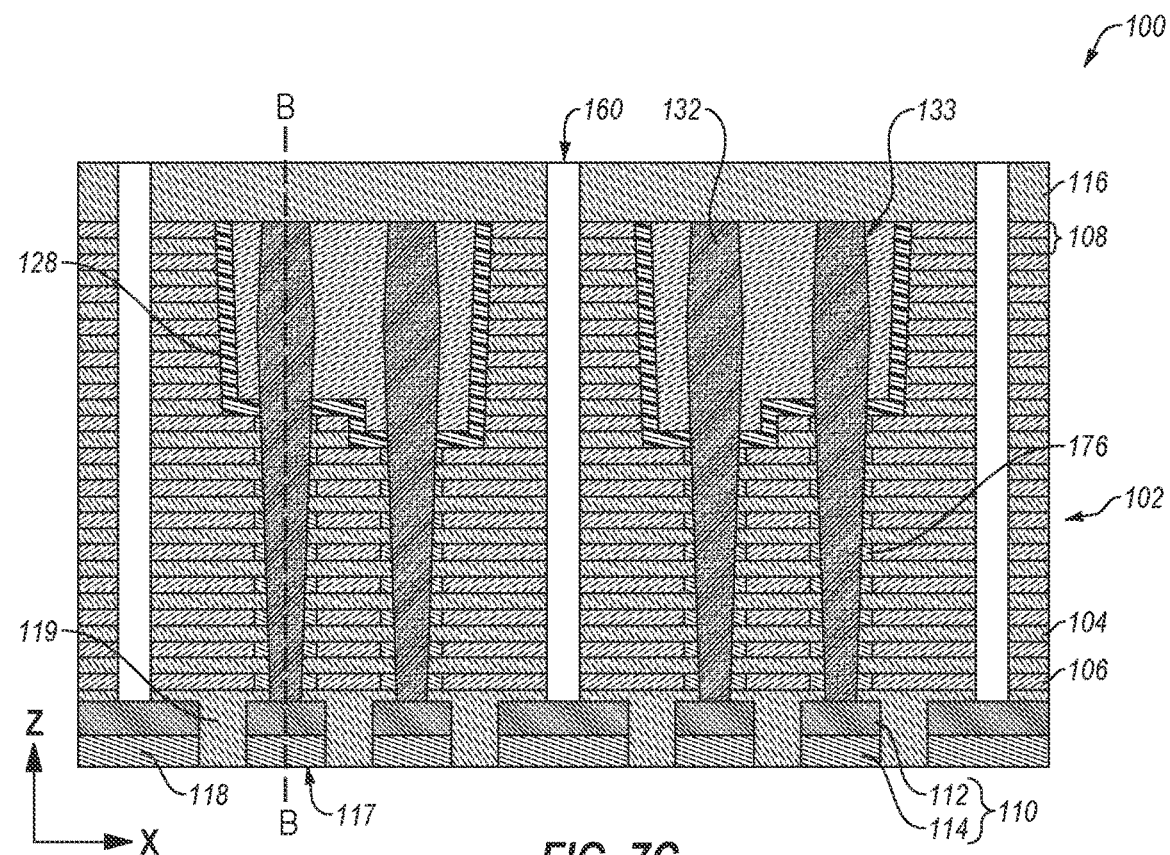
Figure 7D:
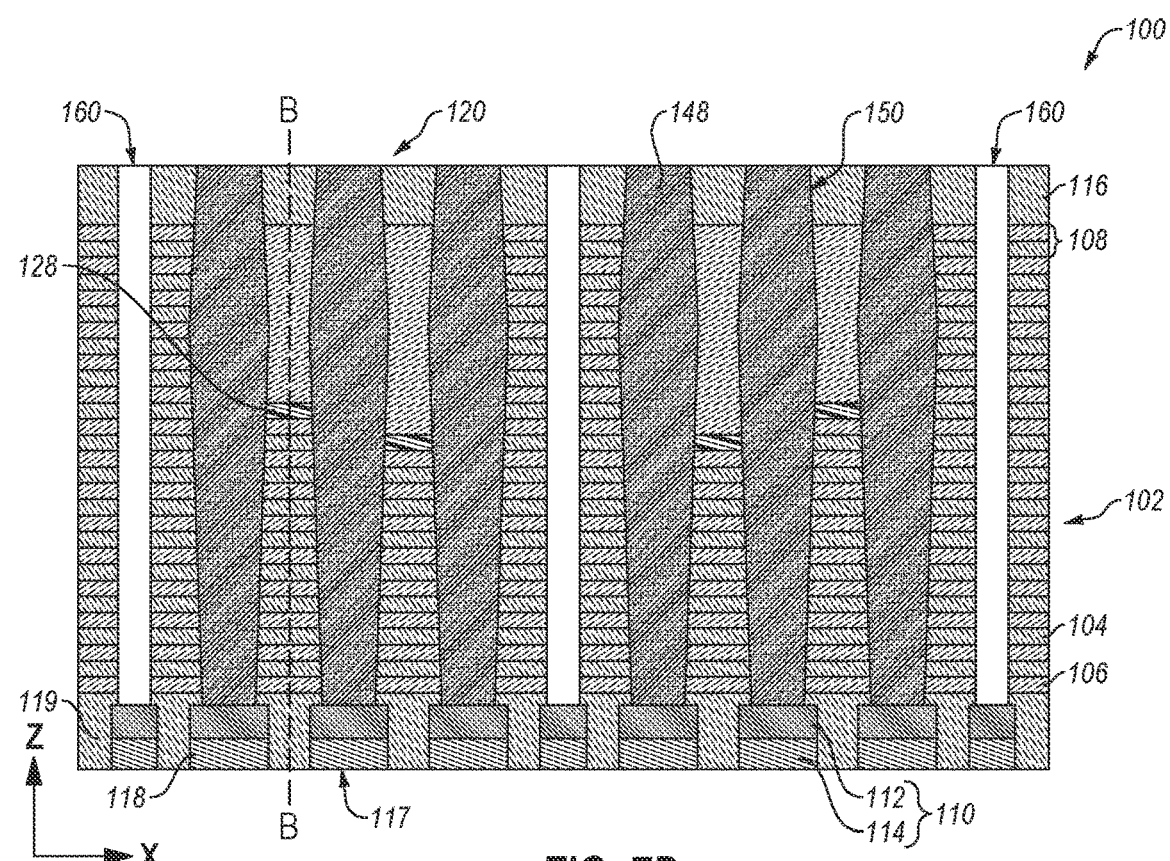
Figure 8A:
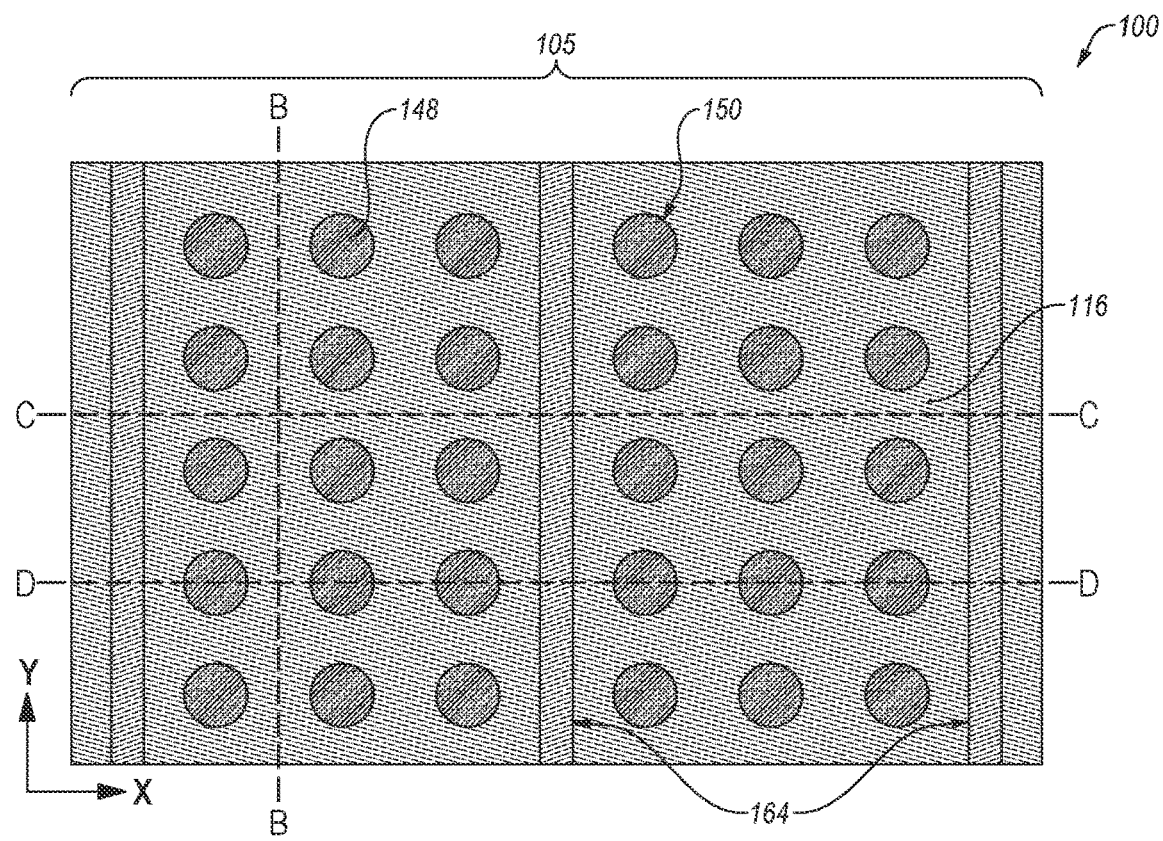
Figure 8B:
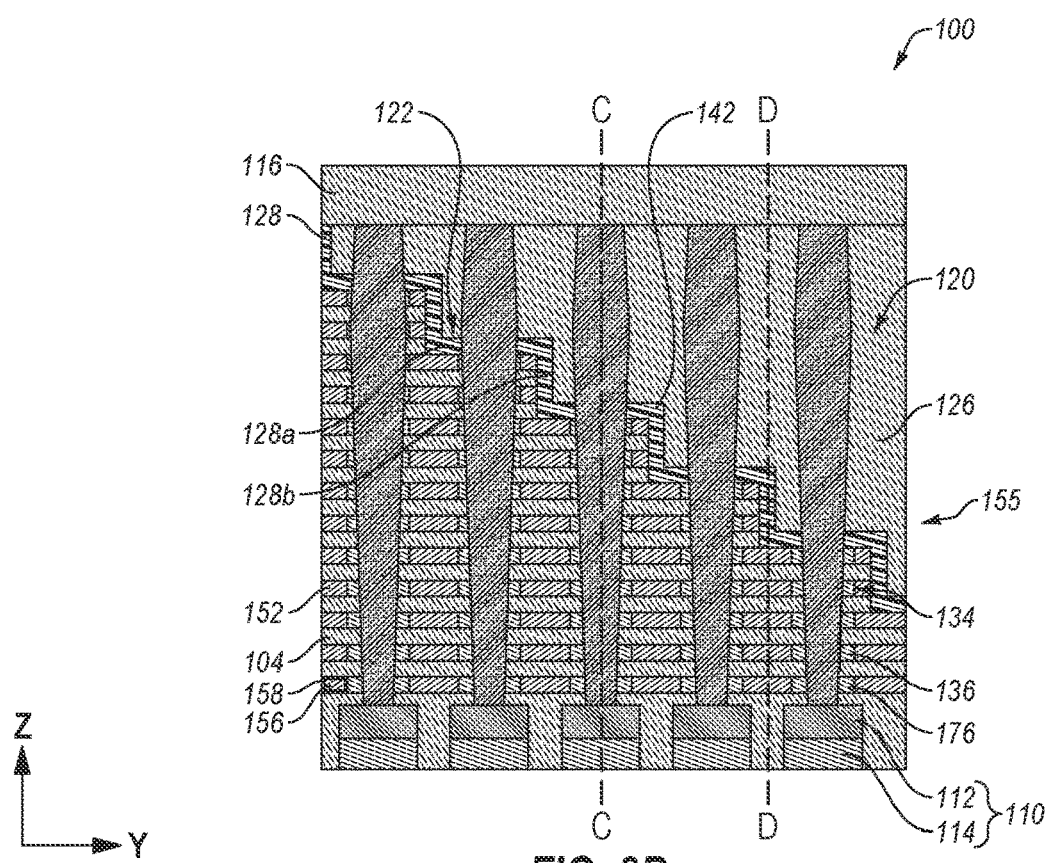
Figure 8C:
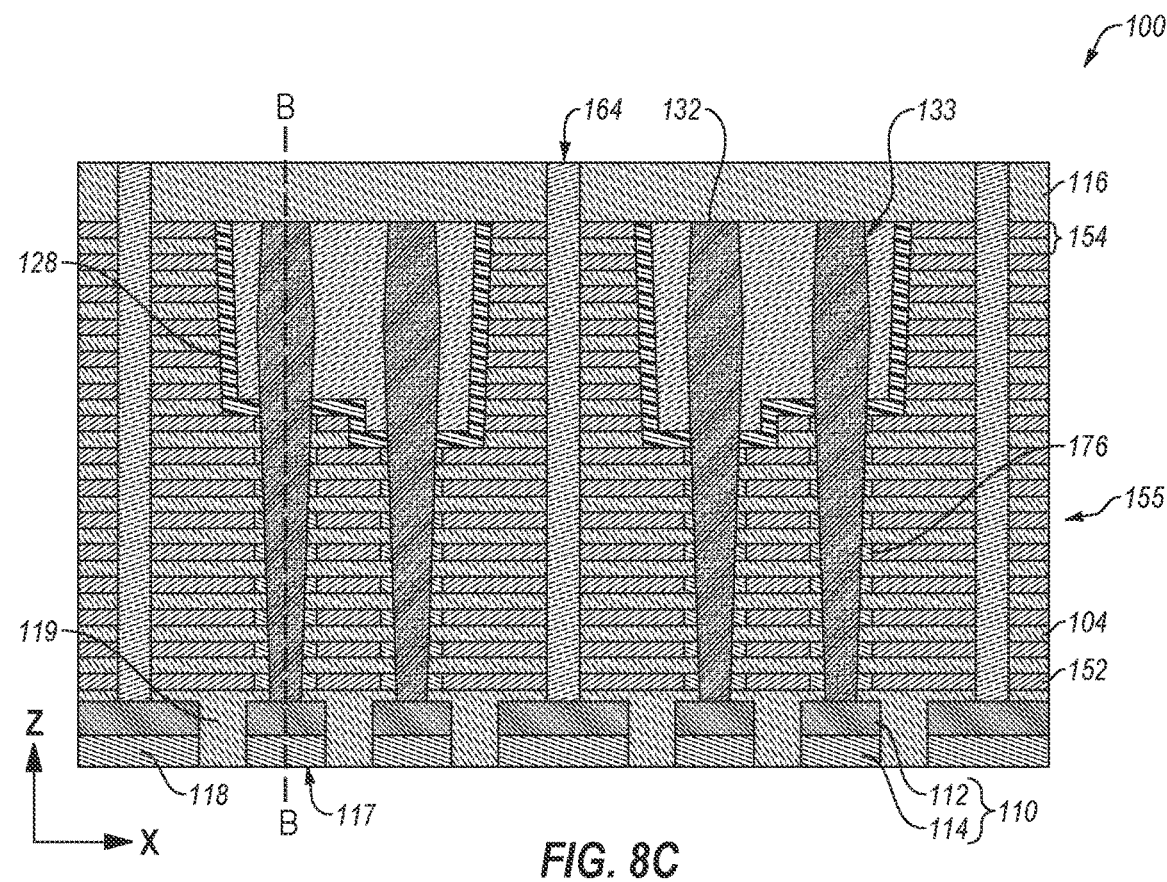
Figure 8D:
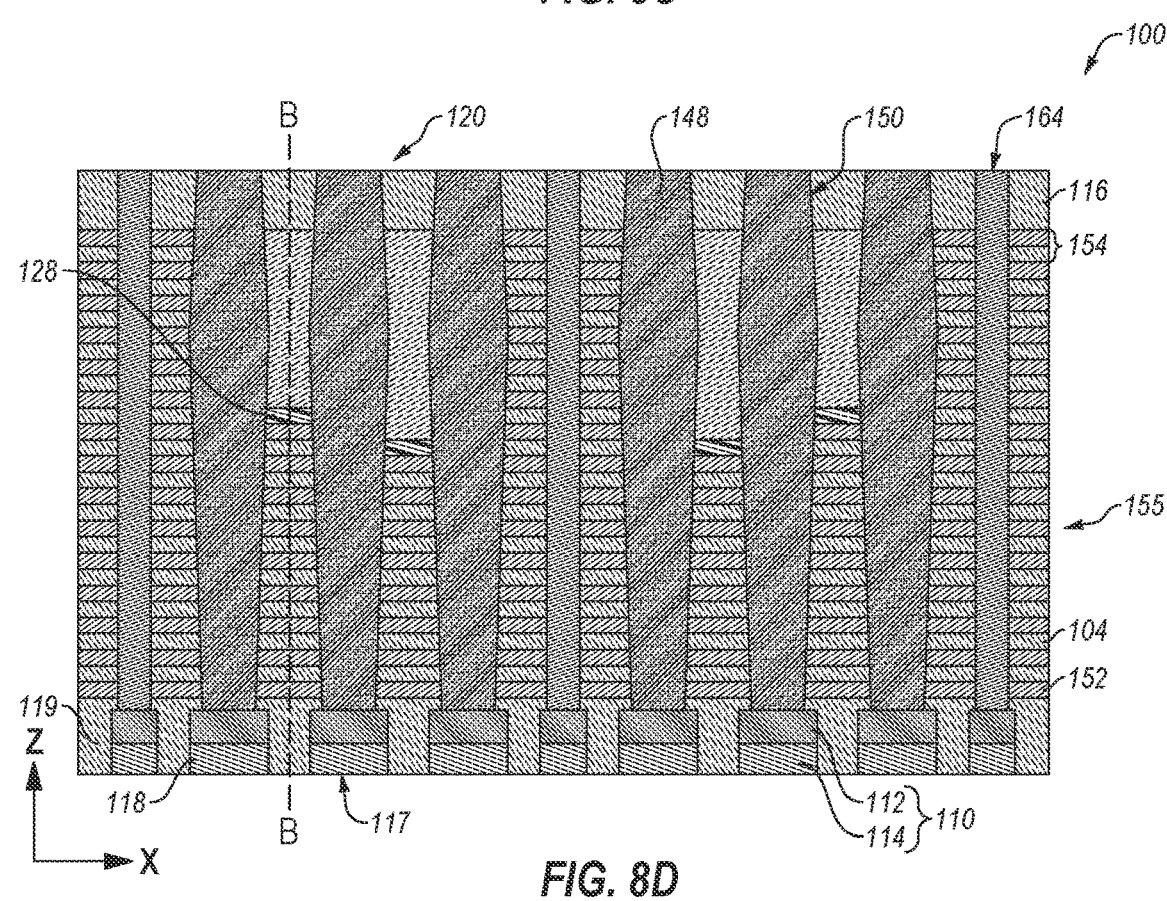

Referring next to FIG. 7A, following formation of the second sacrificial structures 150 and the third sacrificial structures 151 (FIG. 6A), the third sacrificial structures 151 may be removed (e.g., exhumed) to again form the slots 160 extending vertically through the preliminary stack structure 102 (FIGS. 7B through 7D) so as to facilitate the replacement of the additional insulative structures 106 (FIGS. 7B through 7D) with conductive structures 152 (FIGS. 8B through 8D). The reformation of the slots 160 is described in further detail below, along with additional components (e.g., structures, features) of the microelectronic device structure 100 at the processing stage depicted in FIG. 7A. FIG. 7B is a simplified, partial cross-sectional view of the microelectronic device structure 100 about the line B-B shown in FIG. 7A, FIG. 7C is a simplified, partial cross-sectional view of the microelectronic device structure 100 about the line C-C shown in FIG. 7A, and FIG. 7D is a simplified, partial cross-sectional view of the microelectronic device structure 100 about the line D-D shown in FIG. 7A. For clarity and ease of understanding of the drawings and related description, not all features depicted in one of FIGS. 7A through 7D are depicted in each of the others of FIGS. 7A through 7D.

Referring to FIGS. 7B through 7D, the second sacrificial material 148 of the third sacrificial structures 151 (FIG. 6A) may be removed to again form the slots 160 (corresponding to the size, shape, and location of the initial slots). The slots 160 may terminate within the source tier 110, such as at or within the first conductive material 112 at the processing stage depicted in FIGS. 7B through 7D. Prior to again forming the slots 160, the first sacrificial structures 133 may be covered with an additional dielectric material (e.g., an additional portion of the dielectric material 116) and/or an additional mask material configured and positioned to protect the first sacrificial material 132 of the first sacrificial structures 133 from being removed (e.g., exhumed) during the material removal processes of the second sacrificial material 148 of the third sacrificial structures 151, as shown in FIG. 7B. In some embodiments, the second sacrificial structures 150 are also covered with an additional dielectric material (e.g., an additional portion of the dielectric material 116) and/or an additional mask material configured and positioned to protect the second sacrificial material 148 of the second sacrificial structures 150 from being removed (e.g., exhumed) during the material removal processes of the second sacrificial material 148 of the third sacrificial structures 151. Accordingly, portions of the second sacrificial material 148 of the third sacrificial structures 151 may be removed without removing additional portions of the second sacrificial material 148 of the second sacrificial structures 150.

The slots 160 may vertically extend (e.g., in the Z-direction) though the preliminary stack structure 102 at the process stage of FIGS. 7A through 7D, such as through the dielectric material 116, the second insulative liner material 128, the first insulative liner material 127 (FIG. 2B), and the tiers 108 of the insulative structures 104 and the additional insulative structures 106. The slots 160 may extend to the source tier 110, such as to the first conductive material 112. In additional embodiments, the slots 160 remain open prior to the process stage of FIGS. 7A through 7D, such as when the second sacrificial structures 150 are formed within the second openings 144 (FIG. 5A) without forming the third sacrificial structures 151 within the slots 160 at the process stage of FIGS. 6A through 6D.

Referring next to FIG. 8A, the additional insulative structures 106 (FIG. 7B) may be at least partially (e.g., substantially) replaced with the conductive structures 152 comprising at least one conductive material 156 to form a stack structure 155 comprising tiers 154 of the conductive structures 152 vertically interleaved with the insulative structures 104 through so-called "replacement gate" or "gate last" processing acts. The slots 160 (FIG. 7A) may then be filled with dielectric material 164. Formation of the conductive structures 152 is described in further detail below, along with additional components (e.g., structures, features) of the microelectronic device structure 100 at the processing stage depicted in FIG. 8A. FIG. 8B is a simplified, partial cross-sectional view of the microelectronic device structure 100 about the line B-B shown in FIG. 8A, FIG. 8C is a simplified, partial cross-sectional view of the microelectronic device structure 100 about the line C-C shown in FIG. 8A, and FIG. 8D is a simplified, partial cross-sectional view of the microelectronic device structure 100 about the line D-D shown in FIG. 8A. For clarity and ease of understanding of the drawings and related description, not all features depicted in one of FIGS. 8A through 8D are depicted in each of the others of FIGS. 8A through 8D.

Referring to FIGS. 8B through 8D, the additional insulative structures 106 (FIG. 7B) may be selectively removed (e.g., exhumed) through the slots 160 (FIG. 7A). Spaces between vertically neighboring (e.g., in the Z-direction) insulative structures 104 may be filled with the conductive material 156 to form the conductive structures 152 and the stack structure 155 including the tiers 154 of the insulative structures 104 and the conductive structures 152. In some embodiments, a conductive liner material 158 is formed within the spaces between the vertically neighboring insulative structures 104. In some such embodiments, the conductive structures 152 individually comprise the conductive liner material 158 in contact with the insulative structures 104 and the conductive material 156 in contact with the conductive liner material 158. The conductive liner material 158 may be vertically interposed between the conductive material 156 and an insulative structure 104. For ease of illustration and understanding, the conductive liner material 158 is illustrated within a single space between the vertically neighboring insulative structures 104 in FIG. 8B, but it will be understood that the microelectronic device structure 100 may include the conductive liner material 158 within additional (e.g., each of the) spaces between the vertically neighboring insulative structures 104. The conductive structures 152 may be located at locations corresponding to the locations of the additional insulative structures 106 removed through the slots 160.

In some embodiments, the conductive material 156 of the conductive structures 152 comprises tungsten (W). In other embodiments, the conductive material 156 of the conductive structures 152 comprises conductively doped polysilicon. For each of the conductive structures 152, the conductive material 156 thereof may be substantially homogeneous or may be substantially heterogeneous. In some embodiments, each of the conductive structures 152 is substantially homogeneous. In additional embodiments, at least one of the conductive structures 152 is substantially heterogeneous.

The conductive liner material 158 (if formed) surrounding the conductive structures 152 may be formed of and include, for example, at least one seed material from which the conductive material 156 may be formed. The conductive liner material 158 may be formed of and include, for example, one or more of at least one metal (e.g., titanium, tantalum), at least one metal nitride (e.g., tungsten nitride, titanium nitride, tantalum nitride), or at least one additional material. In some embodiments, the conductive liner material 158 comprises titanium nitride ($TiN_x$).

At least one vertically (e.g., in the Z-direction) lower conductive structure 152 of the stack structure 155 may be employed as at least one lower select gate (e.g., at least one source side select gate (SGS)) of the microelectronic device structure 100. In some embodiments, a single (e.g., only one) conductive structure 152 of a vertically lowermost tier 154 of the stack structure 155 is employed as a lower select gate (e.g., a SGS) of the microelectronic device structure 100. In addition, vertically (e.g., in the Z-direction) upper conductive structure(s) 152 of the stack structure 155 may be employed as upper select gate(s) (e.g., drain side select gate(s) (SGDs)) of the microelectronic device structure 100. In some embodiments, horizontally neighboring conductive structures 152 of a vertically uppermost tier 154 of the stack structure 155 (e.g., separated from each other by slots) are employed as upper select gates (e.g., SGDs) of the microelectronic device structure 100. In some embodiments, more than one (e.g., two, four, five, six) conductive structures 152 are employed as upper select gates (e.g., SGDs) of the microelectronic device structure 100.

The first sacrificial structures 133 and the second sacrificial structures 150 may serve as support structures during and/or after the formation of one or more components of the microelectronic device structure 100. For example, the first sacrificial structures 133 and the second sacrificial structures 150 may serve as support structures for the formation of the conductive structures 152 during replacement of the additional insulative structures 106 (FIG. 7B) to form the conductive structures 152. The first sacrificial structures 133 and the second sacrificial structures 150 may impede (e.g., prevent) tier collapse during the selective removal of the additional insulative structures 106. By forming the first sacrificial structures 133 to extend entirely through the vertical extent of the preliminary stack structure 102 (e.g., below the steps 122 of the staircase structure 120), lower portions of the first sacrificial structures 133 may provide additional support to lowermost portions of the preliminary stack structure 102, compared to conventional device structures having conductive contacts that terminate at steps of staircase structures. Further, formation of the first sacrificial structures 133 and the second sacrificial structures 150 prior to performing replacement gate processing acts may provide increased structural support within the staircase structure 120 of the staircase region 105, without undesirably increasing the overall width (e.g., horizontal footprint) of the staircase region 105.

As shown in FIG. 8B, the presence of the liner material 136 within the recessed regions 134 provides isolation regions 176 (e.g., corresponding to locations of the isolation regions 146 (FIG. 4B)) between the first sacrificial structures 133 and the conductive structures 152, such that the conductive structures 152 are remote (e.g., isolated) from the first sacrificial material 132 of the first sacrificial structures 133 by the isolation regions 176. After forming the conductive material 156 and the conductive liner material 158 of the conductive structures 152 of the stack structure 155, the slots 160 (FIG. 7A) may be filled with the dielectric material 164, as shown in FIGS. 8C and 8D.

The dielectric material 164 may be formed of and include at least one insulative material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). A material composition of the dielectric material 164 may be substantially the same as a material composition of one or more of the dielectric material 116 and the insulative structures 104 of the stack structure 155, or the material composition of the dielectric material 164 may be different than the material composition of the dielectric material 116 and insulative structures 104. In some embodiments, the dielectric material 164 is formed of and includes silicon dioxide.

Figure 9A:
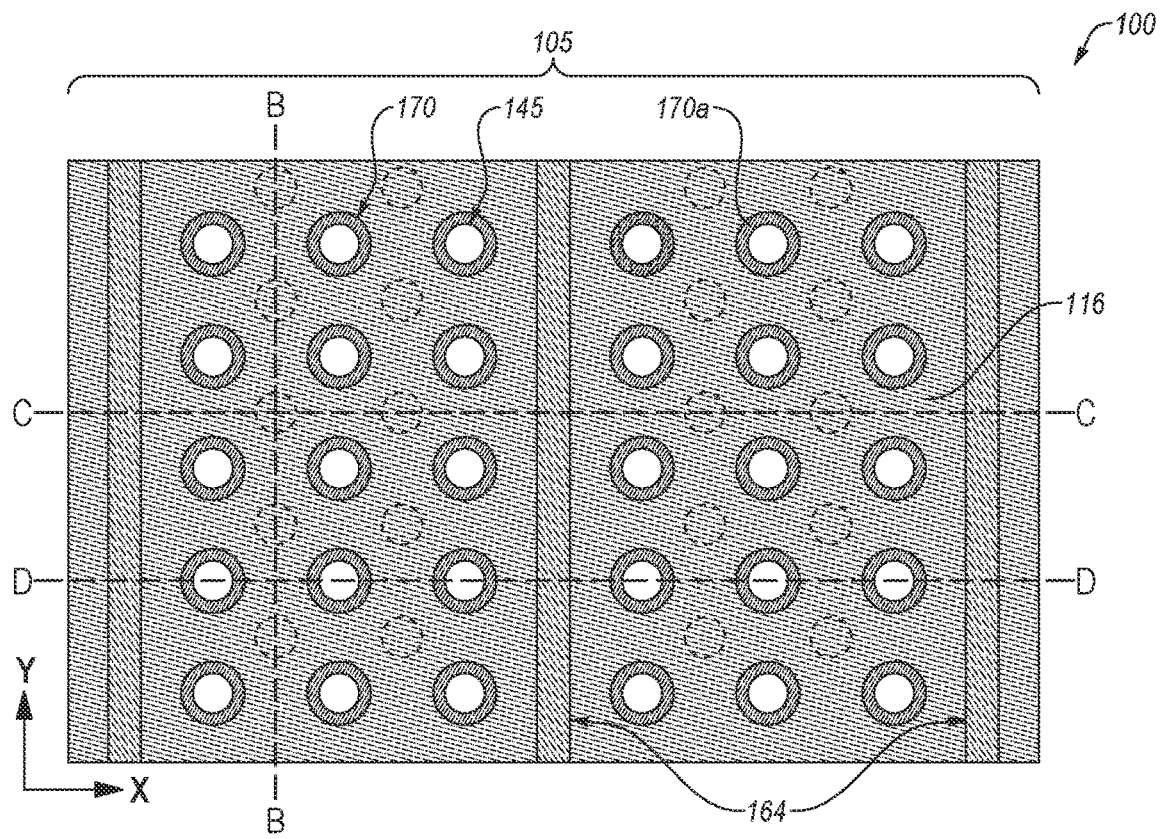
Figure 9B:
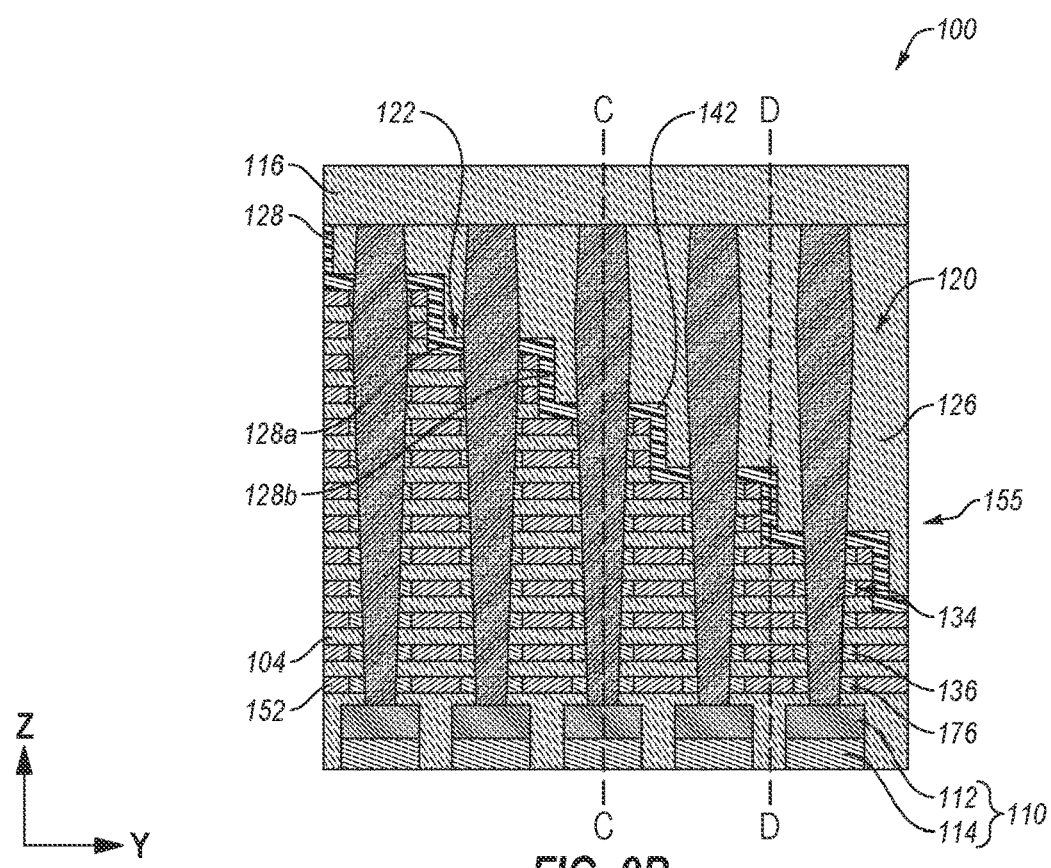
Figure 9C:
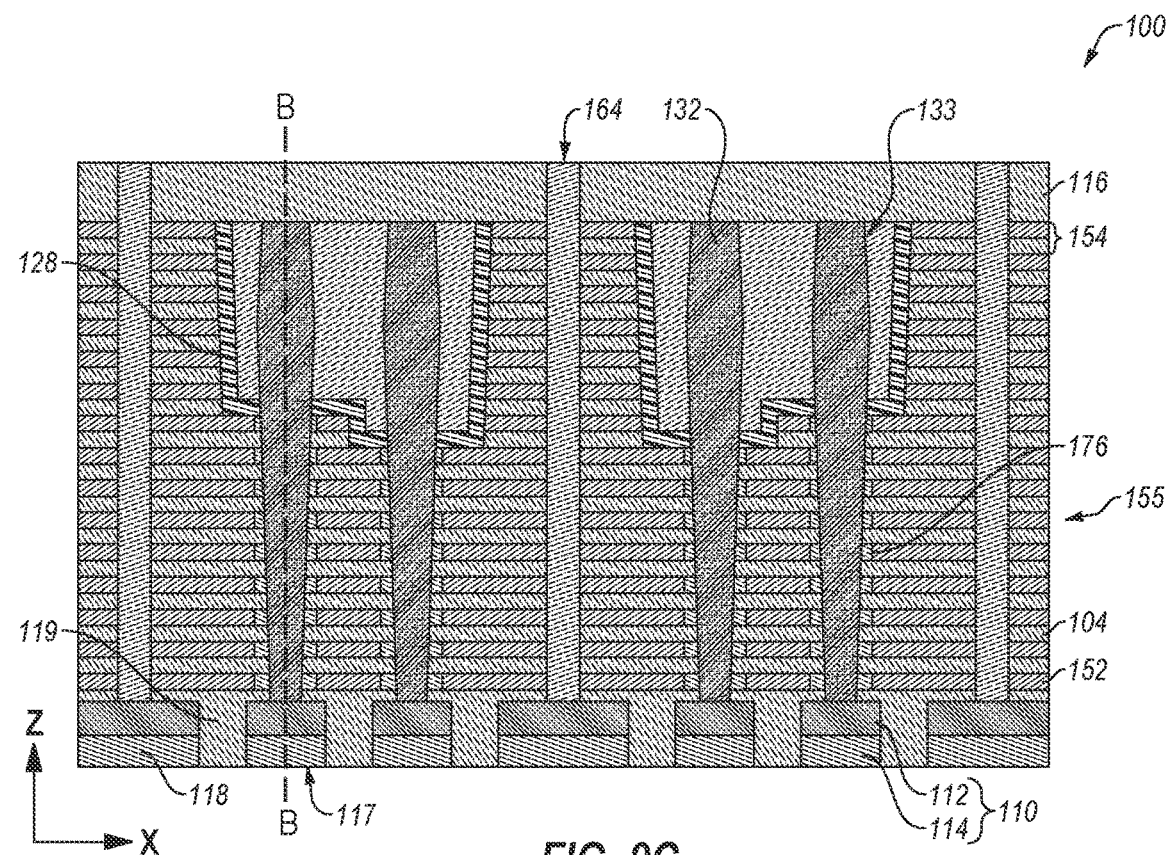
Figure 9D:
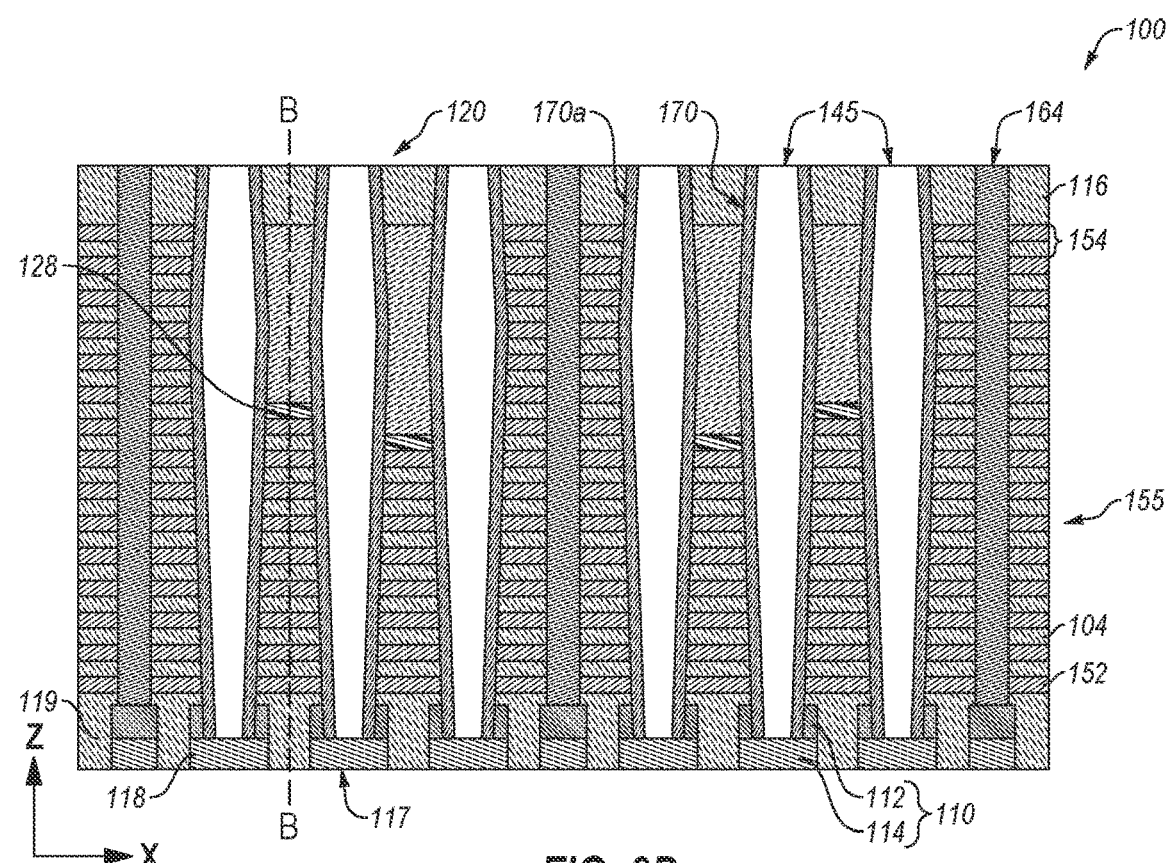

Referring next to FIG. 9A, following formation of the dielectric material 164 within the slots 160 (FIG. 7A), the second sacrificial material 148 (FIG. 8D) of the second sacrificial structures 150 (FIG. 8D) may be removed (e.g., exhumed) to form third openings 145 within horizontal areas of the second openings 144 (FIGS. 5A and 5D) and extending vertically through the stack structure 155 (FIG. 9B) to the source tier 110 (FIG. 9B). A liner material 170a of support structures 170 (e.g., pillar structures) (FIG. 9D) may be formed in the third openings 145. Formation of the third openings 145 and the liner material 170a of support structures 170 is described in further detail below, along with additional components (e.g., structures, features) of the microelectronic device structure 100 at the processing stage depicted in FIG. 9A. FIG. 9B is a simplified, partial cross-sectional view of the microelectronic device structure 100 about the line B-B shown in FIG. 9A, FIG. 9C is a simplified, partial cross-sectional view of the microelectronic device structure 100 about the line C-C shown in FIG. 9A, and FIG. 9D is a simplified, partial cross-sectional view of the microelectronic device structure 100 about the line D-D shown in FIG. 9A. For clarity and ease of understanding of the drawings and related description, not all features depicted in one of FIGS. 9A through 9D are depicted in each of the others of FIGS. 9A through 9D.

Referring to FIGS. 9B through 9D, to form the third openings 145, the second sacrificial material 148 (FIG. 8D) of the second sacrificial structures 150 (FIG. 8D) and portions of the first conductive material 112 may be removed. The third openings 145 may extend through the first conductive material 112 and may terminate at or within the second conductive material 114. In some such embodiments, a so-called "punch through" etch is then performed to remove portions of the first conductive material 112 and expose the underlying portions of the second conductive material 114 or, alternatively, remove portions of an insulative material overlying the first conductive material 112 and expose the underlying portions of the first conductive material 112.

Prior to forming the third openings 145, each of the dielectric fill material 126 and the first sacrificial structures 133 may be covered with an additional dielectric material (e.g., an additional portion of the dielectric material 116) and/or an additional mask material configured and positioned to protect the dielectric fill material 126 and the first sacrificial material 132 of the first sacrificial structures 133 from being removed (e.g., exhumed) during the material removal processes of the second sacrificial material 148 of the second sacrificial structures 150. Accordingly, portions of the second sacrificial material 148 of the second sacrificial structures 150 may be removed without removing portions of the first sacrificial material 132 of the first sacrificial structures 133 and without removing portions of the dielectric material 164 within the slots 160 (FIG. 7A). Since the second sacrificial material 148 of the second sacrificial structures 150 exhibits etch selectivity relative to the insulative structures 104 and the conductive structures 152 of the tiers 154 of the stack structure 155, portions of the second sacrificial material 148 of the second sacrificial structures 150 may also be removed without removing portions of the insulative structures 104 and the conductive structures 152.

As shown in FIG. 9D, the liner material 170a of the support structures 170 may be continuous along a vertical dimension (e.g., a vertical height) of the stack structure 155. The liner material 170a may be formed of and include insulative material, such as a dielectric oxide material. For example, the material of the liner material 170a may include a silicon oxide material (e.g., relatively high quality silicon oxide material, such as an ALD SiO$_x$). The liner material 170a may be formed by conventional techniques, such as by CVD or ALD. In some embodiments, the liner material 170a is formed by plasma enhanced ALD (PEALD).

The liner material 170a of the support structures 170 may be in contact with each of the dielectric material 116, the dielectric fill material 126, the second insulative liner material 128, the first insulative liner material 127 (FIG. 2B), as well as the insulative structures 104 and the conductive structures 152 of the stack structure 155, and the first conductive material 112 of the source tier 110. Accordingly, the liner material 170a may be formed to extend from the upper surface of the dielectric material 116 to the source tier 110 underlying the stack structure 155. The liner material 170a of the support structures 170 may terminate at or within the second conductive material 114 of the source tier 110. Alternatively, the liner material 170a may terminate at or within the first conductive material 112.

In some embodiments, each block structure 162 (FIG. 5A) includes three (3) columns of the support structures 170 located between horizontally (e.g., in the X-direction) neighboring portions of the dielectric material 164 within the slots 160 (FIG. 7A). However, the disclosure is not so limited and, in other embodiments, each block structure 162 includes fewer (e.g., two, one) columns of the support structures 170; or each block structure 162 includes more (e.g., four, five, six, seven, eight) columns of the support structures 170.

Figure 10A:
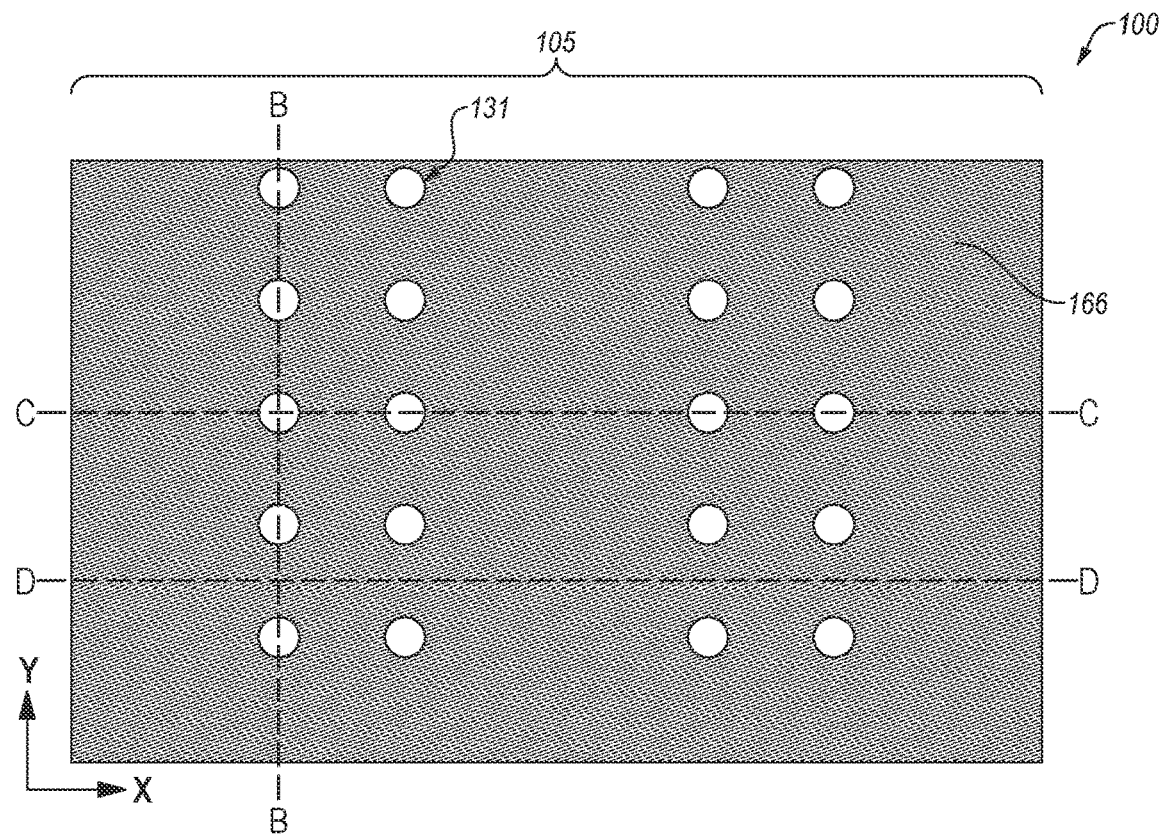
Figure 10B:
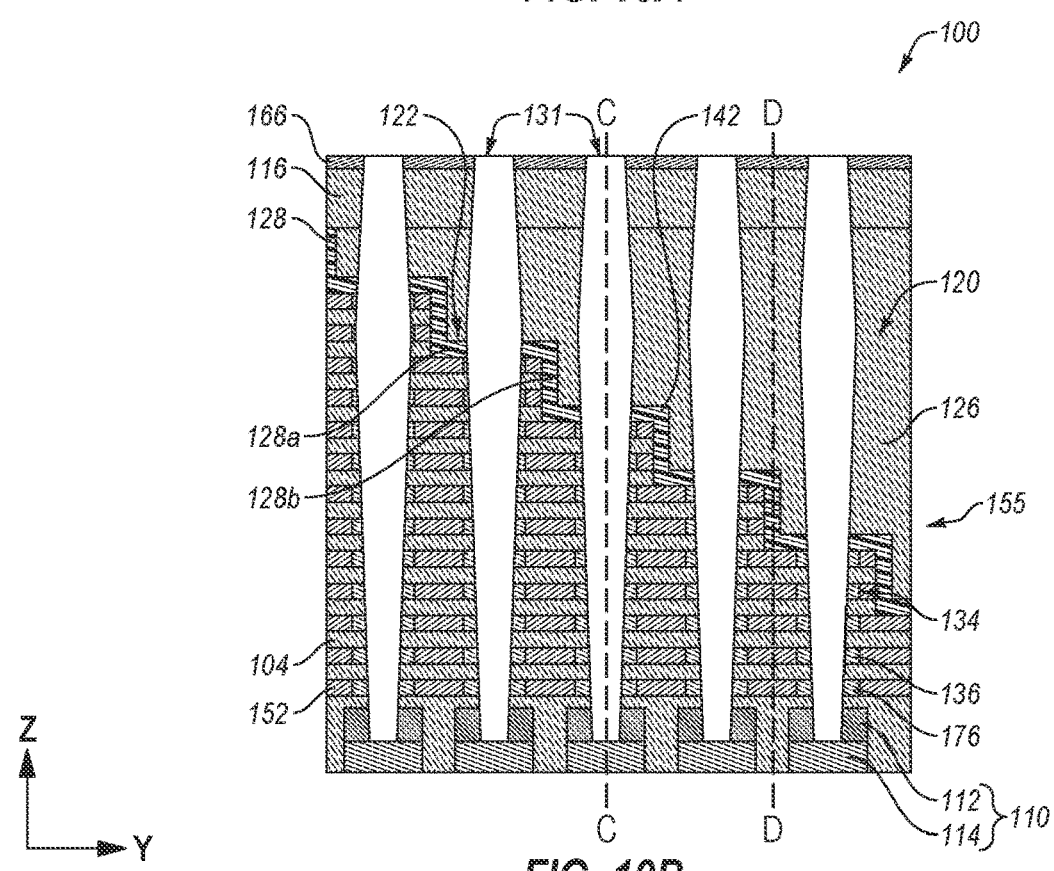
Figure 10C:
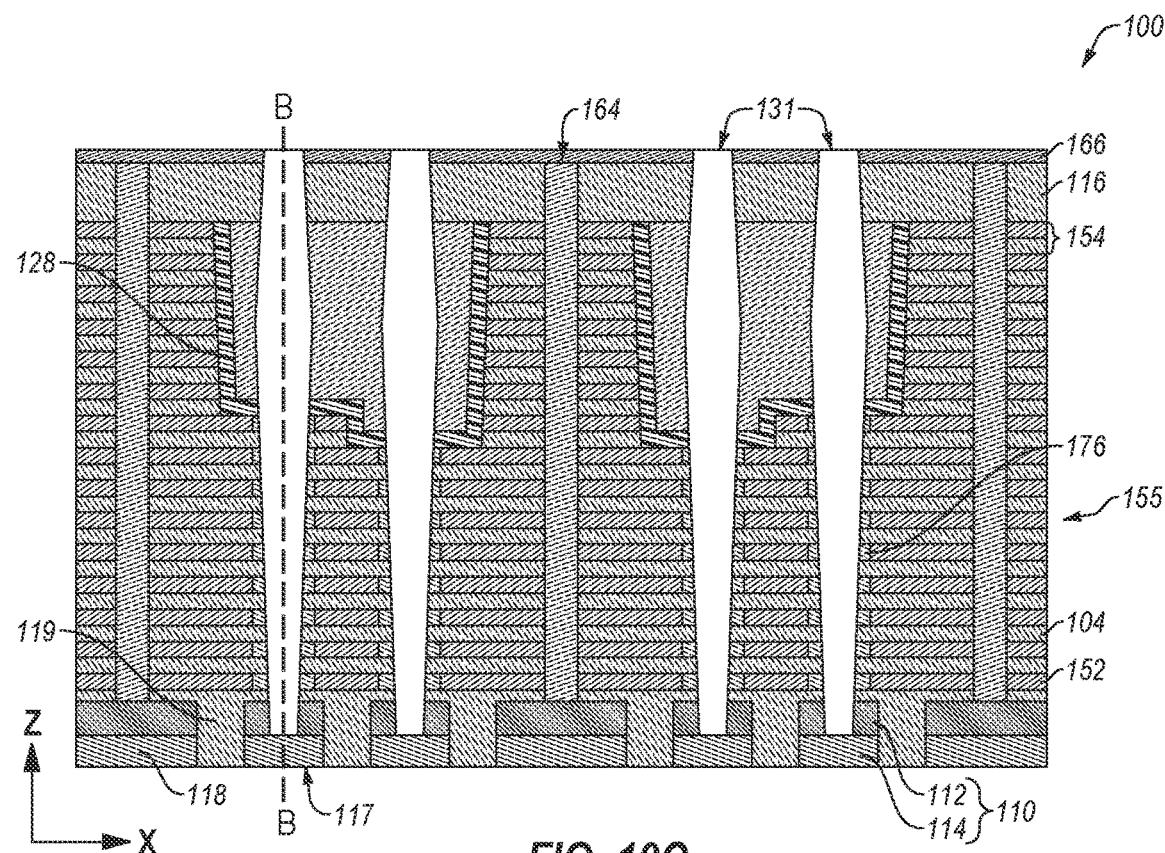
Figure 10D:
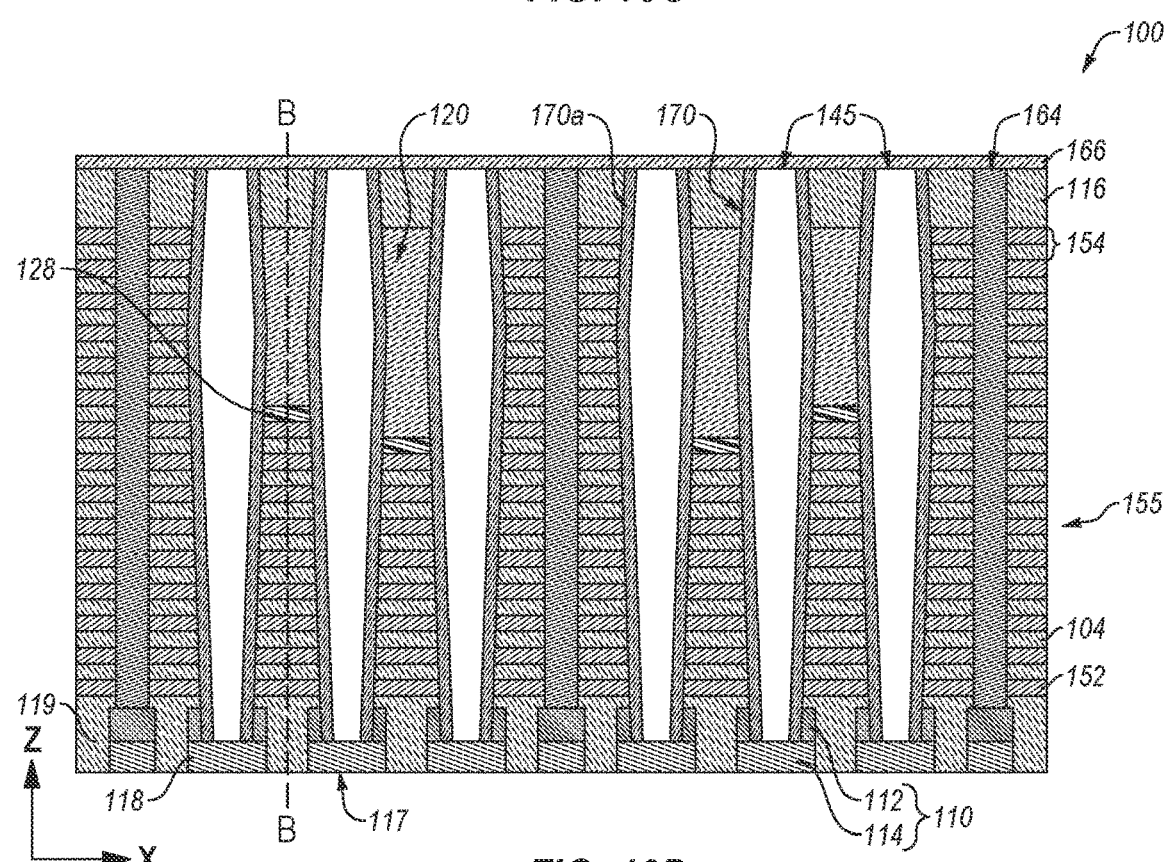

Referring next to FIG. 10A, following formation of the liner material 170a of the support structures 170 (FIG. 10D) within the third openings 145 (FIG. 10D), a mask material 166 may be formed over the microelectronic device structure 100. The first sacrificial material 132 (FIG. 9B) of the first sacrificial structures 133 (FIG. 9B) may then be removed (e.g., exhumed) to form the fourth openings 131 within horizontal areas of the first openings 130 (FIGS. 3A through 3C) and extending vertically through the stack structure 155 (FIG. 10B) to the source tier 110 (FIG. 10B). Formation of the mask material 166 and the fourth openings 131 is described in further detail below, along with additional components (e.g., structures, features) of the microelectronic device structure 100 at the processing stage depicted in FIG. 10A. FIG. 10B is a simplified, partial cross-sectional view of the microelectronic device structure 100 about the line B-B shown in FIG. 10A, FIG. 10C is a simplified, partial cross-sectional view of the microelectronic device structure 100 about the line C-C shown in FIG. 10A, and FIG. 10D is a simplified, partial cross-sectional view of the microelectronic device structure 100 about the line D-D shown in FIG. 10A. For clarity and ease of understanding of the drawings and related description, not all features depicted in one of FIGS. 10A through 10D are depicted in each of the others of FIGS. 10A through 10D.

Referring to FIGS. 10B through 10D, to form the fourth openings 131, the first sacrificial material 132 (FIG. 9B) of the first sacrificial structures 133 (FIG. 9B) and portions of the first conductive material 112 may be removed. The fourth openings 131 may extend through the first conductive material 112 and may terminate at or within the second conductive material 114 at the process stage of FIGS. 10A through 10D. In some embodiments, portions of the first conductive material 112 are removed by so-called punch through etch processes to expose the underlying portions of the second conductive material 114 or, alternatively, portions of an insulative material overlying the first conductive material 112 are removed to expose the underlying portions of the first conductive material 112.

Prior to forming the fourth openings 131, each of the dielectric material 116, the liner material 170a of the support structures 170, and the dielectric material 164 may be covered with the mask material 166 configured and positioned to protect the dielectric material 116, the liner material 170a of the support structures 170, and the dielectric material 164 from being removed (e.g., exhumed) during the material removal processes of the first sacrificial material 132 (FIG. 9B) of the first sacrificial structures 133 (FIG. 9B). Accordingly, portions of the first sacrificial material 132 of the first sacrificial structures 133 may be removed without removing portions of the dielectric material 116, the liner material 170a of the support structures 170, and the dielectric material 164. Since the first sacrificial material 132 of the first sacrificial structures 133 exhibits etch selectivity relative to the insulative structures 104 of the tiers 154 of the stack structure 155, as well as the liner material 136 within the recessed regions 134, portions of the first sacrificial material 132 of the first sacrificial structures 133 may also be removed without removing portions of the insulative structures 104 and the liner material 136.

The mask material 166 may be formed of and include one or more of amorphous carbon, silicon, a silicon oxide, a silicon nitride, a silicon oxycarbide, aluminum oxide, and a silicon oxynitride. In some embodiments, the mask material 166 is formed of and includes at least one dielectric oxide material (e.g., one or more of silicon dioxide and aluminum oxide). In other embodiments, the mask material 166 is formed of and includes silicon nitride. The mask material 166 may be homogeneous (e.g., may include a single material), or may be heterogeneous (e.g., may include a stack including at least two different materials). The mask material 166 may be formed using conventional processes and patterned using conventional patterning and material removal processes, such as conventional photolithographic exposure processes, conventional development processes, conventional etching processes and conventional processing equipment, which are not described in detail herein.

Figure 11A:
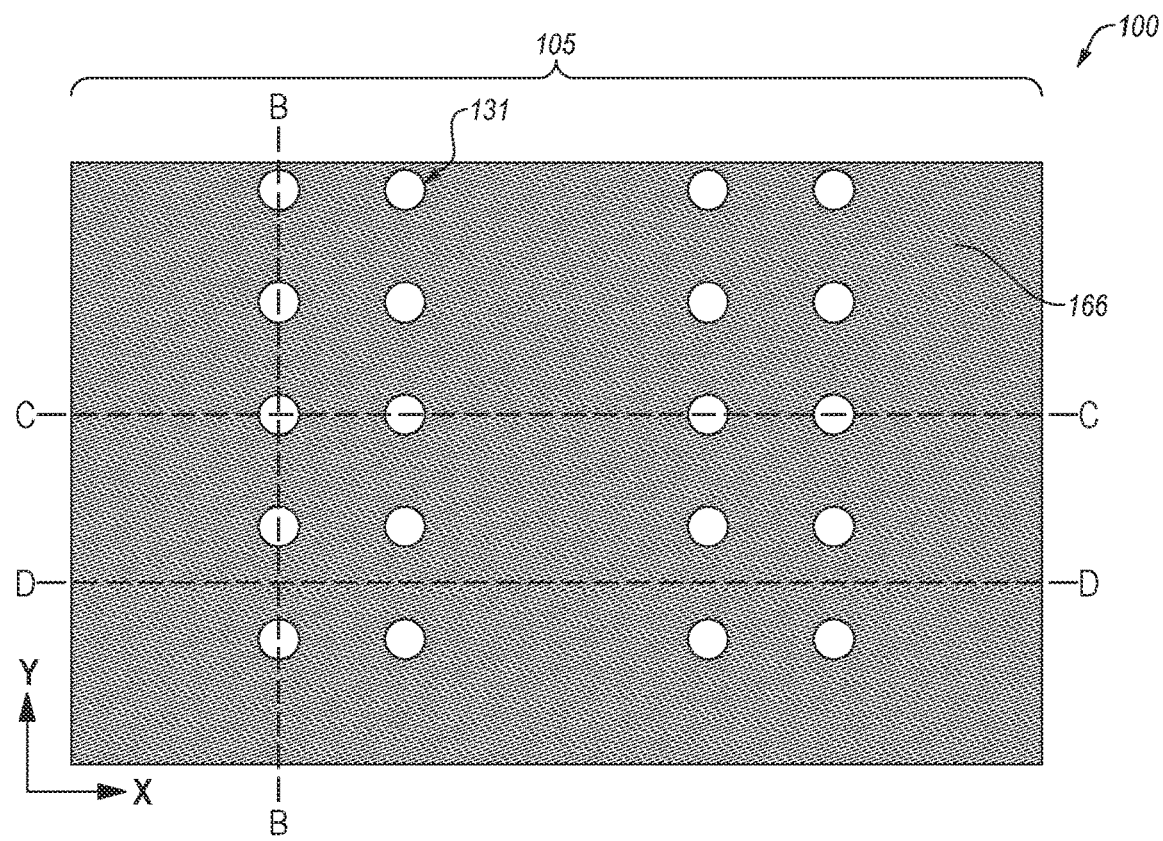
Figure 11B:
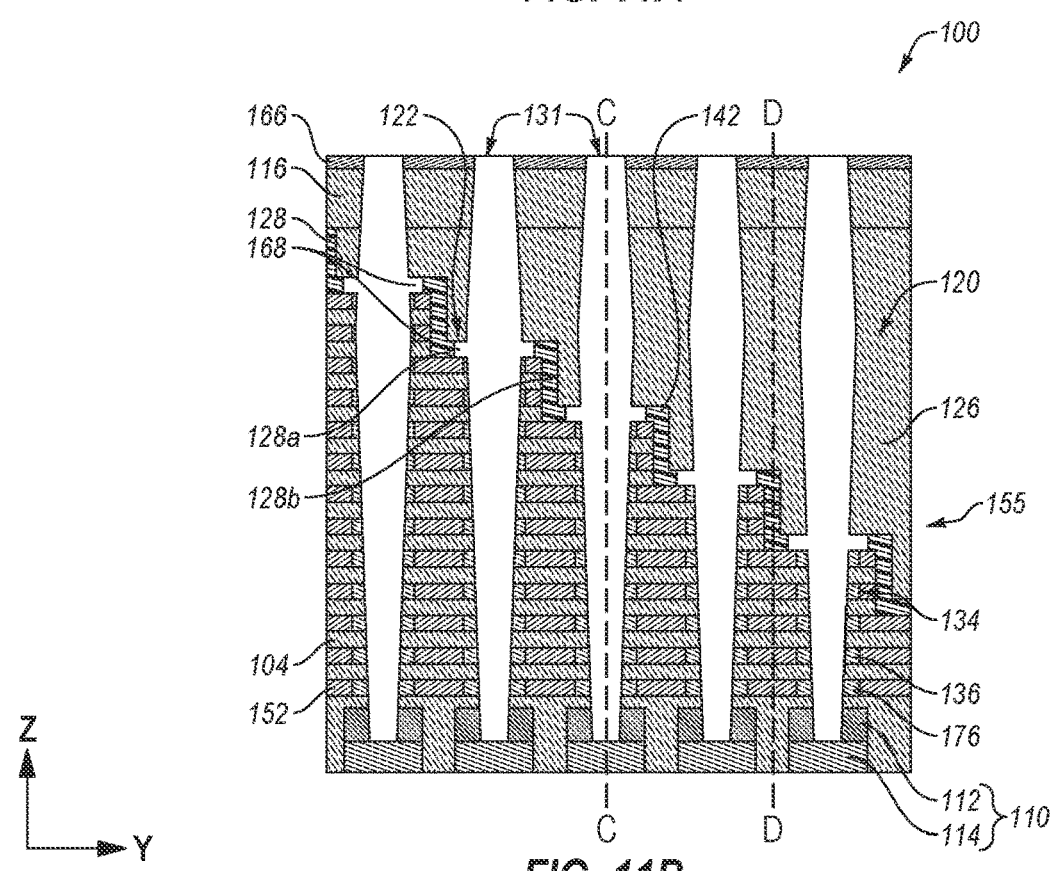
Figure 11C:
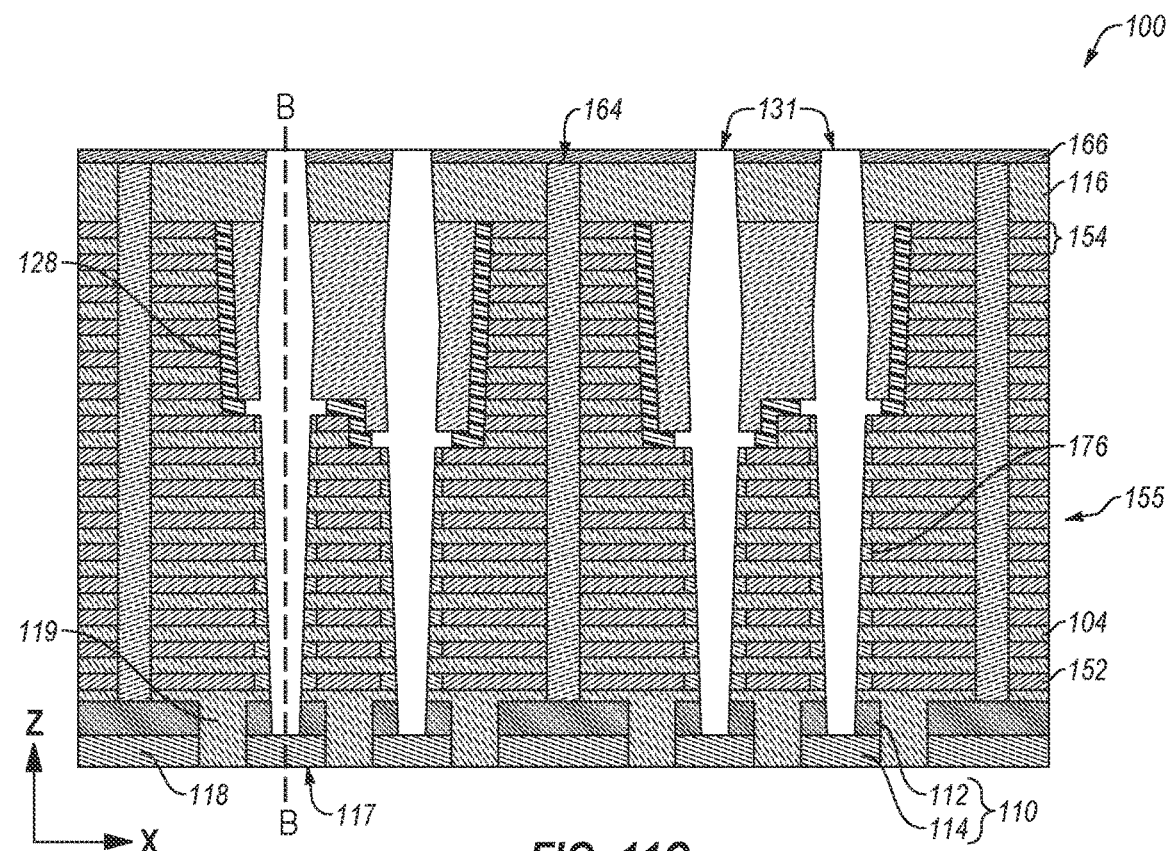
Figure 11D:
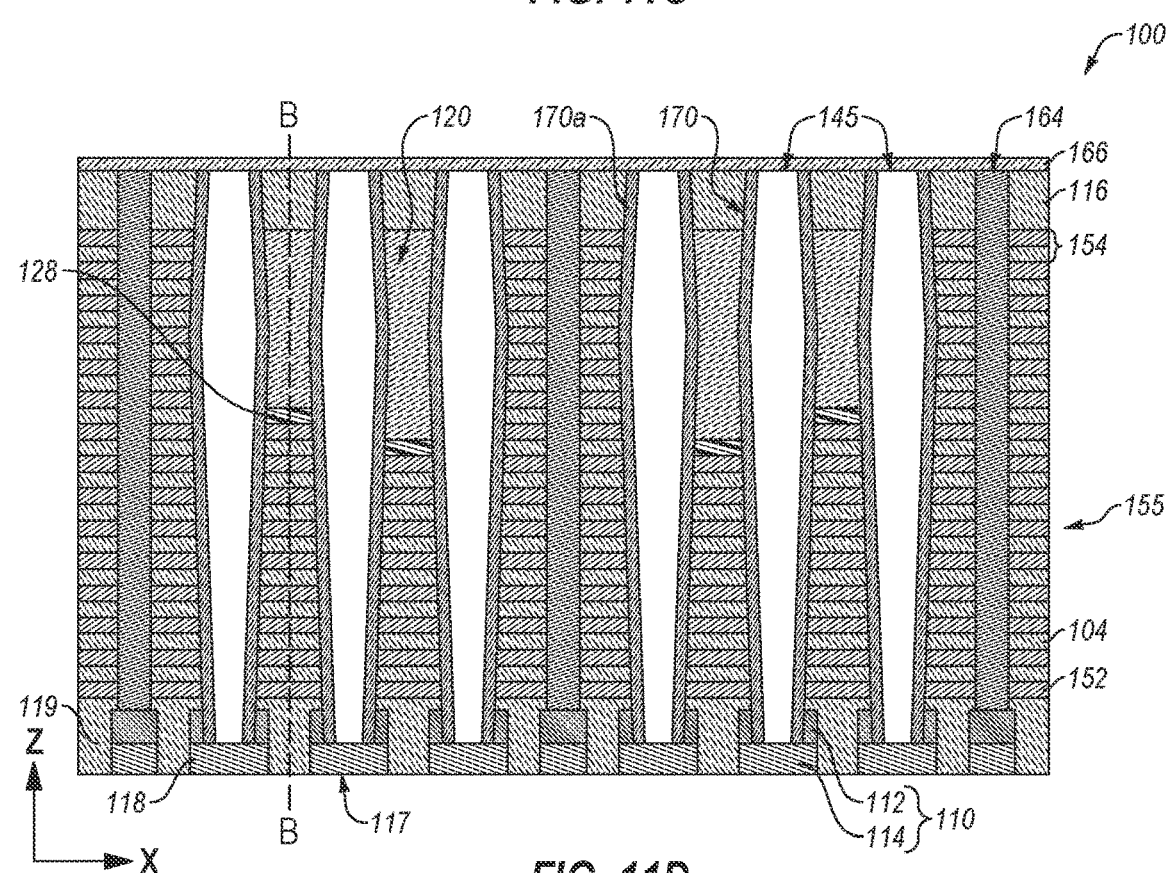

Referring next to FIG. 11A, after forming the fourth openings 131, portions of the upper portions 128a of the second insulative liner material 128 (e.g., the sacrificial portion 140 thereof (FIG. 4B)) may be selectively removed (e.g., exhumed) to form lateral openings 168 (e.g., lateral recesses) in communication with the fourth openings 131. Formation of the lateral openings 168 is described in further detail below, along with additional components (e.g., structures, features) of the microelectronic device structure 100 at the processing stage depicted in FIG. 11A. FIG. 11B is a simplified, partial cross-sectional view of the microelectronic device structure 100 about the line B-B shown in FIG. 11A, FIG. 11C is a simplified, partial cross-sectional view of the microelectronic device structure 100 about the line C-C shown in FIG. 11A, and FIG. 11D is a simplified, partial cross-sectional view of the microelectronic device structure 100 about the line D-D shown in FIG. 11A. For clarity and ease of understanding of the drawings and related description, not all features depicted in one of FIGS. 11A through 11D are depicted in each of the others of FIGS. 11A through 11D.

Referring to FIGS. 11B through 11D, portions of the second insulative liner material 128 overlying the steps 122 of the staircase structure 120 may be recessed to form the lateral openings 168. Recessing the second insulative liner material 128 increases the horizontal width of the fourth openings 131 in the stack structure 155, forming the lateral openings 168 adjacent to the second insulative liner material 128. For example, additional portions of the sacrificial portion 140 (FIG. 4B) of the individual upper portions 128a of the second insulative liner material 128 may be selectively removed relative to the liner material 136 within the recessed regions 134, to recess the second insulative liner material 128 a lateral distance. Portions of the first insulative liner material 127 (FIG. 2B), if present, may or may not be removed during formation of the lateral openings 168.

In some embodiments, the sacrificial portion 140 (FIG. 4B) of the individual upper portions 128a of the second insulative liner material 128 is removed by exposing the second insulative liner material 128 to one or more etchants, such as wet etchants, through the first openings 130. The wet etchants may include one or more of phosphoric acid, acetic acid, nitric acid, hydrochloric acid, aqua regia, or hydrogen peroxide. In some embodiments, the sacrificial portion 140 may be removed by a phosphoric acid/acetic acid/nitric acid (PAN) etch chemistry. However, the disclosure is not so limited and the sacrificial portion 140 of the individual upper portions 128a of the second insulative liner material 128 may be removed with other etchants and/or material removal processes (e.g., vapor phase removal processes, atomic layer removal processes). For example, the sacrificial portion 140 may be removed by performing a sequence of self-limiting processes of an atomic layer removal process to modify a surface of a material (e.g., the second insulative liner material 128), followed by selective removal of the modified surface material. In additional embodiments, the sacrificial portion 140 is removed by a plasma etching process (e.g., an inductively coupled plasma (ICP) etching process) comprising one or more of hydrogen fluoride (HF), nitrogen trifluoride ($NF_3$), sulfur hexafluoride ($SF_6$), carbon tetrafluoride ($CF_4$), or another material. The second insulative liner material 128 may, optionally, be exposed to hydrogen ($H_2$), nitrogen ($N_2$), oxygen ($O_2$), argon (Ar), or a combination thereof. The sacrificial portion 140 may, alternatively, be removed by exposure to one or more dry etchants.

Forming the lateral openings 168 shortens the individual upper portions 128a of the second insulative liner material 128, and the remaining portion 142 thereof laterally surrounding the lateral openings 168. The sacrificial portion 140 (FIG. 4B) of the individual upper portions 128a of the second insulative liner material 128 vertically adjacent (e.g., underlying) the dielectric fill material 126 and laterally surrounding the first openings 130 may be locations designated for the lateral openings 168. Accordingly, the lateral openings 168 are defined in at least one horizontal direction (e.g., the X-direction, the Y-direction) by the remaining portion 142 of the individual upper portions 128a of the second insulative liner material 128, and the lateral openings 168 are defined in the vertical direction (e.g., the Z-direction) by the dielectric fill material 126 and the liner material 136 within the recessed regions 134, as well as portions of the conductive structures 152. By controlling the amount of material removal that occurs, the lateral openings 168 may extend into a portion of the second insulative liner material 128 overlying the steps 122, enabling subsequent formation of the strapping structures 174 (FIG. 12B) to be formed adjacent to and extending laterally from the conductive contacts 172 (FIG. 12B) subsequently formed within the first openings 130, as described in further detail below.

Referring next to FIG. 12A, after forming the lateral openings 168 (FIG. 11B), the mask material 166 may be removed to expose each of the fourth openings 131 (FIG. 11B) and the third openings 145 (FIG. 11D). Thereafter, the strapping structures 174 (FIGS. 12B and 12C) may be formed within the lateral openings 168, and the conductive contacts 172 (FIGS. 12B and 12C) may be formed within the fourth openings 131. In addition, a fill material 170b (e.g., a conductive material, an insulative material) of the support structures 170 (FIG. 12D) may be formed adjacent to the liner material 170a within the third openings 145. The conductive contacts 172, the strapping structures 174, and the support structures 170 are described in further detail below, along with additional components (e.g., structures, features) of the microelectronic device structure 100 at the processing stage depicted in FIG. 12A. FIG. 12B is a simplified, partial cross-sectional view of the microelectronic device structure 100 about the line B-B shown in FIG. 12A, FIG. 12C is a simplified, partial cross-sectional view of the microelectronic device structure 100 about the line C-C shown in FIG. 12A, and FIG. 12D is a simplified, partial cross-sectional view of the microelectronic device structure 100 about the line D-D shown in FIG. 12A. For clarity and ease of understanding of the drawings and related description, not all features depicted in one of FIGS. 12A through 12D are depicted in each of the others of FIGS. 12A through 12D.

Referring to FIGS. 12B through 12D, a conductive material of the conductive contacts 172 may substantially fill the fourth openings 131 (FIG. 11B) and be in contact with each of the dielectric material 116, the dielectric fill material 126, the first insulative liner material 127 (FIG. 2B), the liner material 136 within the recessed regions 134, and the insulative structures 104 of the stack structure 155, as well as the first conductive material 112 and the second conductive material 114 of the source tier 110. Accordingly, the conductive contacts 172 may be formed to extend from the upper surface of the dielectric material 116 to the source tier 110 underlying the stack structure 155. The conductive contacts 172 may terminate at or within the second conductive material 114 of the source tier 110. Alternatively, the conductive contacts 172 may terminate at or within the first conductive material 112. In such embodiments, the conductive contacts 172 are formed to be self-aligned with the underlying conductive materials (e.g., the first conductive material 112) using a so-called "assisted self-alignment" process.

Once formed, each of the conductive contacts 172 may vertically extend completely through the stack structure 155 without terminating on the steps 122 of the staircase structure 120, as shown in FIGS. 12B and 12C. For example, conductive contacts 172 may vertically extend (e.g., in the Z-direction) from a vertically uppermost boundary of the dielectric fill material 126 (e.g., at an elevational level of a vertically uppermost tier 108 of the stack structure 155) to or beyond a vertically uppermost boundary of the second conductive material 114 of the source tier 110. In some embodiments, the staircase structure 120 is substantially free of conductive contacts formed to terminate on the steps 122 thereof.

During formation of the conductive contacts 172, the conductive material thereof may also substantially fill the lateral openings 168 (FIG. 11B) to form the strapping structures 174. The conductive contacts 172 may be integral and continuous with the strapping structures 174. The strapping structures 174 may horizontally project outward from the conductive contacts 172. The conductive material of the strapping structures 174 may be in contact with each of the second insulative liner material 128 (e.g., the remaining portion 142 of the upper portions 128a thereof), the liner material 136 within the recessed regions 134, and one or more of the conductive material 156 and the conductive liner material 158 of the conductive structures 152 of the stack structure 155. After forming the conductive contacts 172 and the strapping structures 174, the microelectronic device structure 100 may be exposed to a chemical mechanical planarization (CMP) process to remove sacrificial material outside of the first openings 130 (FIG. 11B).

The conductive contacts 172 and the strapping structures 174 may individually be formed of and include at least one conductive material. By way of non-limiting example, the conductive contacts 172 and the strapping structures 174 may be formed of and include one or more of polysilicon, tungsten, titanium, titanium nitride, or another material. In some embodiments, the conductive material comprises polysilicon. In some such embodiments, the conductive material may be doped with one or more dopants, such as with at least one N-type dopant (e.g., one or more of arsenic, phosphorous, antimony, and bismuth) or at least one P-type dopant (e.g., one or more of boron, aluminum, and gallium). In other embodiments, the conductive material of the conductive contacts 172 and the strapping structures 174 comprises tungsten.

The strapping structures 174 may be considered portions (e.g., outwardly horizontally projecting portions) of the conductive contacts 172. For example, as shown in FIGS. 12B and 12C, the conductive contacts 172 may individually include a first portion 178 in electrical communication with the source tier 110, such as with the second conductive material 114 thereof, without being in electrical communication with all of the conductive structures 152 of the stack structure 155 vertically (e.g., in the Z-direction) underlying individual steps 122 of the staircase structure 120. In addition, the conductive contacts 172 may also individually include a second portion 180, corresponding to one of the strapping structures 174, in electrical communication with the first portion 178 and with the conductive material 156 of one of the conductive structures 152. For example, an uppermost one of the conductive structures 152 defining each step 122 (e.g., an uppermost conductive structure 152a) may be configured as a contact region for the second portion 180 of each of the conductive contacts 172. The size and location of the first portion 178 may correspond to the size and location of the fourth openings 131 (FIG. 11B), and the size and location of the second portion 180 may correspond to the size and location of the lateral openings 168 (FIG. 11B).

Accordingly, an individual conductive contact 172 may be configured to facilitate electrical communication between the source tier 110 and an uppermost conductive structure 152a defining an individual step 122 of the staircase structure 120. Further, the strapping structure 174 of at least one of the conductive contacts 172 is vertically offset from the strapping structure 174 of at least one other of the conductive contacts 172. Forming the conductive contacts 172 to facilitate electrical communication between the source tier 110 and the conductive structures 152 may reduce a quantity of support structures 170 within the staircase region 105. For example, facilitating electrical communication between the source tier 110 and the conductive structures 152 through the conductive contacts 172 facilitates forming the support structures 170 proximate the conductive contacts 172 without the need to form complex conductive pathways above the stack structure 155. Accordingly, a greater quantity of the steps 122 of the staircase structure 120 may be provided within a given area of the microelectronic device structure 100 as compared to conventional microelectronic device structure configurations. By providing the conductive contacts 172 (including the first portions 178 and the second portions 180 thereof) within the staircase structure 120, such configurations may also allow for reduced congestion in conductive pathways above the stack structure 155. By reducing congestion in conductive pathways above the stack structure 155, spacing of the conductive features may be increased, resulting in a decrease in parasitic (e.g., stray) capacitance between adjacent conductive features during use and operation of the microelectronic device structure 100.

As shown in FIG. 12B, presence of the liner material 136 within the recessed regions 134 provides the isolation regions 176 between the conductive contacts 172 and additional conductive structures 152 underlying each of the uppermost conductive structures 152a, such that the additional conductive structures 152 are remote (e.g., isolated) from the conductive contacts 172 by the isolation regions 176.

As shown in FIGS. 12B and 12C, each of the conductive contacts 172 may vertically extend completely through the stack structure 155. For example, the first portion 178 of the conductive contacts 172 may vertically extend (e.g., in the Z-direction) from a vertically uppermost boundary of the dielectric fill material 126 (e.g., at an elevational level of a vertically uppermost boundary of a vertically uppermost tier 154 of the stack structure 155) to or beyond a vertically uppermost boundary of the second conductive material 114 of the source tier 110 underlying the stack structure 155. In some embodiments, vertically (e.g., in the Z-direction) upper surfaces of the conductive contacts 172 are substantially vertically coplanar with upper surfaces of the support structures 170 (FIG. 12D) and lower surfaces of the conductive contacts 172 are substantially vertically coplanar with lower surfaces of the support structures 170. Accordingly, each of the conductive contacts 172 may have about a same height as the support structures 170.

The conductive contacts 172 may individually exhibit a substantially circular horizontal cross-sectional shape, as shown in the top-down view of FIG. 12A. However, the disclosure is not so limited. As a non-limiting example, in additional embodiments, the conductive contacts 172 individually exhibit a substantially rectangular cross-sectional shape (e.g., a substantially square cross-sectional shape), or a different elongate cross-sectional shape (e.g., an oblong cross-sectional shape). At least some of the conductive contacts 172 may exhibit a different geometric configuration (e.g., one or more different dimensions, a different shape) and/or different horizontal spacing than at least some other of the conductive contacts 172, or each of the conductive contacts 172 may exhibit substantially the same geometric configuration (e.g., the same dimensions and the same shape) and horizontal spacing (e.g., in the X-direction) as each of the other conductive contacts 172. For example, individual conductive contacts 172 of the microelectronic device structure 100 may exhibit a height (e.g., in the Z-direction) that is substantially similar to a height of each other of the conductive contacts 172.

Accordingly, manufacturing processes may be simplified by forming the conductive contacts 172 to extend entirely through the vertical extent of the stack structure 155 and to terminate at a single location (e.g., at or within the source tier 110), without forming the conductive contacts 172 to extend to varying (e.g., differing) depths of individual steps 122 of the staircase structure 120. In contrast, conventional microelectronic device structures include conductive contacts that terminate at (e.g., land on) upper surfaces of individual steps of staircase structures, resulting in varying heights of conductive contacts throughout the staircase structures. In some instances, damage may occur within the staircase structures during fabrication of conventional microelectronic device structures. Particularly, damage to the tier materials of the tiers, also called "clipping," may be a source of defect, which can adversely affect memory device performance. In addition, misaligned conductive contacts that terminate on upper surfaces of the individual steps of staircase structures, may be susceptible to bridging (e.g., shorting, electrical connection) between neighboring portions of the conductive structures 152. Further, terminating the conductive contacts at varying (e.g., differing) depths of the steps of the staircase structure of conventional microelectronic device structures may result in so-called "overetch" or "underetch" during processing. Accordingly, each of the conductive contacts 172 of the microelectronic device structure 100 may be formed to extend entirely through the vertical extent of the stack structure 155 and to terminate at the single location in order to substantially reduce (e.g., substantially prevent) damage within the staircase structure 120 during fabrication.

As shown in FIG. 12D, the fill material 170b of the support structures 170 may be formed adjacent (e.g., over) the liner material 170a within the third openings 145 (FIG. 11D). In some embodiments, the fill material 170b is formed of and includes an insulative material, such as a silicon oxide material. In other embodiments, the fill material 170b is formed of and includes a conductive material including, but not limited to, n-doped polysilicon, p-doped polysilicon, undoped polysilicon, or a metal, such as tungsten. A material composition of the fill material 170b may be substantially the same as a material composition of the conductive material of the conductive contacts 172 (including the second portions 180 thereof also referred to herein as the strapping structures 174), or the material composition of the fill material 170b may be different than the material composition of the conductive material of the conductive contacts 172. In some such embodiments, the fill material 170b of the support structures 170 may be formed during (e.g., substantially simultaneous with) formation of the conductive contacts 172 in order to simplify manufacturing processes. The liner material 170a may substantially surround sidewalls of the fill material 170b. In some embodiments, such as where the fill material 170b comprises an insulative material, the support structures 170 may not include the liner material 170a on sidewalls of the fill material 170b, and the support structures 170 may only include the fill material 170b (e.g., the insulative material).

The fill material 170b of the support structures 170 may be formed to substantially fill remaining portions of the third openings 145 (FIG. 11D). The support structures 170 may be proximate to the conductive contacts 172 within the horizontal area of the staircase region 105. Accordingly, some of the conductive contacts 172 and some of the support structures 170 may be located within horizontal boundaries of individual block structures 162 (FIG. 5A). The support structures 170 may each individually exhibit a desired geometric configuration (e.g., dimensions and shape) and spacing. The geometric configurations and spacing of the support structures 170 may be selected at least partially based on the configurations and positions of other components (e.g., the steps 122 of the staircase structure 120, the conductive contacts 172, the source tier 110) of the microelectronic device structure 100. Each of the support structures 170 may exhibit substantially the same geometric configuration (e.g., the same dimensions and the same shape) and horizontal spacing (e.g., in the X-direction) as each of the other support structures 170, or at least some of the support structures 170 may exhibit a different geometric configuration (e.g., one or more different dimensions, a different shape) and/or different horizontal spacing than at least some other of the support structures 170. In some embodiments, the support structures 170 are at least partially uniformly spaced in the X-direction and in the Y-direction.

As shown in FIG. 12D, each of the support structures 170 may vertically extend completely through the stack structure 155. For example, at least some of the support structures 170 may be formed to extend vertically from an upper surface of the stack structure 155 to an upper surface of the second conductive material 114 of the source tier 110. Alternatively or additionally, at least some of the support structures 170 (e.g., including the conductive material as the fill material 170b) may be formed to extend below the upper surface of second conductive material 114 into the second conductive material 114. In some embodiments, the support structures 170 are configured to provide one or more functions (e.g., electrical connections) in addition to support functions. In additional embodiments, the support structures 170 are configured to substantially only serve support functions, without being in electrical communication with the conductive structures 152 of the stack structure 155, such as when the conductive contacts 172 physically contact the second conductive material 114 of the source tier 110. Upper surfaces of each of the liner material 170a and the fill material 170b of the support structures 170 may be substantially vertically (e.g., in the Z-direction) coplanar with an upper surface of the dielectric material 116 overlying the dielectric fill material 126 and the stack structure 155. Further, lower surfaces of the support structures 170 may be substantially vertically coplanar with lower surfaces of the conductive contacts 172, without being vertically coplanar with lower surfaces of the dielectric material 164 within the slots 160 (FIG. 7A) as a result of each of the support structures 170 and the conductive contacts 172 terminating at or within the second conductive material 114 of the source tier 110 and the dielectric material 164 terminating at or within the first conductive material 112 thereof.

The support structures 170 may individually exhibit a substantially circular horizontal cross-sectional shape, as shown in the top-down view of FIG. 12A. However, the disclosure is not so limited. As a non-limiting example, in additional embodiments, the support structures 170 individually exhibit a substantially rectangular cross-sectional shape (e.g., a substantially square cross-sectional shape), or a different elongate cross-sectional shape (e.g., an oblong cross-sectional shape). A lateral dimension (e.g., a second width $W_2$, a diameter in the X-direction) of one or more of the support structures 170 may be relatively larger than a lateral dimension (e.g., a first width $W_1$, a diameter in the X-direction) of one or more (e.g., each) of the conductive contacts 172. In some embodiments, the first width $W_1$ of the conductive contacts 172 may be within a range of from about 50 nm to about 200 nm, such as from about 50 nm to about 100 nm, from about 100 nm to about 150 nm, or from about 150 nm to about 200 nm, and the second width $W_2$ of the support structures 170 may be within a range of from about 200 nm to about 500 nm, such as from about 200 nm to about 300 nm, from about 300 nm to about 400 nm, or from about 400 nm to about 500 nm. In additional embodiments, a lateral dimension (e.g., the first width $W_1$ in the X-direction, a width in the Y-direction) of one or more of the conductive contacts 172 is substantially the same as (e.g., substantially equal to) a lateral dimension of one of the support structures 170 or, alternatively, the lateral dimension of one or more of the conductive contacts 172 is relatively larger than the lateral dimension of one of the support structures 170, such as when one or more of the conductive contacts 172 exhibit an oblong cross-sectional shape. By way of non-limiting example, at least one lateral dimension of one or more of the conductive contacts 172 may be within a range of from about 200 nm to about 700 nm, such as from about 200 nm to about 300 nm, from about 300 nm to about 400 nm, from about 400 nm to about 500 nm, from about 500 nm to about 600 nm, or from about 600 nm to about 700 nm. The relative widths of the conductive contacts 172 and the support structures 170 may be tailored to have a desired value that may be selected at least partially based on design requirements of the microelectronic device structure 100.

FIG. 13A illustrates an enlarged portion of box A of FIG. 12A, in accordance with the embodiment of the microelectronic device structure 100 of FIG. 12A. For clarity and ease of understanding the drawings and associated description, surrounding materials including the dielectric material 116 and the dielectric fill material 126 are absent from FIG. 13A. In some embodiments, portions (e.g., the remaining portion 142 of the upper portions 128a) of the second insulative liner material 128 are maintained (e.g., remain) vertically over each step 122 of the staircase structure 120 (FIG. 13B). The remaining portion 142 of the upper portions 128a of the second insulative liner material 128 may laterally (e.g., in the X-direction, in the Y-direction) surround the strapping structures 174 (also described here as the second portions 180 (FIGS. 12A through 12C)) of the conductive contacts 172 (FIGS. 12A through 12C), and the strapping structures 174 may laterally surround portions (e.g., the first portions 178 (FIG. 12A through 12C)) of the conductive contacts 172 at an elevational level of the second insulative liner material 128 over each step 122 of the staircase structure 120. Accordingly, the second portion 180 (also described herein as the strapping structures 174) of an individual conductive contact 172 may be located horizontally proximate to and may at least partially (e.g., substantially) surround the first portion 178 thereof. The first portion 178 and the second portion 180 of the conductive contacts 172 may include substantially the same material composition with no easily discernable physical interface therebetween. Alternatively, the first portion 178 and the second portion 180 thereof may include a material composition that differs from one another, such that a material composition of the strapping structures 174 differs from a material composition of the conductive contacts 172.

As shown in FIG. 13A, each of the conductive contacts 172 and the strapping structures 174 may be horizontally centered within individual steps 122 of the staircase structure 120 (FIG. 13B), although other configurations may be contemplated. A lateral dimension (e.g., a fourth width $W_4$ in the X-direction) of one or more of the steps 122 may be relatively larger than a lateral dimension (e.g., a third width $W_3$, a diameter in the X-direction) of an individual conductive contact 172 (including the first portion 178 and the second portion 180 thereof). By way of non-limiting example, the third width $W_3$ may be within a range from about 300 nm to about 1000 nm (e.g., 1 μm), such as from about 300 nm to about 400 nm, from about 400 nm to about 500 nm, from about 500 nm to about 600 nm, from about 600 nm to about 700 nm, from about 700 nm to about 800 nm, from about 800 nm to about 900 nm, or from about 900 nm to about 1000 nm. In some embodiments, the fourth width $W_4$ is within a range from about 1.5 times greater than the third width $W_3$ of the second portion 180 (also described as the strapping structure 174) of the conductive contact 172 to about 2.5 times the third width $W_3$ of the second portion 180. In some embodiments, the fourth width $W_4$ is at least about 2.0 times the third width $W_3$. In some embodiments, the fourth width $W_4$ is about the same size as the third width $W_3$. In other embodiments, the fourth width $W_4$ is such that the lateral boundary of the second portion 180 of the conductive contact 172 at an elevational level of the second insulative liner material 128 overlying the staircase structure 120 does not laterally extend beyond the steps 122 to reduce or prevent electrical shorting of the conductive contacts 172 to the conductive structures 152 of the stack structure 155. Stated another way, the fourth width $W_4$ may be sized such that the second portions 180 of the conductive contacts 172 do not laterally extend beyond the lateral boundary of the steps 122.

FIG. 13B illustrates an enlarged portion of box B of FIG. 12B, in accordance with the embodiment of the microelectronic device structure 100 of FIG. 12B. For clarity and ease of understanding the drawings and associated description, surrounding materials including the dielectric fill material 126 are absent from FIG. 13B. As shown in FIG. 13B, the conductive structures 152 may individually comprise the conductive liner material 158 in contact with the insulative structures 104 and the conductive material 156 in contact with the conductive liner material 158. While not illustrated in FIG. 13B, the first insulative liner material 127 (FIG. 2B) may, optionally, be present below the second insulative liner material 128, as described in greater detail with reference to FIG. 2B. In some such embodiments, at least portions of one or more of the conductive liner material 158 and the first insulative liner material 127 are removed prior to formation of the strapping structures 174. Accordingly, the strapping structures 174 may be formed directly neighboring (e.g., in the Z-direction) the uppermost conductive structure 152a of individual steps 122. In some such embodiments, only a lower surface of each of the strapping structures 174 is in physical contact with any of the conductive structures 152 of the stack structure 155. Alternatively, at least one material (e.g., the conductive liner material 158) may vertically intervene between the strapping structures 174 and the uppermost conductive structure 152a.

Since each of the conductive contacts 172 vertically extend completely through the stack structure 155 (FIG. 12B), the conductive contacts 172 vertically extend through the steps 122 of the staircase structure 120 without terminating at upper surfaces thereof. As shown in FIG. 13B, the liner material 136 within the recessed regions 134 horizontally intervenes between the conductive contacts 172 and the additional conductive structures 152 aligned below the uppermost conductive structure 152a, such that the additional conductive structures 152 are remote (e.g., isolated) from the conductive contacts 172 by the isolation regions 176. For example, the conductive contacts 172 may extend through the dielectric fill material 126 to individually contact the uppermost conductive structure 152a and the steps 122 of the staircase structure 120, without contacting the additional conductive structures 152 thereunder. Each step 122 may individually be in contact with one of the conductive contacts 172 through the second portion 180 thereof (also described as one of the strapping structures 174). The second portion 180 of each conductive contact 172 may be configured (e.g., sized and shaped) to maximize (e.g., increase) overlap with the contact region of the uppermost conductive structure 152a.

As shown in FIG. 13B, the uppermost conductive structures 152a may be separated from the first portions 178 of the conductive contacts 172, by the isolation regions 176, by a distance $D_1$ in the Y-direction. By way of non-limiting example, the distance $D_1$ may be within a range from about 20 nm to about 100 nm, such as from about 20 nm to about 40 nm, from about 40 nm to about 60 nm, from about 60 nm to about 80 nm, or from about 80 nm to about 100 nm. In some embodiments, the distance $D_1$ is about 80 nm, which corresponds to a horizontal width of the liner material 136 within the recessed regions 134 in the Y-direction. Further, the horizontal width of the liner material 136 may vary along a vertical height of each of the conductive structures 152. The second portions 180 of the conductive contacts 172 (also described herein as the strapping structures 174) may individually have a thickness $T_2$ (e.g., height) in the vertical direction within a range from about 10 nm to about 100 nm, such as from about 10 nm to about 20 nm, from about 20 nm to about 40 nm, from about 40 nm to about 60 nm, from about 60 nm to about 80 nm, or from about 80 nm to about 100 nm. In some embodiments, the thickness $T_2$ is about 80 nm, which corresponds to the thickness $T_1$ of the second insulative liner material 128. In other embodiments, the thickness $T_2$ is within a range from about 10 nm to about 180 nm, which corresponds to a combined thickness of the second insulative liner material 128 and the first insulative liner material 127 (FIG. 2B).

Figure 14:
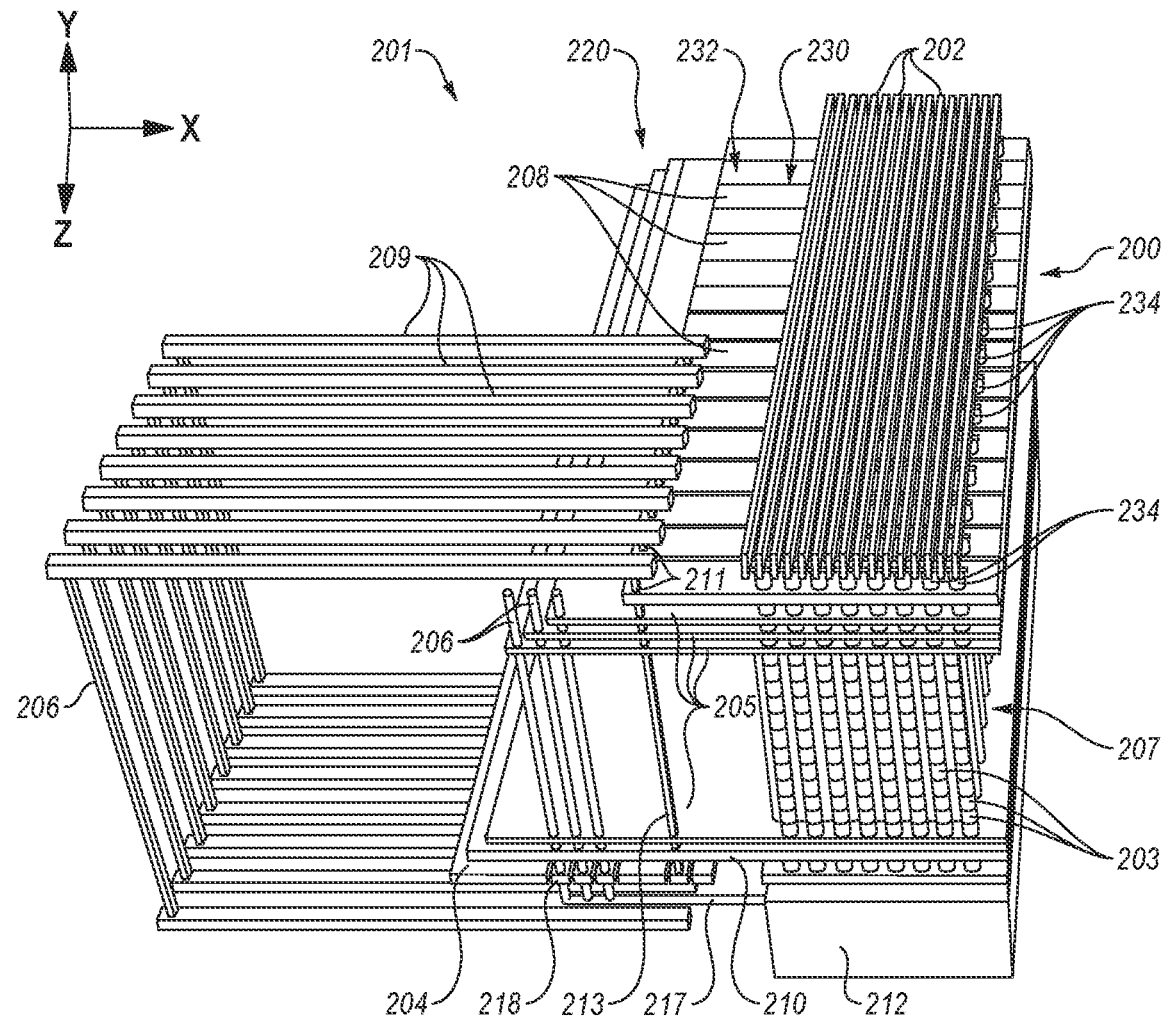
FIG. 14 is a simplified, partial cutaway perspective view of a microelectronic device, in accordance with embodiments of the disclosure.

FIG. 14 illustrates a simplified, partial cutaway perspective view of a portion of a microelectronic device 201 (e.g., a memory device, such as a dual deck 3D NAND Flash memory device) including a microelectronic device structure 200. The microelectronic device structure 200 may be substantially similar to the microelectronic device structure 100 following the processing stage previously described with reference to FIGS. 12A through 12D. As shown in FIG. 14, the microelectronic device structure 200 may include a staircase structure 220 (e.g., including the staircase structure 120 (FIG. 12B)) defining contact regions for connecting conductive contacts 206 (e.g., corresponding to the conductive contacts 172 (FIG. 12B)) directly to conductive tiers 205 (e.g., conductive layers, conductive plates, such as the conductive structures 152 (FIG. 12B)). The microelectronic device structure 200 may include vertically extending strings 207 of memory cells 203 that are coupled to each other in series. The vertically extending strings 207 may extend vertically (e.g., in the Z-direction) and orthogonally to data lines 202, a source tier 204 (e.g., corresponding to the source tier 110 (FIG. 12B)), the conductive tiers 205, first select gates 208 (e.g., upper select gates, drain select gates (SGDs)), select lines 209, and a second select gate 210 (e.g., a lower select gate, a source select gate (SGS)). The microelectronic device 201 may include multiple blocks 232 (e.g., corresponding to the block structures 162 (FIG. 5A)) horizontally separated (e.g., in the Y-direction) from one another by filled slot structures 230 (e.g., corresponding to the slots 160 (FIG. 7A) filled with the dielectric material 164 (FIG. 12A)).

Conductive contacts 213 and additional conductive contacts 211 may, optionally, electrically couple components to each other as shown. For example, the select lines 209 may be electrically coupled to the first select gates 208. The microelectronic device 201 may also include a control unit 212 positioned under and within a horizontal area of the memory array including the vertically extending strings 207 of memory cells 203. The control unit 212 may include control logic devices configured to control various operations of other features (e.g., the vertically extending strings 207 of memory cells 203) of the microelectronic device 201. By way of non-limiting example, the control unit 212 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, drivers (e.g., string drivers), decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. The control unit 212 may be electrically coupled to the data lines 202, the source tier 204, the conductive contacts 206, the first select gates 208, and the second select gates 210, for example. In some embodiments, the control unit 212 includes CMOS (complementary metal-oxide-semiconductor) circuitry. In such embodiments, the control unit 212 may be characterized as having a "CMOS under Array" ("CuA") configuration, wherein the CMOS circuitry of a logic region is at least partially (e.g., substantially) positioned within horizontal areas of memory array regions of a microelectronic device including the microelectronic device structure 100.

Source structures 218 (e.g., corresponding to the source structures 118 (FIG. 12D)) of the source tier 204 may be electrically isolated from other portions thereof (e.g., other portions employed as conductive routing structures 217 (e.g., corresponding to the conductive routing structures 117 (FIG. 12D))). The conductive routing structures 217 may electrically couple components (e.g., the conductive contacts 206, the source structures 218) to circuitry of the control unit 212.

The first select gates 208 may extend horizontally in a first direction (e.g., the X-direction) and may be coupled to respective first groups of vertically extending strings 207 of memory cells 203 at a first end (e.g., an upper end) of the vertically extending strings 207. The second select gate 210 may be formed in a substantially planar configuration and may be coupled to the vertically extending strings 207 at a second, opposite end (e.g., a lower end) of the vertically extending strings 207 of memory cells 203.

The data lines 202 (e.g., bit lines) may extend horizontally in a second direction (e.g., in the Y-direction) that is at an angle (e.g., perpendicular) to the first direction in which the first select gates 208 extend. The data lines 202 may be coupled to respective second groups of the vertically extending strings 207 at the first end (e.g., the upper end) of the vertically extending strings 207. A first group of vertically extending strings 207 coupled to a respective first select gate 208 may share a particular vertically extending string 207 with a second group of vertically extending strings 207 coupled to a respective data line 202. Thus, a particular vertically extending string 207 may be selected at an intersection of a particular first select gate 208 and a particular data line 202. Accordingly, the first select gates 208 may be used for selecting memory cells 203 of the vertically extending strings 207 of memory cells 203.

The conductive tiers 205 (e.g., word line plates, such as the conductive structures 152 (FIG. 12B)) may extend in respective horizontal planes. The conductive tiers 205 may be stacked vertically, such that each conductive tier 205 is coupled to all of the vertically extending strings 207 of memory cells 203, and the vertically extending strings 207 of the memory cells 203 extend vertically through the stack of conductive tiers 205. The conductive tiers 205 may be coupled to or may form control gates of the memory cells 203 to which the conductive tiers 205 are coupled. Each conductive tier 205 may be coupled to one memory cell 203 of a particular vertically extending string 207 of memory cells 203.

The first select gates 208 and the second select gates 210 may operate to select a particular vertically extending string 207 of the memory cells 203 between a particular data line 202 and the source tier 204. Thus, a particular memory cell 203 may be selected and electrically coupled to a data line 202 by operation of (e.g., by selecting) the appropriate first select gate 208, second select gate 210, and conductive tier 205 that are coupled to the particular memory cell 203.

The staircase structure 220 may be configured to provide electrical connection directly between the conductive contacts 206 and the conductive tiers 205. In other words, a particular conductive tier 205 may be selected via a conductive contact 206 in electrical communication therewith. The data lines 202 may be electrically coupled to the vertically extending strings 207 through conductive contact structures 234.

Thus, in accordance with embodiments of the disclosure a microelectronic device comprises a stack structure overlying a source tier. The stack structure comprising a vertically alternating sequence of conductive structures and insulative structures arranged in tiers. The microelectronic device comprises a staircase structure within the stack structure and having steps comprising lateral edges of the tiers, support structures vertically extending through the stack structure and within a horizontal area of the staircase structure, and conductive contacts vertically extending through the stack structure and horizontally neighboring the support structures within the horizontal area of the staircase structure. Each of the conductive contacts has a horizontally projecting portion in contact with one of the conductive structures of the stack structure at one of the steps of the staircase structure.

Thus, in accordance with additional embodiments of the disclosure, a memory device comprises a stack structure comprising conductive structures vertically interleaved with insulative structures, strings of memory cells vertically extending through the stack structure, a staircase structure within the stack structure defined by steps comprising lateral ends of the conductive structures and the insulative structures, and conductive contacts vertically extending through the stack structure. Each of the conductive contacts individually comprise a first portion vertically extending from an uppermost boundary of the stack structure to conductive material underlying a lowermost boundary of the stack structure, and a second portion laterally surrounding the first portion and in physical contact with one of the conductive structures of the stack structure at an elevational level of one of the steps of the staircase structure.

Furthermore, in accordance with further embodiments of the disclosure, a method of forming a microelectronic device comprises forming a stack structure over a source tier including conductive material. The stack structure comprises a vertically alternating sequence of insulative structures and additional insulative structures arranged in tiers. Each of the tiers individually comprises at least one of the insulative structures and at least one of the additional insulative structures. The method comprises forming at least one insulative liner material over a staircase structure within the stack structure. The staircase structure has steps comprising lateral edges of the tiers of the stack structure. The method comprises forming first openings extending through the stack structure within a horizontal area of the staircase structure and exposing portions of the conductive material of the source tier, forming first sacrificial structures within the first openings, at least partially replacing the additional insulative structures with conductive structures, removing the first sacrificial structures to form contact openings extending to and exposing portions of additional conductive material underlying the conductive material of the source tier, and forming conductive contacts within the contact openings. The conductive contacts are in electrical communication with the additional conductive material and with the conductive structures at the steps of staircase structure.

Microelectronic devices (e.g., the microelectronic device 201 including microelectronic device structures (e.g., the microelectronic device structures 100, 200)) of the disclosure may be included in embodiments of electronic systems of the disclosure. For example, FIG. 15 is a schematic block diagram of an electronic system 303, in accordance with embodiments of the disclosure. The electronic system 303 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 303 includes at least one memory device 305. The memory device 305 may include, for example, an embodiment of a microelectronic device structure previously described herein (e.g., the microelectronic device structure 100, 200 previously described with reference to FIGS. 1A through 13B and FIG. 14) or a microelectronic device (e.g., the microelectronic device 201) previously described with reference to FIG. 14) FIG. 14.

The electronic system 303 may further include at least one electronic signal processor device 307 (often referred to as a "microprocessor"). The electronic signal processor device 307 may, optionally, include an embodiment of one or more of a microelectronic device and a microelectronic device structure previously described herein. The electronic system 303 may further include one or more input devices 309 for inputting information into the electronic system 303 by a user, such as, for example, a mouse or other pointing device, a keyboard, a touchpad, a button, or a control panel. The electronic system 303 may further include one or more output devices 311 for outputting information (e.g., visual or audio output) to a user such as, for example, a monitor, a display, a printer, an audio output jack, a speaker, etc. In some embodiments, the input device 309 and the output device 311 may comprise a single touchscreen device that can be used both to input information to the electronic system 303 and to output visual information to a user. The input device 309 and the output device 311 may communicate electrically with one or more of the memory device 305 and the electronic signal processor device 307.

With reference to FIG. 16, depicted is a processor-based system 400. The processor-based system 400 may include one or more of a microelectronic device and a microelectronic device structure previously described herein and manufactured in accordance with embodiments of the disclosure. The processor-based system 400 may be any of a variety of types such as a computer, pager, cellular phone, personal organizer, control circuit, or other electronic device. The processor-based system 400 may include one or more processors 402, such as a microprocessor, to control the processing of system functions and requests in the processor-based system 400. The processor 402 and other subcomponents of the processor-based system 400 may include one or more of a microelectronic device and a microelectronic device structure previously described herein and manufactured in accordance with embodiments of the present disclosure.

The processor-based system 400 may include a power supply 404 in operable communication with the processor 402. For example, if the processor-based system 400 is a portable system, the power supply 404 may include one or more of a fuel cell, a power scavenging device, permanent batteries, replaceable batteries, and rechargeable batteries. The power supply 404 may also include an AC adapter; therefore, the processor-based system 400 may be plugged into a wall outlet, for example. The power supply 404 may also include a DC adapter such that the processor-based system 400 may be plugged into a vehicle cigarette lighter or a vehicle power port, for example.

Various other devices may be coupled to the processor 402 depending on the functions that the processor-based system 400 performs. For example, a user interface 406 may be coupled to the processor 402. The user interface 406 may include input devices such as buttons, switches, a keyboard, a light pen, a mouse, a digitizer and stylus, a touch screen, a voice recognition system, a microphone, or a combination thereof. A display 408 may also be coupled to the processor 402. The display 408 may include an LCD display, an SED display, a CRT display, a DLP display, a plasma display, an OLED display, an LED display, a three-dimensional projection, an audio display, or a combination thereof. Furthermore, an RF sub-system/baseband processor 410 may also be coupled to the processor 402. The RF sub-system/baseband processor 410 may include an antenna that is coupled to an RF receiver and to an RF transmitter (not shown). A communication port 412, or more than one communication port 412, may also be coupled to the processor 402. The communication port 412 may be adapted to be coupled to one or more peripheral devices 414, such as a modem, a printer, a computer, a scanner, or a camera, or to a network, such as a local area network, remote area network, intranet, or the Internet, for example.

The processor 402 may control the processor-based system 400 by implementing software programs stored in the memory. The software programs may include an operating system, database software, drafting software, word processing software, media editing software, or media playing software, for example. The memory is operably coupled to the processor 402 to store and facilitate execution of various programs. For example, the processor 402 may be coupled to system memory 416, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 416 may include volatile memory, non-volatile memory, or a combination thereof. The system memory 416 is typically large so that it can store dynamically loaded applications and data. In some embodiments, the system memory 416 may include semiconductor devices, such as one or more of a microelectronic devices and a microelectronic device structure previously described herein.

The processor 402 may also be coupled to non-volatile memory 418, which is not to suggest that system memory 416 is necessarily volatile. The non-volatile memory 418 may include one or more of STT-MRAM, MRAM, read-only memory (ROM) such as an EPROM, resistive read-only memory (RROM), and flash memory to be used in conjunction with the system memory 416. The size of the non-volatile memory 418 is typically selected to be just large enough to store any necessary operating system, application programs, and fixed data. Additionally, the non-volatile memory 418 may include a high-capacity memory such as disk drive memory, such as a hybrid-drive including resistive memory or other types of non-volatile solid-state memory, for example. The non-volatile memory 418 may include microelectronic devices, such as one or more of a microelectronic device and a microelectronic device structure previously described herein.

Thus, in accordance with embodiments of the disclosure an electronic system comprises a processor operably coupled to an input device and an output device, and a memory device operably coupled to the processor. The memory device comprises a stack structure comprising dielectric materials and conductive materials vertically alternating with the dielectric materials, conductive contacts vertically extending through the stack structure from an uppermost boundary of the stack structure to conductive routing structures underlying a lowermost boundary of the stack structure. At least some of the conductive materials of the stack structure are in electrical communication with at least some of the conductive routing structures by way of the conductive contacts. The memory device comprises strings of memory cells vertically extending through the stack structure.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
 a stack structure overlying a source tier, the stack structure comprising a vertically alternating sequence of conductive structures and insulative structures arranged in tiers;
 a staircase structure within the stack structure and having steps comprising lateral edges of the tiers;
 support structures vertically extending through the stack structure and within a horizontal area of the staircase structure;
 conductive contacts vertically extending through the stack structure and horizontally neighboring the support structures within the horizontal area of the staircase structure, each of the conductive contacts having a horizontally projecting portion in contact with one of the conductive structures of the stack structure at one of the steps of the staircase structure; and dielectric-filled trenches dividing the stack structure into multiple blocks individually including some of the conductive contacts and some of the support structures within horizontal boundaries of the blocks.

2. The microelectronic device of claim 1, wherein:
the conductive contacts are in electrical communication with at least some of the conductive structures of the stack structure; and
the support structures are not in electrical communication with the conductive structures of the stack structure.

3. The microelectronic device of claim 1, wherein the conductive contacts vertically extend through the stack structure from an upper surface of the stack structure to conductive structures within the source tier.

4. The microelectronic device of claim 1, wherein each of the conductive contacts exhibits substantially the same vertical height.

5. The microelectronic device of claim 1, wherein a vertical height of the conductive contacts is substantially equal to a vertical height of the support structures.

6. The microelectronic device of claim 1, wherein the steps of the staircase structure are free of additional contact structures terminating thereon.

7. The microelectronic device of claim 1, wherein the horizontally projecting portion of at least one of the conductive contacts is vertically offset from the horizontally projecting portion of at least one other of the conductive contacts.

8. The microelectronic device of claim 7, further comprising dielectric material horizontally interposed between the conductive contacts and the conductive structures of the stack structure, a horizontal width of the dielectric material varying along a vertical height of each of the conductive contacts.

9. A memory device, comprising:
a stack structure comprising conductive structures vertically interleaved with insulative structures;
strings of memory cells vertically extending through the stack structure;
a staircase structure within the stack structure defined by steps comprising lateral ends of the conductive structures and the insulative structures; and
conductive contacts vertically extending through the stack structure, each of the conductive contacts individually comprising:
a first portion vertically extending from an uppermost boundary of the stack structure to conductive material underlying a lowermost boundary of the stack structure;
a second portion laterally surrounding the first portion and in physical contact with one of the conductive structures of the stack structure at an elevational level of one of the steps of the staircase structure; and
at least one insulative liner material vertically overlying the staircase structure, the second portion of each of the conductive contacts laterally intervening between the first portion of each of the conductive contacts and the at least one insulative liner material.

10. The memory device of claim 9, wherein each of the steps is defined by two of the conductive structures and two of the insulative structures of the stack structure.

11. The memory device of claim 9, wherein only a lower surface of the second portion of each of the conductive contacts is in physical contact with any of the conductive structures of the stack structure.

12. The memory device of claim 9, further comprising:
support structures horizontally neighboring the conductive contacts; and
dielectric-filled trenches dividing the stack structure into multiple blocks individually including some of the conductive contacts and some of the support structures within horizontal boundaries thereof.

13. The memory device of claim 9, further comprising:
a source structure underlying the stack structure and operably associated with the strings of memory cells; and
complementary metal-oxide-semiconductor circuitry underlying the source structure, the complementary metal-oxide-semiconductor circuitry in electrical communication with the source structure and with the conductive contacts.

14. The memory device of claim 13, further comprising digit lines overlying the stack structure and operably associated with the strings of memory cells, the digit lines in electrical communication with the complementary metal-oxide-semiconductor circuitry.

15. A method of forming a microelectronic device, the method comprising:
forming a stack structure over a source tier including conductive material, the stack structure comprising a vertically alternating sequence of insulative structures and additional insulative structures arranged in tiers, each of the tiers individually comprising at least one of the insulative structures and at least one of the additional insulative structures;
forming at least one insulative liner material over a staircase structure within the stack structure, the staircase structure having steps comprising lateral edges of the tiers of the stack structure;
forming first openings extending through the stack structure within a horizontal area of the staircase structure and exposing portions of the conductive material of the source tier;
forming first sacrificial structures within the first openings;
at least partially replacing the additional insulative structures with conductive structures;
removing the first sacrificial structures to form contact openings extending to and exposing portions of additional conductive material underlying the conductive material of the source tier;
forming support structures vertically extending through the stack structure and within a horizontal area of the staircase structure;
forming conductive contacts within the contact openings, the conductive contacts vertically extending through the stack structure and horizontally neighboring the support structures within the horizontal area of the staircase structure, the conductive contacts in electrical communication with the additional conductive material, and each of the conductive contacts having a horizontally projecting portion in contact with one of the conductive structures of the stack structure at one of the steps of the staircase structure; and
forming dielectric-filled trenches dividing the stack structure into multiple blocks individually including some of the conductive contacts and some of the support structures within horizontal boundaries of the blocks.

16. The method of claim 15, further comprising:
forming second openings extending through the stack structure and horizontally neighboring the first sacrificial structures with the horizontal area of the staircase structure;

forming second sacrificial structures within the second openings prior to at least partially replacing the additional insulative structures with the conductive structures;

removing the second sacrificial structures to form support structure openings extending to and exposing additional portions of the additional conductive material of the source tier; and filling the support structure openings with one or more of insulative material and further conductive material to form the support structures.

17. The method of claim 15, further comprising:

removing portions of the at least one insulative liner material through the contact openings to form horizontally projecting portions of the contact openings; and filling the horizontally projecting portions of the contact openings with conductive contact material to form the horizontally projecting portions of the conductive contacts.

18. The method of claim 17, wherein removing the portions of the at least one insulative liner material comprises selectively removing the portions of the at least one insulative liner material using one or more of an etching process, a vapor phase removal process, and an atomic layer removal process.

19. The method of claim 15, wherein forming the at least one insulative liner material comprises selecting an uppermost material of at least one insulative liner material to exhibit etch selectivity with respect to one or more insulative materials vertically overlying the staircase structure and with respect to each of the insulative structures and the additional insulative structures of the stack structure.

20. The method of claim 15, further comprising coupling portions of the conductive material and the additional conductive material operatively associated with the conductive contacts to logic circuitry underlying the source tier.

21. The method of claim 15, further comprising conformally forming an additional dielectric material within recessed regions horizontally neighboring the additional insulative structures of the stack structure prior to forming the first sacrificial structures within the first openings, the additional dielectric material exhibiting etch selectivity with respect to the at least one insulative liner material.

22. An electronic system, comprising:

a processor operably coupled to an input device and an output device; and a memory device operably coupled to the processor, the memory device comprising:

a stack structure comprising dielectric materials and conductive materials vertically alternating with the dielectric materials;

conductive contacts vertically extending through the stack structure from an uppermost boundary of the stack structure to conductive routing structures underlying a lowermost boundary of the stack structure, at least some of the conductive materials of the stack structure in electrical communication with at least some of the conductive routing structures by way of the conductive contacts;

strings of memory cells vertically extending through the stack structure;

support structures horizontally neighboring the conductive contacts; and dielectric-filled trenches dividing the stack structure into multiple blocks individually including some of the conductive contacts and some of the support structures within horizontal boundaries of the blocks.

23. The electronic system of claim 22, wherein the conductive contacts comprise strapping structures outwardly laterally extending from support structures, the strapping structures individually in physical contact with at least one of the conductive materials of the stack structure.

24. The electronic system of claim 22, wherein the memory device comprises a 3D NAND Flash memory device.

* * * * *